US 8,848,464 B2

(12) United States Patent
Sekine et al.

(10) Patent No.: US 8,848,464 B2
(45) Date of Patent: Sep. 30, 2014

(54) SEMICONDUCTOR DEVICE AND METHOD OF DRIVING SEMICONDUCTOR DEVICE

(75) Inventors: Yusuke Sekine, Kanagawa (JP); Kiyoshi Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 259 days.

(21) Appl. No.: 13/455,227

(22) Filed: Apr. 25, 2012

(65) Prior Publication Data

US 2012/0275245 A1    Nov. 1, 2012

(30) Foreign Application Priority Data

Apr. 29, 2011   (JP) ................................. 2011-102580

(51) Int. Cl.
| | |
|---|---|
| G11C 7/00 | (2006.01) |
| G11C 11/403 | (2006.01) |
| G11C 19/28 | (2006.01) |
| G11C 11/4096 | (2006.01) |
| G11C 11/56 | (2006.01) |

(52) U.S. Cl.
CPC .............. *G11C 11/403* (2013.01); *G11C 19/28* (2013.01); *G11C 11/4096* (2013.01); *G11C 11/56* (2013.01)
USPC ................. 365/189.15; 365/189.05; 365/149; 365/189.14; 365/189.16

(58) Field of Classification Search
USPC .................. 365/189.15, 189.05, 149, 189.16, 365/189.14
See application file for complete search history.

(56) References Cited

U.S. PATENT DOCUMENTS

| | | | |
|---|---|---|---|
| 4,466,081 A | | 8/1984 | Masuoka |
| 5,652,728 A | * | 7/1997 | Hosotani et al. ......... 365/210.15 |
| 5,731,856 A | | 3/1998 | Kim et al. |
| 5,744,864 A | | 4/1998 | Cillessen et al. |
| 6,127,702 A | | 10/2000 | Yamazaki et al. |
| 6,294,274 B1 | | 9/2001 | Kawazoe et al. |
| 6,563,174 B2 | | 5/2003 | Kawasaki et al. |
| 6,646,922 B2 | | 11/2003 | Kato |
| 6,657,883 B2 | * | 12/2003 | Takashima .................... 365/145 |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Son Dinh
(74) *Attorney, Agent, or Firm* — Fish & Richardson P.C.

(57) ABSTRACT

A semiconductor device which is capable of high-speed writing with less power consumption and suitable for multi-leveled memory, and verifying operation. A memory cell included in the semiconductor device included a transistor formed using an oxide semiconductor and a transistor formed using a material other than an oxide semiconductor. A variation in threshold value of the memory cells is derived before data of a data buffer is written by using a writing circuit. Data in which the variation in threshold value is compensated with respect to the data of the data buffer is written to the memory cell.

24 Claims, 32 Drawing Sheets

(56) References Cited

U.S. PATENT DOCUMENTS

| | | |
|---|---|---|
| 6,727,522 B1 | 4/2004 | Kawasaki et al. |
| 6,768,680 B2 | 7/2004 | Kato |
| 6,876,572 B2 | 4/2005 | Turner |
| 6,947,327 B2 | 9/2005 | Kato |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,173,858 B2 | 2/2007 | Kato |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,372,737 B2 | 5/2008 | Kato |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,561,476 B2 | 7/2009 | Kato |
| 7,674,650 B2 | 3/2010 | Akimoto et al. |
| 7,732,819 B2 | 6/2010 | Akimoto et al. |
| 7,839,677 B2 | 11/2010 | Kato |
| 7,978,573 B1 | 7/2011 | Lee |
| 8,320,162 B2 * | 11/2012 | Inoue et al. .............. 365/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0080788 A1 | 4/2011 | Saito |
| 2011/0116310 A1 | 5/2011 | Yamazaki et al. |
| 2011/0128777 A1 | 6/2011 | Yamazaki et al. |
| 2012/0033505 A1 | 2/2012 | Sekine et al. |
| 2012/0230114 A1 | 9/2012 | Sekine |

FOREIGN PATENT DOCUMENTS

| | | |
|---|---|---|
| JP | 57-105889 A | 7/1982 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 3721159 B2 | 11/2005 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

(56) References Cited

OTHER PUBLICATIONS

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUs on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUs on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

(56) References Cited

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Ihun Song et al.; "Short Channel Characteristics of Gallium—Indium—Zinc—Oxide Thin Film Transistors for Three-Dimensional Stacking Memory"; IEEE Electron Device Letters; Jun. 1, 2008; pp. 549-552; vol. 29, No. 6.

\* cited by examiner

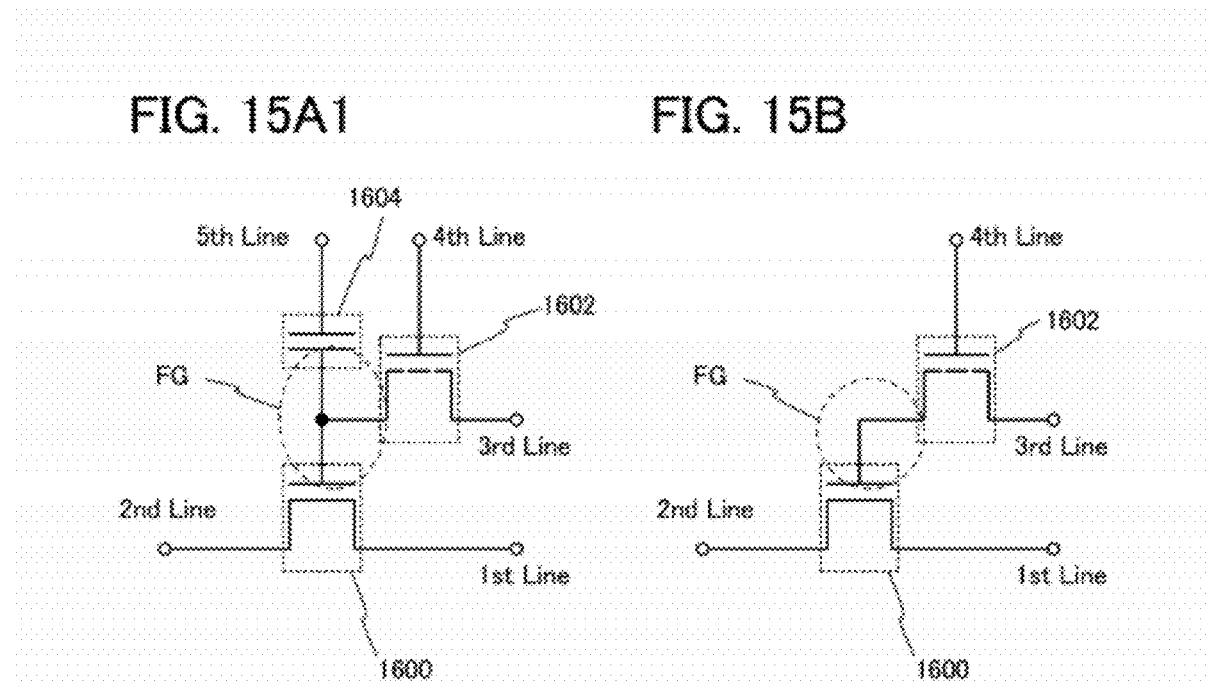
FIG. 15A1   FIG. 15B
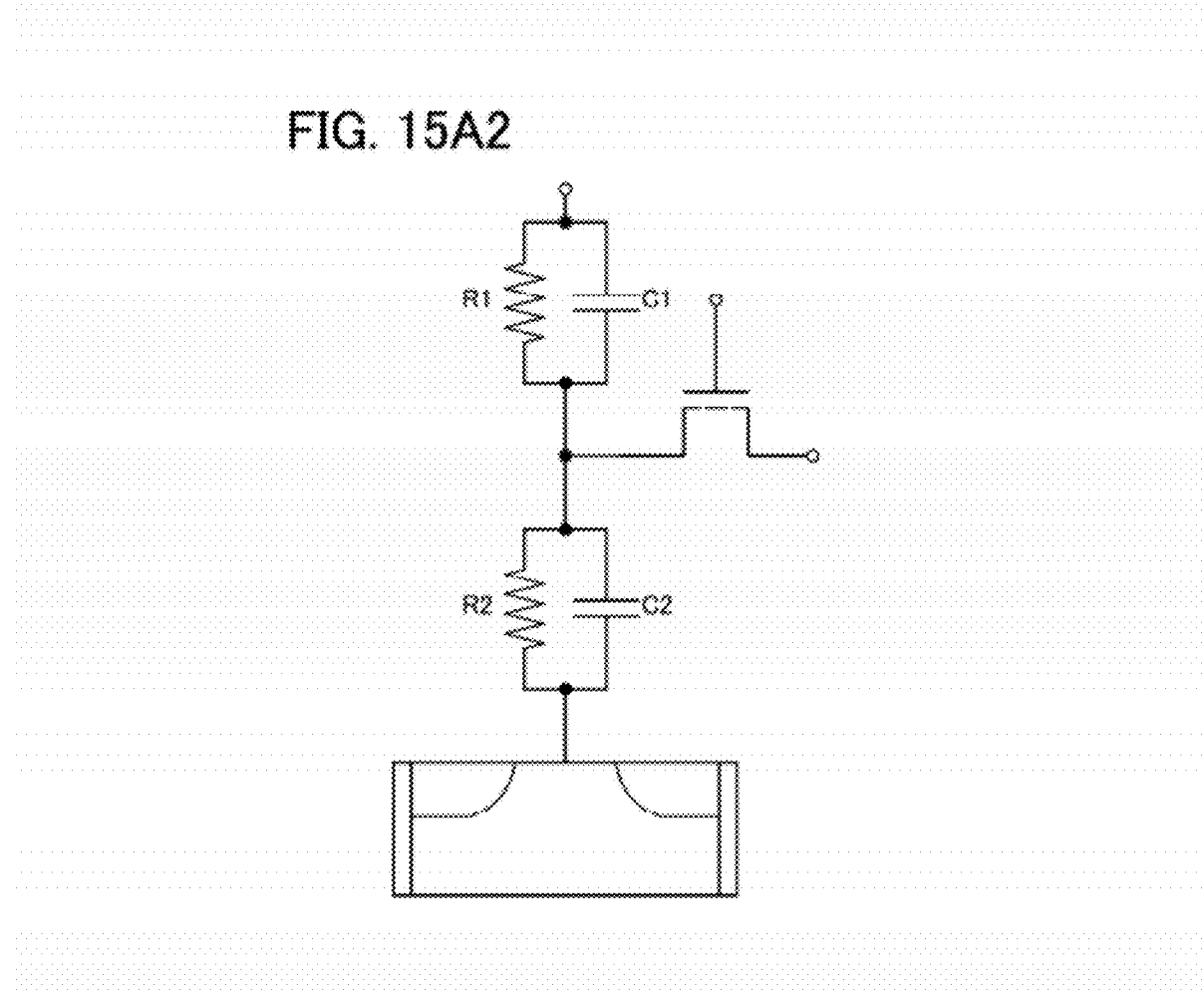
FIG. 15A2

FIG. 25A  FIG. 25B  FIG. 25C
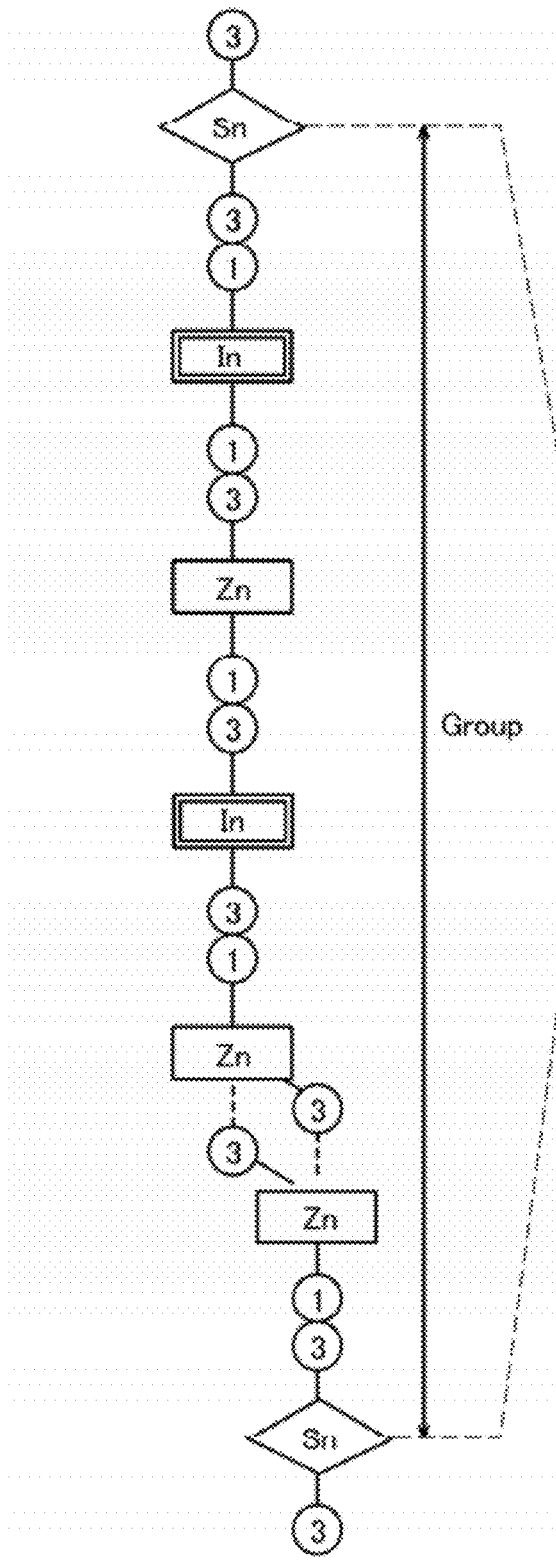
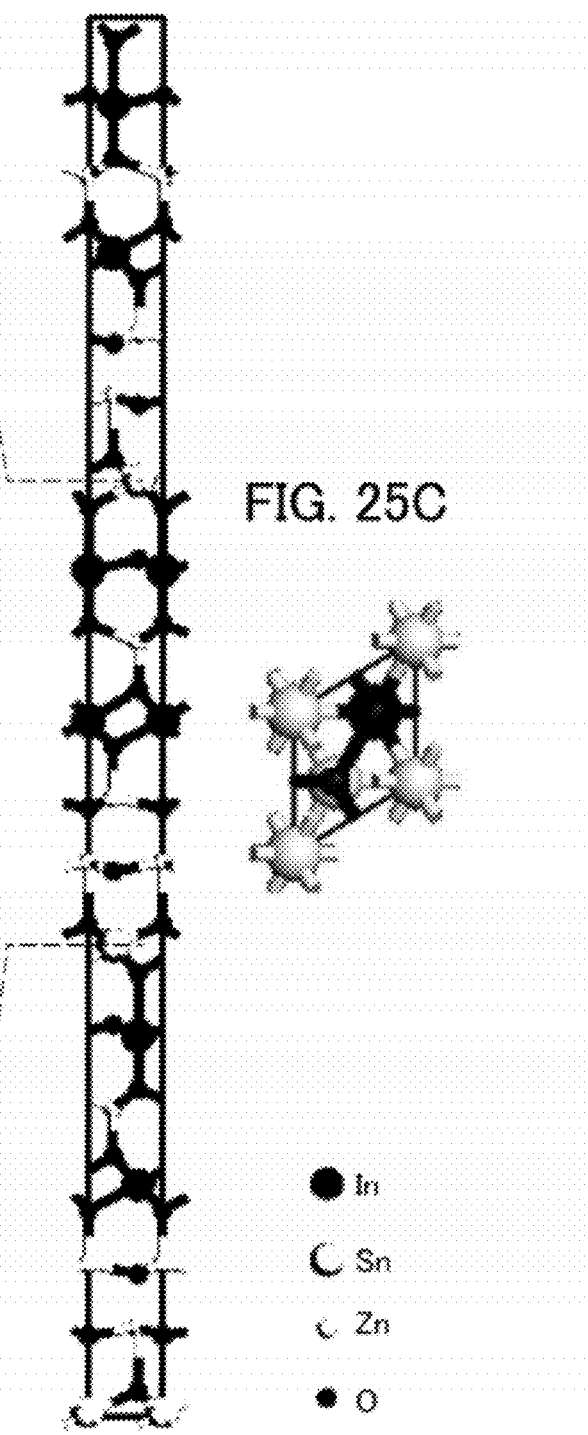

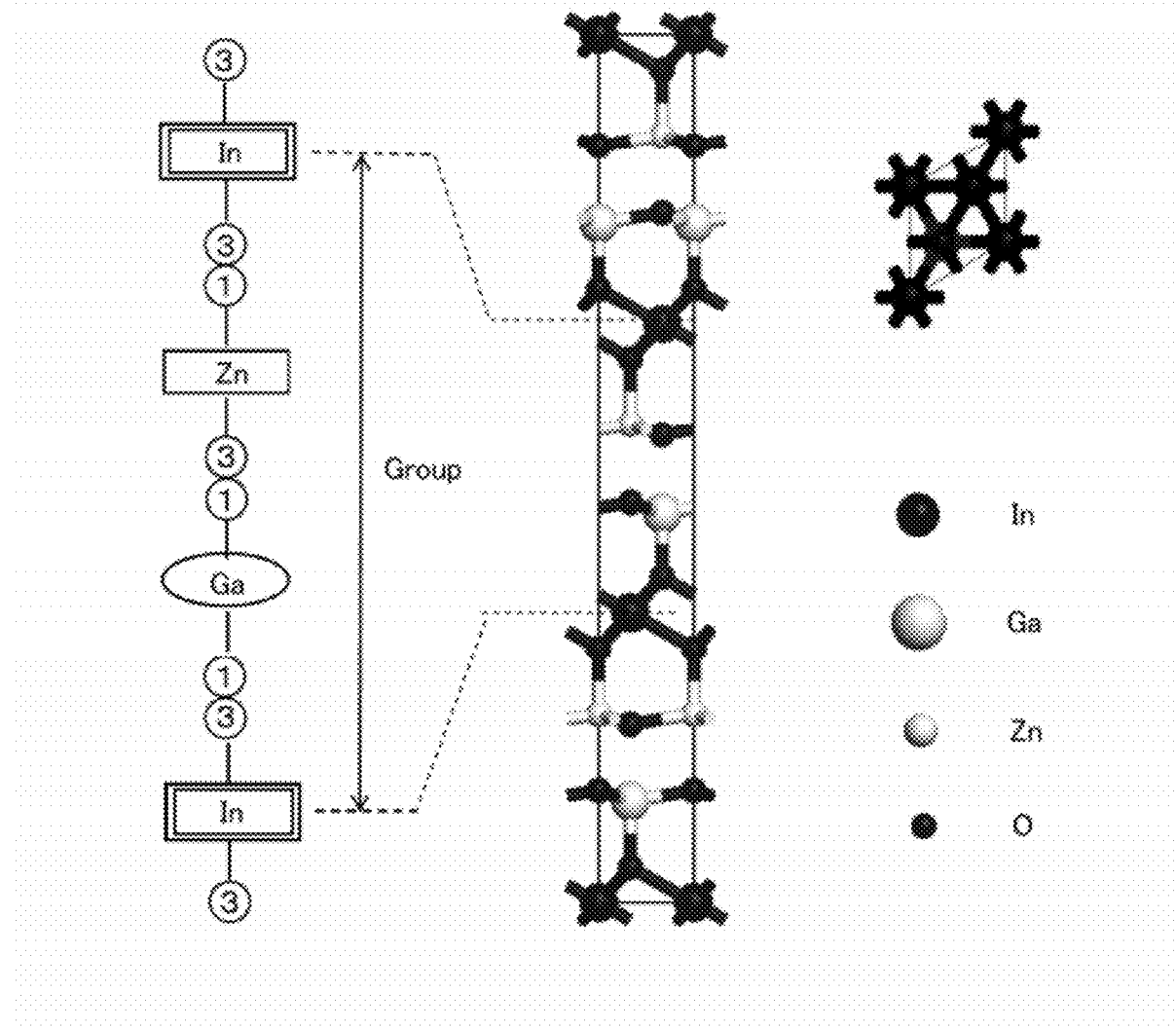

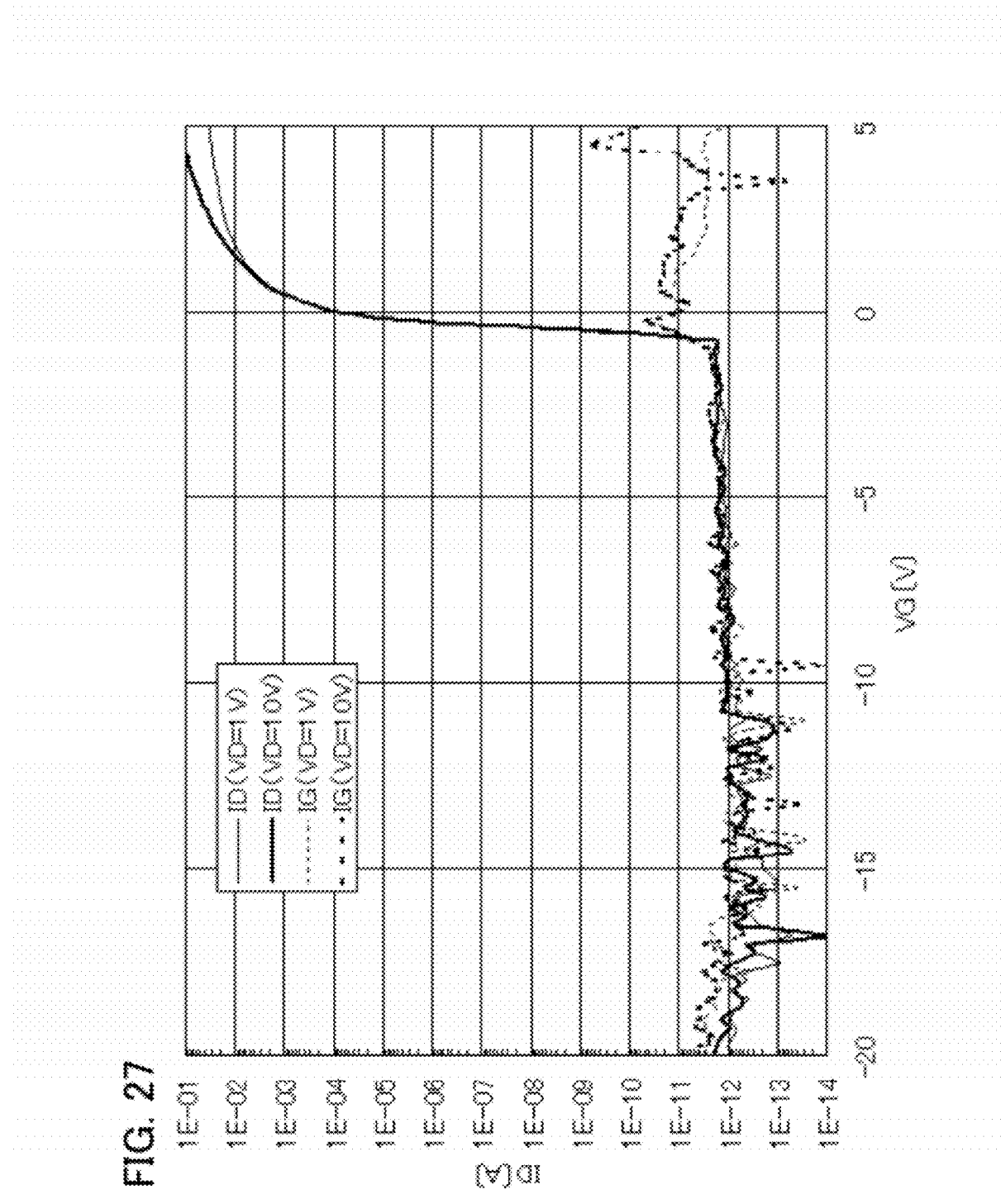

1

SEMICONDUCTOR DEVICE AND METHOD OF DRIVING SEMICONDUCTOR DEVICE

BACKGROUND OF THE INVENTION

1. Field of the Invention

The present invention relates to a semiconductor device using a semiconductor element and a method of driving the semiconductor device.

2. Description of the Related Art

Storage devices using semiconductor elements are broadly classified into two categories: a volatile device that loses stored data when power supply stops, and a non-volatile device that holds stored data even when power is not supplied.

A typical example of a volatile storage device is a DRAM (dynamic random access memory). A DRAM stores data in such a manner that a transistor included in a storage element is selected and charge is stored in a capacitor.

When data is read from a DRAM, charge in a capacitor is lost according to the above-described principle; thus, another writing operation is necessary whenever data is read out. Moreover, since leakage current (off-state current) flows between a source and a drain of a transistor included in a memory element when the transistor is in an off state, charge flows into or out even if the transistor is not selected, which makes a data holding period short. For that reason, another writing operation (refresh operation) is necessary at predetermined intervals, and it is difficult to sufficiently reduce power consumption. Furthermore, since stored data is lost when power supply stops, an additional storage device using a magnetic material or an optical material is needed in order to hold the data for a long time.

Another example of a volatile storage device is an SRAM (static random access memory). An SRAM holds stored data by using a circuit such as a flip-flop and thus does not need refresh operation. This means that an SRAM has an advantage over a DRAM. However, cost per storage capacity is increased because a circuit such as a flip-flop is used. Moreover, as in a DRAM, stored data in an SRAM is lost when power supply stops.

A typical example of a non-volatile storage device is a flash memory. A flash memory includes a floating gate between a gate electrode and a channel formation region in a transistor and stores data by holding charge in the floating gate. Therefore, a flash memory has advantages in that the data holding time is extremely long (almost permanent) and refresh operation which is necessary in a volatile storage device is not needed (e.g., see Patent Document 1).

However, a gate insulating layer included in a storage element deteriorates by tunneling current generated in writing, so that the storage element stops its function after a predetermined number of writing operations. In order to reduce adverse effects of this problem, a method in which the number of writing operations for storage elements is equalized is employed, for example. However, a complicated peripheral circuit is needed to realize this method. Moreover, employing such a method does not solve the fundamental problem of lifetime. In other words, a flash memory is not suitable for applications in which data is frequently rewritten.

REFERENCE

[Patent Document 1] Japanese Published Patent Application No. S57-105889

SUMMARY OF THE INVENTION

In general, a flash memory has verifying operation in which data written to a memory cell is read from the memory cell and whether the data is compensated or not is determined in order to prevent writing of erroneous data to the memory cell, and in the case where the written data is different from the read data, a writing voltage is changed and data is written again.

In general, the verifying operation is performed in the following manner, as shown in a flow chart in FIG. 3A: in the case where data is written to memory cells of m rows×n columns, first, writing operation of data (data to be stored in a memory cell) is performed on memory cells in any of one row, then, the data is read from the memory cells (verifying reading) after writing, and then, whether or not the data is successfully written to all the memory cells in the row is determined, and in the case where there is at least one memory cell to which the data is not successfully written, the potential of write data of the memory cell is changed and then data is written again to all the memory cells in the row. This operation is repeated, and when data is successfully written to all the memory cells in one row, the writing operation is completed.

Therefore, verifying and writing of data need to be performed plural times, and in the case where threshold voltages of memory cells vary widely, the number of reading operations and writing operations is significantly increased. In addition, in the case where a transistor included in each memory cell is formed using a semiconductor material such as silicon, the transistor includes a floating gate; however, data in the memory cells need to be erased in every writing operation.

In addition to the above problems, a variation in the threshold voltage of a transistor included in a memory cell may cause a variation in potentials needed for driving a plurality of memory cells (such a potential is also referred to as the threshold voltage of a memory cell). If the operation voltages of the memory cells are determined without consideration of the variation in the threshold voltage of the memory cells, an operation error might be caused. Therefore, the operation voltages of the plurality of memory cells are each set to have a certain range in consideration of the variation in the threshold voltage of the memory cells. This has limited a reduction in the operation voltages of the memory cells.

Moreover, in the case where a memory cell is multi-leveled, the operation voltage is increased; therefore, it has been difficult to increase the storage capacity without increasing the operation voltage and the area of the memory cell.

In view of the above problems, in this specification, an object is to provide a semiconductor device which is capable of high-speed writing operation with low power consumption and a driving method thereof. Further, an object is to provide a semiconductor device which is suitable for a multi-level memory cell and a driving method thereof.

In order to solve the above problems, in one embodiment of the disclosed invention, a semiconductor device includes a memory cell and a transistor with small off-state current. Note that a transistor with low off-state current includes a semiconductor having a wide band gap (for example, a semiconductor having a band gap of 2 eV or more, preferably 3 eV or more), specifically, an oxide semiconductor.

As the transistor with small off-state current, a transistor whose semiconductor layer includes an oxide semiconductor can be used, for example. The oxide semiconductor has a band gap of 3.0 eV or more, which is much larger than a band gap of silicon (1.1 eV).

The off-resistance of the transistor (resistance between source and drain when the transistor is in an off-state) is inversely proportional to the concentration of carriers thermally excited in the semiconductor layer where a channel is formed. Since the band gap of silicon is 1.1 eV even in a state where there is no carrier caused by a donor or an acceptor (i.e., even in the case of an intrinsic semiconductor), the concentration of thermally excited carriers at room temperature (300 K) is approximately $1\times10^{11}$ cm$^{-3}$.

On the other hand, in the case of a semiconductor whose band gap is 3.2 eV (an oxide semiconductor, here), the concentration of thermally excited carriers is approximately $1\times10^{-7}$ cm$^{-3}$. When the electron mobility is the same, the resistivity is inversely proportional to the carrier concentration; therefore, the resistivity of the semiconductor whose band gap is 3.2 eV is 18 orders of magnitude higher than that of silicon.

Such a transistor in which an oxide semiconductor having a wide band gap is used for a semiconductor layer (OS transistor) can realize an extremely small off-state current.

An oxide semiconductor is one of wide-gap semiconductors. It is preferable to use an oxide semiconductor containing at least one element selected from In, Ga, Sn, and Zn, for example, an In—Sn—Ga—Zn—O-based oxide semiconductor, an In—Ga—Zn—O-based oxide semiconductor, or an In—Sn—Zn—O-based oxide semiconductor.

An oxide semiconductor film formed using the oxide semiconductor is in a single crystal state, a polycrystalline (also referred to as polycrystal) state, an amorphous state, or the like. Note that the oxide semiconductor film is preferably a c-axis aligned crystalline oxide semiconductor (CAAC-OS) film. Note that a specific structure of the CAAC-OS and the like is described in Embodiment 6.

In addition, verifying operation is performed in the following manner as shown in a flow chart in FIG. 3B: a given potential (hereinafter, abbreviated as reference potential) is written to memory cells in any of one row, then, a variation in the threshold voltage of the memory cells is derived in each memory cell from the reference potential and is compensated for the data to be written to the memory cells (data to be stored in the memory cells), and then, the data compensated for the variation in the threshold voltages is written to all the memory cells in the row.

One embodiment of the disclosed invention is a semiconductor device including a memory cell which includes a first transistor controlling an input of a potential from a bit line and an output of a potential to the bit line, a second transistor for controlling an output of a potential to the bit line according to a potential of a word line and for outputting a first potential or a second potential according to a potential applied to a gate electrode, and a capacitor for adjusting a potential from the word line, which is applied to the gate electrode, a data buffer for holding data to be written to the memory cell, a potential generating circuit for generating a reference potential and a plurality of different write data potentials, a control signal generating circuit for outputting a control signal having a constant cycle, a writing circuit for writing any one of the plurality of write data potentials or the reference potential to the memory cell, a reading circuit for reading the write data potential of the memory cell, and a switching element for controlling an output of the control signal according to an input of the first potential or the second potential. The first transistor includes a channel region formed using an oxide semiconductor, and the second transistor includes a channel region formed using any of silicon, germanium, silicon germanium, silicon carbide, and gallium arsenide. The second transistor outputs the first potential until the potential applied to the gate electrode reaches a threshold value and outputs the second potential once the potential applied to the gate electrode reaches the threshold value. An electric signal of the word line changes according to the output of the control signal. The writing circuit writes the reference potential to the memory cell before the data is input from the data buffer, selects any one of the plurality of write data potentials according to an input of the control signal after the data is input from the data buffer, and writes, to the memory cell, the write data potential which is selected at the time when the operation of the switching element is stopped. The switching element allows the output of the control signal to the writing circuit in a period during which the first potential is input and interrupts the output of the control signal to the writing circuit once the second potential is input.

Note that in this specification, in some cases, "a transistor including a semiconductor layer formed using any of silicon, germanium, silicon germanium, silicon carbide, gallium arsenide, and organic semiconductor material" is briefly referred to as "a transistor formed using a material other than an oxide semiconductor" for simplification and easy understanding of the description.

In any of the above structures, the control signal generating circuit generates the control signal during the period after the reference potential is written to the memory cell and until the output of the control signal from the switching element is stopped. In other words, during another period, the control signal may have a non-constant frequency or generation of the control signal may be stopped.

In any of the above structures, the levels of the plurality of write data potentials generated in the potential generating circuit are different from each other. Each of the plurality of write data potentials having different levels, which is generated in the potential generating circuit, is supplied to any of the plurality of first signal lines and supplied to the writing circuit. The plurality of write data potentials generated in the potential generating circuit includes a plurality of potentials for writing of the same data.

In any of the above structures, in each of the plurality of memory cells, one of a source and a drain of the first transistor is electrically connected to a gate of the second transistor.

In any of the above structures, the writing circuit is electrically connected to the other of the source and the drain of the first transistor included in each of the plurality of memory cells, and the reading circuit is electrically connected to one of a source and a drain of the second transistor included in each of the plurality of the memory cells.

In any of the above structures, there is a variation (distribution width) in the threshold voltage of the plurality of memory cells in some cases. In that case, a potential written to the memory cell might differ between a memory cell with minimum threshold voltage (Vth_min) and a memory cell with maximum threshold voltage (Vth_max).

It is preferable that a potential determined as the write data potential for the memory cell with the minimum threshold voltage (Vth_min) be the lowest potential of a plurality of write data potentials for writing of the same data among the plurality of write data potentials generated in the potential generating circuit. In addition, it is preferable that a potential determined as the write data potential for the memory cell with the maximum threshold voltage (Vth_max) be the highest potential of a plurality of write data potentials for writing of the same data among the plurality of write data potentials generated in the potential generating circuit.

In other words, it is preferable that the lowest potential of the plurality of write data potentials for writing of the same data among the plurality of potentials generated in the potential generating circuit be the potential determined as the write data potential for the memory cell with the minimum threshold voltage (Vth_min). Further, it is preferable that the highest potential of the plurality of write data potentials for writing of the same data among the plurality of write data potentials generated in the potential generating circuit be the potential determined as the write data potential for the memory cell with the maximum threshold voltage (Vth_max).

In any of the above structures, the second transistor preferably includes a channel formation region provided in a substrate containing any of silicon, germanium, silicon germanium, silicon carbide, and gallium arsenide, and an organic semiconductor material.

Note that the substrate is preferably a single crystal semiconductor substrate or an SOI substrate. The semiconductor material included in the substrate is preferably silicon. The oxide semiconductor preferably includes an oxide semiconductor material containing one or more elements selected from In, Ga, Sn, and Zn.

Note that although the transistor is formed using an oxide semiconductor in the above description, the disclosed invention is not limited thereto. A material which can realize the off-state current characteristics equivalent to those of the oxide semiconductor, such as a wide gap material like silicon carbide (specifically, a semiconductor material whose energy gap Eg is larger than 3 eV) may be used.

In addition, one embodiment of the disclosed invention is a method for driving a semiconductor device. The semiconductor device includes a first transistor whose channel region is formed using an oxide semiconductor material and a second transistor whose channel region is formed using any of silicon, germanium, silicon germanium, silicon carbide, gallium arsenide, and an organic semiconductor material; a plurality of memory cells in each of which one of the source and the drain of the first transistor is electrically connected to a gate of the second transistor; a driver circuit including a data buffer, a writing circuit, a reading circuit, a control signal generating circuit, and a switching element; and a potential generating circuit for generating a reference potential and a plurality of write data potential. In the semiconductor device, a control signal generated in the control signal generating circuit is output successively to the switching element at a constant cycle. The reference potential of the potential generating circuit is written to the plurality of memory cells by applying the reference potential to the gate electrode of the second transistor and making the first transistor turn off. Then, the data stored in the data buffer is input to the writing circuit and one of the plurality of write data potentials generated in the potential generating circuit is selected as the write data potential for the memory cell. Then, after the reference potential is written to the plurality of memory cells, operations are repeated in which a potential applied to the gate electrode of the second transistor is changed by changing an electric signal of a word line for the second transistor according to the generation of the control signal, and in which the write data potential selected in the writing circuit is changed to a potential different from the one of the plurality of write data potentials according to an input of the control signal input through the switching element. Once the potential applied to the gate electrode of the second transistor reaches the threshold voltage of the second transistor, the operation of the switching element is stopped and change in the potential applied to the gate electrode of the second transistor and change in the write data potential selected in the writing circuit are stopped. When the operation of the switching element is stopped, the write data potential selected in the writing circuit is written to the memory cell.

Since the off-state current of a transistor including an oxide semiconductor is extremely small in a semiconductor device according to one embodiment of the disclosed invention, stored data can be stored for a long time owing to the transistor. In other words, power consumption can be adequately reduced because refresh operation becomes unnecessary or the frequency of refresh operation can be extremely low. Moreover, stored data can be stored for a long time even when power is not supplied.

In a semiconductor device according to one embodiment of the disclosed invention, even when the threshold voltage of a transistor included in a memory cell varies, the variation (distribution width) in the threshold voltage of a plurality of memory cells after writing can be reduced, whereby the operation voltage of the semiconductor device can be reduced. A memory can be multi-leveled without increasing the operation voltage and the area of a memory cell, so that the storage capacity per unit area of the semiconductor device can be increased. A semiconductor device in which operation such as writing, holding, or reading can be surely performed with the writing speed increased can be provided.

Further, a semiconductor device according to one embodiment of the disclosed invention does not need high voltage for writing of data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily realized. In addition, there is no need of operation for erasing data.

Since a transistor formed using a material other than an oxide semiconductor can operate at sufficiently high speed, a semiconductor device in which the transistor is used in combination with a transistor including an oxide semiconductor can perform operation (e.g., data reading) at sufficiently high speed. Further, a transistor formed using a material other than an oxide semiconductor can favorably realize a variety of circuits (such as a logic circuit or a driver circuit) which is required to operate at high speed.

In addition, in a semiconductor device according to the disclosed invention, a reference potential is written to the memory cell in advance and a write data potential is determined by performing verifying operation, and then a desired data is written, so that writing operation can be performed at higher speed.

BRIEF DESCRIPTION OF THE DRAWINGS

FIGS. 15A1, 15A2, and 15B are circuit diagrams of a memory cell included in a semiconductor device.

FIGS. 25A to 25C illustrate a structure of an oxide material.

FIGS. 26A to 26C illustrate a structure of an oxide material.

FIG. 27 is a graph showing characteristics of a transistor including an oxide semiconductor.

DETAILED DESCRIPTION OF THE INVENTION

Figure 1:
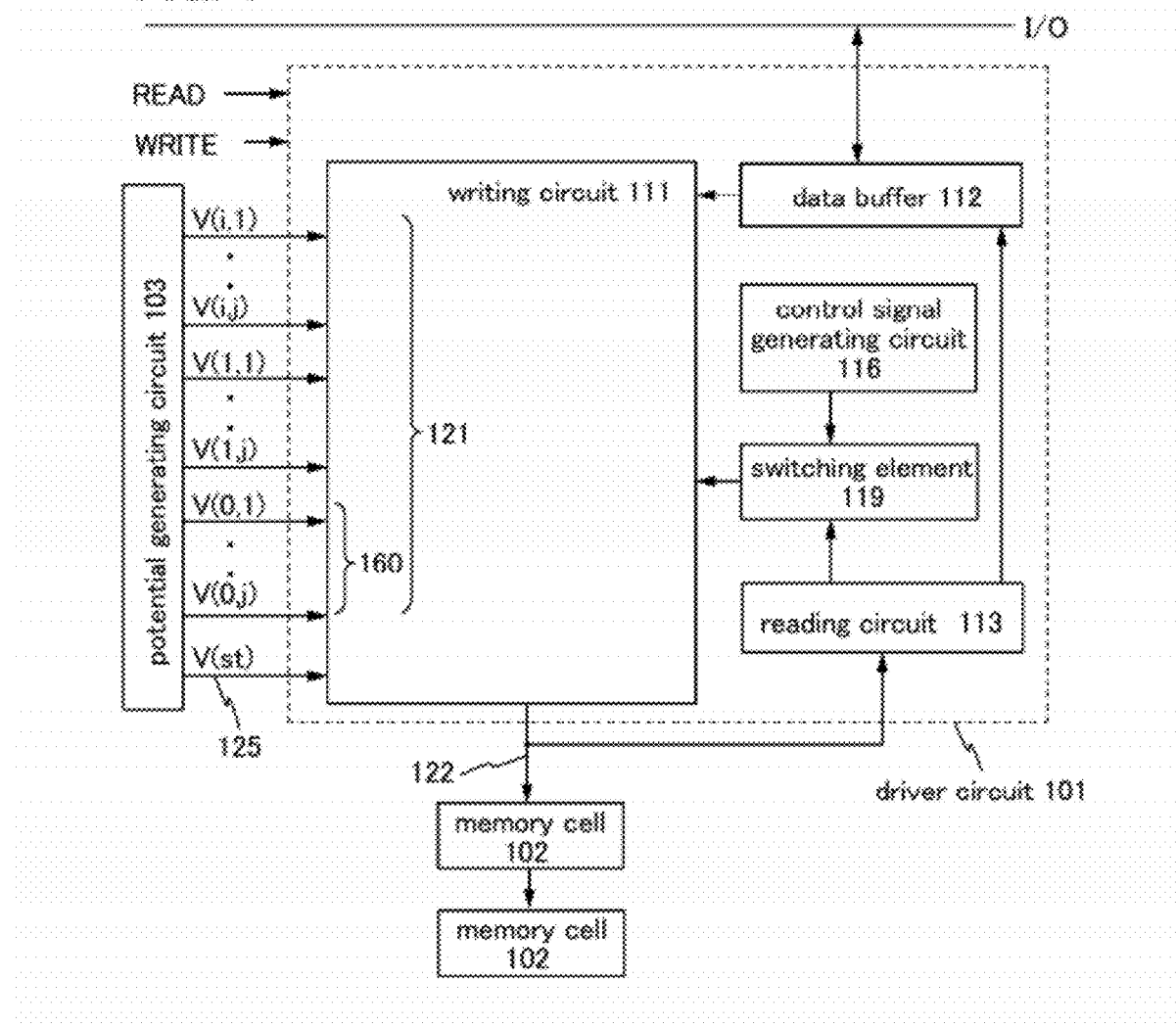
FIG. 1 is a block diagram of a semiconductor device.

Hereinafter, embodiments of the disclosed invention are described with reference to the drawings. Note that the present invention is not limited to the following description and it will be readily appreciated by those skilled in the art that modes and details can be modified in various ways without departing from the spirit and the scope of the present invention. Therefore, the present invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, a structure and operation of a semiconductor device according to one embodiment of the disclosed invention are described with reference to FIG. 1, FIG. 2, FIGS. 3A and 3B, and FIGS. 4A and 4B.

<Description of Structure of Semiconductor Device>

FIG. 1 is an example of a block diagram of a semiconductor device including memory cells.

The semiconductor device includes a driver circuit 101, a plurality of memory cells 102, and a potential generating circuit 103. Further, the semiconductor device includes a wiring for supplying an input/output signal (I/O) (also referred to as data input/output line), a wiring for supplying a read signal (READ), and a wiring for supplying a write signal (WRITE).

The driver circuit 101 includes a writing circuit 111, a data buffer 112, a reading circuit 113, a control signal generating circuit 116, and a switching element 119 and has a function of driving the plurality of memory cells 102. The driver circuit 101 is provided for each column having the plurality of memory cells 102.

Each of the plurality of memory cells 102 includes a first transistor (corresponding to an OS transistor 201 in FIG. 2) including an oxide semiconductor and a second transistor (corresponding to a transistor 203 in FIG. 2) including a material other than an oxide semiconductor. Note that in each of the plurality of memory cells 102, one of a source and a drain of the first transistor (corresponding to the OS transistor 201 in FIG. 2) including an oxide semiconductor can be electrically connected to a gate of the second transistor (corresponding to the transistor 203 in FIG. 2) including a material other than an oxide semiconductor. Note that in this specification and the like, "a transistor including an oxide semiconductor" means a transistor including an oxide semiconductor at least in a channel formation region and "a transistor including a material other than an oxide semiconductor" means a transistor including a material other than an oxide semiconductor at least in a channel formation region.

In addition, in each of the plurality of memory cells 102, it is preferable that the first transistor (corresponding to the OS transistor 201 in FIG. 2) including a material other than an oxide semiconductor include a channel formation region provided in a substrate including a semiconductor material.

The potential generating circuit 103 is electrically connected to i×j (i is an integer of 2 or more, and j is an integer of 2 or more) write data potential supply lines (corresponding to first signal lines 121 in FIG. 1) and a reference potential supply line (corresponding to a third signal line 125 in FIG. 1). The write data potential supply lines which are the first signal lines 121 supply a plurality of write data potentials to the writing circuit 111. The reference potential supply line which is the third signal line 125 supplies a reference potential V(st) to the writing circuit 111. The reference potential V(st) may be any potential as long as it does not turn on the second transistor including a material other than an oxide semiconductor. Note that i represents the number of data (values) that can be stored in the memory cell 102, and j represents a kind of potential that can be written to one piece of data. For example, the write data potential supply lines represented by a range 160 in FIG. 1 is used for outputting data "0" and includes j wirings for supplying j different kinds of potentials.

Note that each of the plurality of write data potentials (V(0,1) to V(i,j)) supplied from the potential generating circuit 103 to the first signal lines 121 which are write data potential lines has a different level of potential.

The writing circuit 111 is electrically connected to the memory cells 102, the data buffer 112, and the switching element 119. In the state before data stored in the data buffer 112 is input to the writing circuit 111, the writing circuit 111 has a function of writing the reference potential V(st) generated in the potential generating circuit 103 to the plurality of memory cells 102. Further, in the state after the data stored in the data buffer 112 is input to the writing circuit 111, the writing circuit 111 has a function of selecting one potential (e.g., V(1,1)) from among the plurality of write data potentials generated in the potential generating circuit 103 according to the data input from the data buffer 112 and a control signal input from the control signal generating circuit 116 through the switching element 119. In addition, the writing circuit 111 has a function of writing, to the memory cells, the write data potential selected when the switching element 119 is turned off.

The data buffer 112 is electrically connected to the writing circuit 111 and the reading circuit 113 and has functions of holding data written to the plurality of memory cells 102 and holding data read by the reading circuit 113 or outputting the stored data to outside (the I/O line).

The reading circuit 113 is electrically connected to the plurality of memory cells 102 through the second signal line 122 which is a bit line and has a function of reading the data written to the memory cells 102. The reading circuit 113 also has a function of outputting, to the switching element 119, a signal for controlling whether or not the control signal generated in the control signal generating circuit 116 is input to the writing circuit 111 according to the potential signal (first potential or second potential) input from the memory cells 102. Further, the reading circuit 113 has a function of outputting the read data to the data buffer 112.

Note that the second signal line 122 can be electrically connected to the other of the source and the drain of the first transistor (not shown) including an oxide semiconductor included in each of the plurality of memory cells 102.

The control signal generating circuit 116 is electrically connected to the switching element 119 and has a function of generating the control signal having a constant cycle. The control signal generating circuit 116 further has a function of generating the control signal in synchronization with the change in the potential of a word line WL (not shown) of the plurality of memory cells 102. Note that the control signal is generated at least during the period after the reference potential V(st) is written to the memory cells 102 before output of the control signal from the switching element 119 is stopped. In other period, the control signal does not need to be constant or the control signal does not need to be generated.

The switching element 119 is electrically connected to the writing circuit 111, the reading circuit 113, and the control signal generating circuit 116 and has a function of outputting, to the writing circuit 111, the control signal input from the control signal generating circuit 116 or stopping the output of the control signal according to the potential signal (the first potential or the second potential) from the reading circuit 113.

<Description of Operation of Semiconductor Device>

First, in the state before the data stored in the data buffer 112 is input to the writing circuit 111, the reference potential V(st) generated in the potential generating circuit 103 is written to the plurality of memory cells 102. Then, the data stored in the data buffer 112 is input to the writing circuit 111 and, any one of the plurality of write data potentials generated in the potential generating circuit 103, which corresponds to the data input from the data buffer 112, is selected. After that, verifying operation is performed by using the reference potential V(st) written to the memory cells 102.

Figure 2:
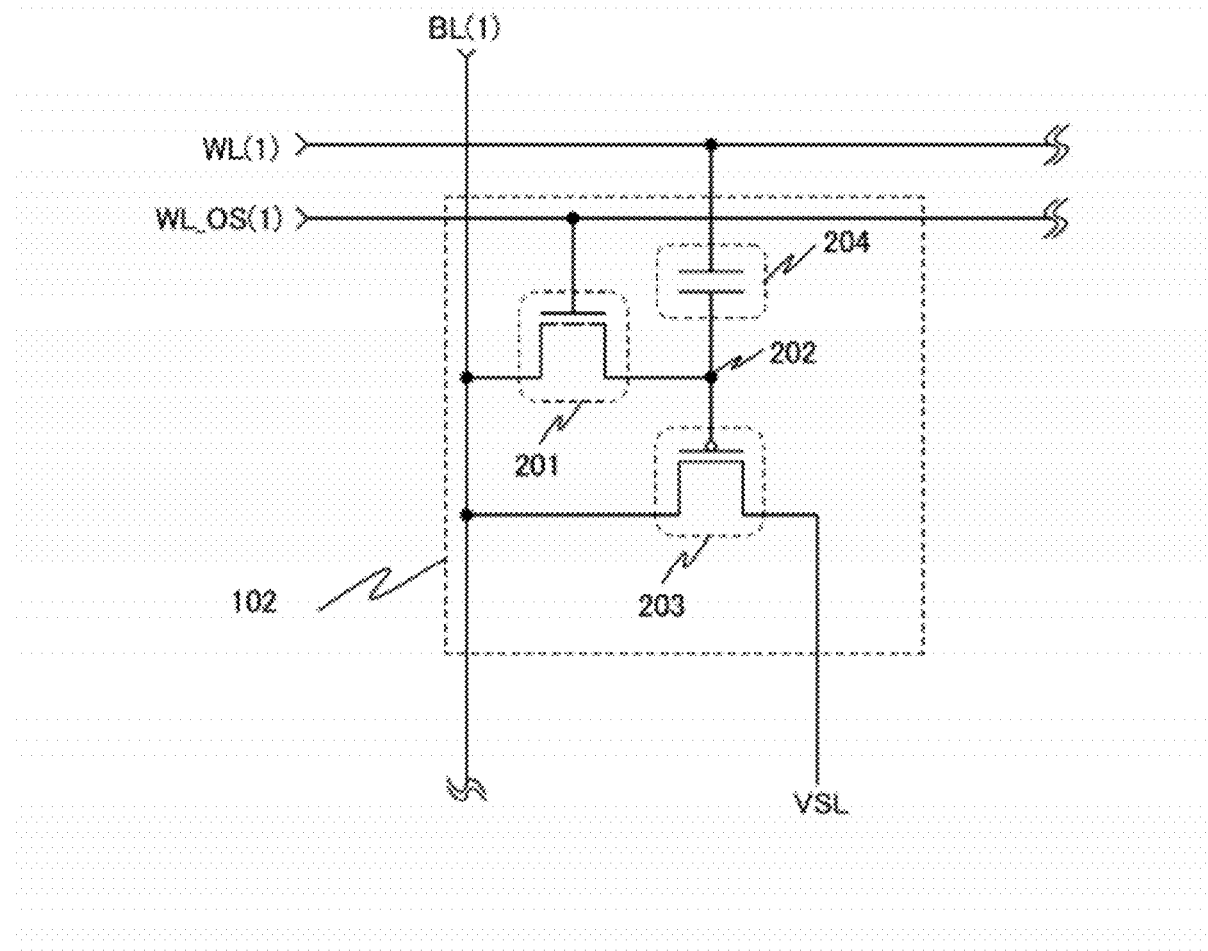
FIG. 2 illustrates verifying operation.
Figure 3A:
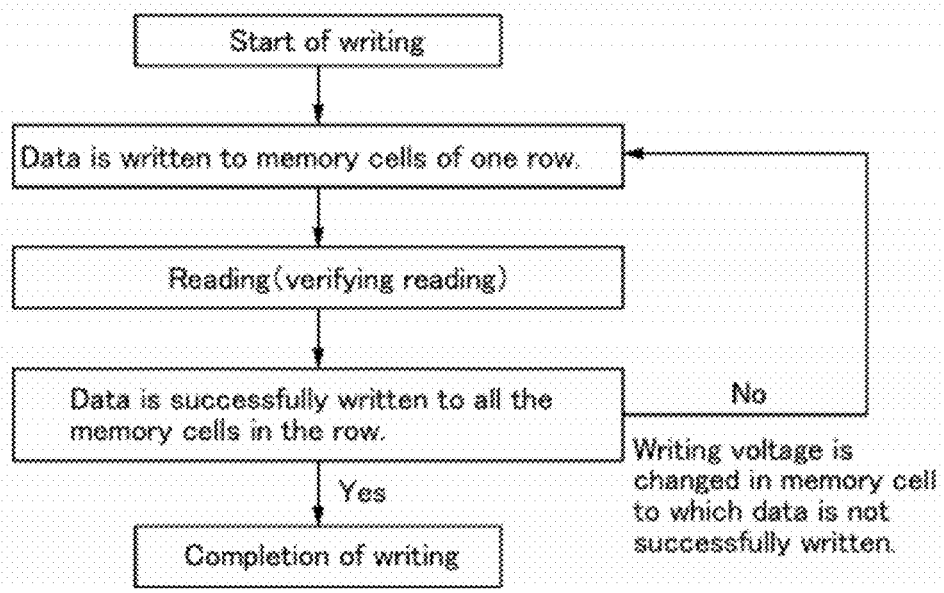
FIGS. 3A and 3B are flow charts each showing verifying operation of the present invention and conventional verifying operation.
Figure 3B:
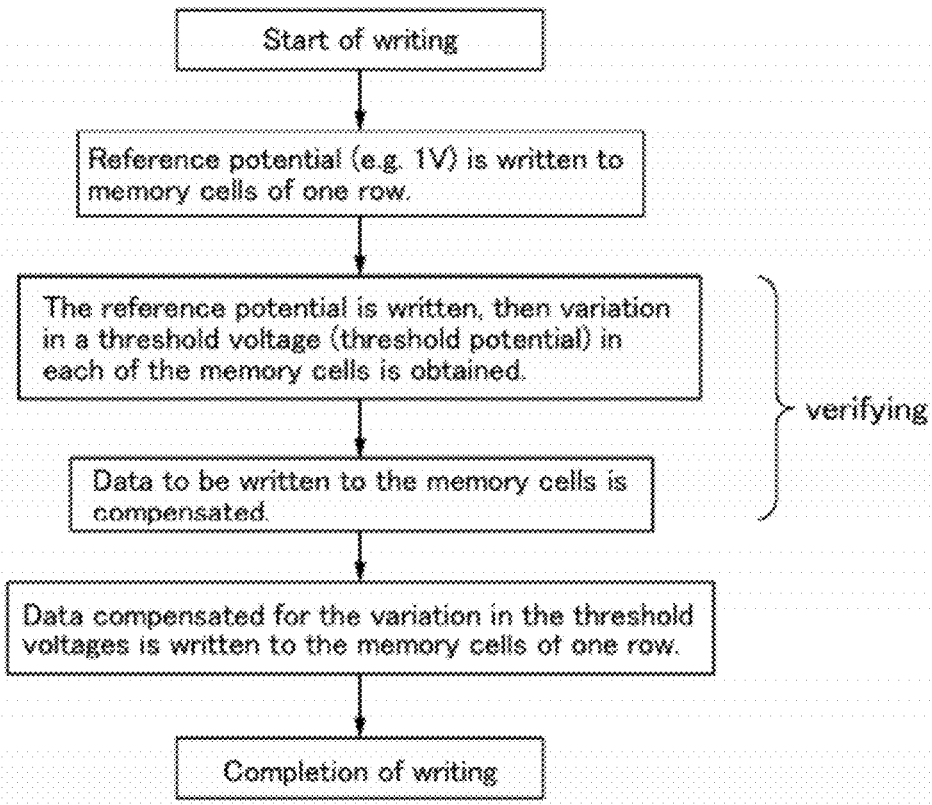

In order to describe verifying operation in this embodiment in detail, one of the plurality of memory cells 102 is focused with reference to FIG. 2. Note that FIGS. 3A and 3B are flow charts briefly showing the verifying operation. Note that the transistor 203 is a p-channel transistor in this embodiment and the like; however, there is no limitation thereon.

The configuration of the memory cell 102 illustrated in FIG. 2 is as follows: a bit line BL(1) which is the second signal line 122 in FIG. 1 is electrically connected to a drain electrode of an OS transistor 201 which is the first transistor including an oxide semiconductor (abbreviated to "OS transistor" in order to easily distinguish from the second transistor), a gate electrode of the OS transistor 201 is electrically connected to a word line WL_OS(1), a source electrode of the OS transistor 201 and a gate electrode of the transistor 203 including a material other than an oxide semiconductor are electrically connected to one electrode of a capacitor 204, and the other electrode of the capacitor 204 is electrically connected to a word line WL(1). The bit line BL(1) is electrically connected to a drain electrode of the transistor 203, and a source electrode of the transistor 203 is electrically connected to a signal line VSL. Note that in the drawings of this specification, part of the OS transistor is denoted by a dotted line as the OS transistor 201 in FIG. 2 in order to show that off-state current is extremely small. Note that the OS transistor 201 is an n-channel transistor and the transistor 203 is a p-channel transistor in the description below; however, there is no limitation thereon.

Here, in order to describe "an extremely small off-state current" of an OS transistor, measurement results of the off-state current of a transistor including a highly purified oxide semiconductor are described.

<Measurement of Off-State Current of OS Transistor>

First, a transistor with a channel width W of 1 m, which is sufficiently wide, was prepared in consideration of a very small off-state current of a transistor including a purified oxide semiconductor, and the off-state current was measured. FIG. 27 shows the results of measuring the off-state current of the transistor with a channel width W of 1 m. In FIG. 27, the horizontal axis shows a gate voltage VG and the vertical axis shows a drain current ID. In the case where the drain voltage VD is +1 V or +10 V and the gate voltage VG is within the range of −5 V to −20 V, the off-state current of the transistor is found to be smaller than or equal to $1 \times 10^{-12}$ A which is the detection limit. In addition, the off-state current (per unit channel width (1 μm), here) of the transistor is found to be smaller than or equal to 1 aA/μm ($1 \times 10^{-18}$ A/μm).

Next, the results of more accurately measuring the off-state current of the transistor including a purified oxide semiconductor are described. As described above, the off-state current of the transistor including a purified oxide semiconductor is found to be smaller than or equal to $1 \times 10^{-12}$ A which is the detection limit of measurement equipment. Here, the results of measuring more accurate off-state current (a value smaller than or equal to the detection limit of measurement equipment in the above measurement) with the use of an element for characteristic evaluation are described.

First, the element for characteristic evaluation which is used in a method for measuring current is described with reference to FIG. 28.

Figure 28:
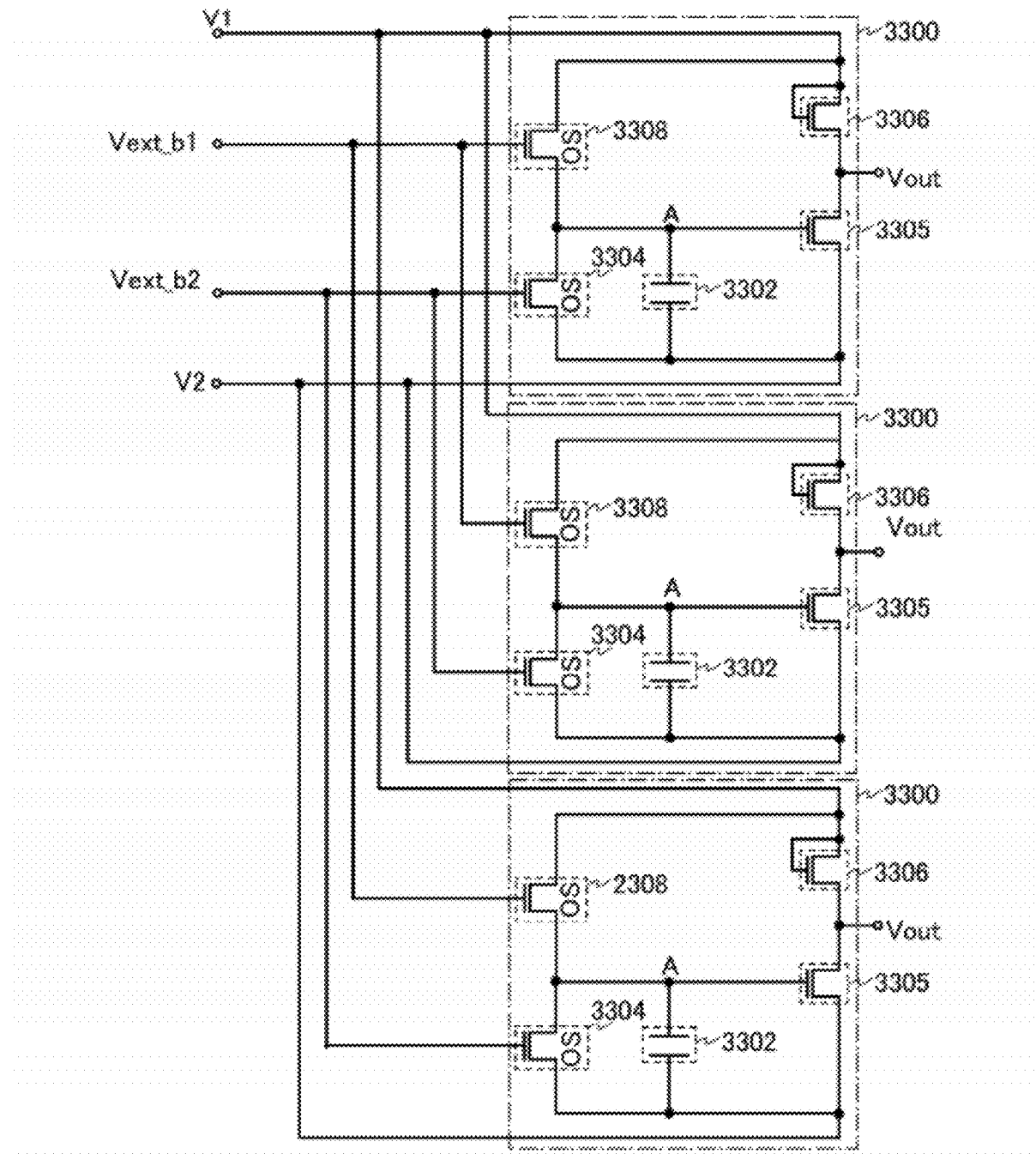
FIG. 28 a circuit diagram of an element for evaluating characteristics of a transistor including an oxide semiconductor.

In the element for characteristic evaluation in FIG. 28, three measurement systems 3300 are connected in parallel. The measurement systems 3300 each include a capacitor 3302, a transistor 3304, a transistor 3305, a transistor 3306, and a transistor 3308. As the transistor 3304, the transistor 3305, the transistor 3306, and the transistor 3308, transistors including a purified oxide semiconductor were employed.

In the measurement system 3300, one of a source terminal and a drain terminal of the transistor 3304, one of terminals of the capacitor 3302, and one of a source terminal and a drain terminal of the transistor 3305 are electrically connected to a power source (for supplying V2). The other of the source terminal and the drain terminal of the transistor 3304, one of a source terminal and a drain terminal of the transistor 3308, the other of the terminals of the capacitor 3302, and a gate terminal of the transistor 3305 are electrically connected to one another. The other of the source terminal and the drain terminal of the transistor 3308, one of a source terminal and a drain terminal of the transistor 3306, and a gate terminal of the transistor 3306 are electrically connected to a power source (for supplying V1). The other of the source terminal and the drain terminal of the transistor 3305 and the other of the source terminal and the drain terminal of the transistor 3306 are electrically connected to each other and electrically connected to an output terminal.

Note that a potential Vext_b2 for controlling whether to turn on or off the transistor 3304 is supplied to the gate terminal of the transistor 3304, and a potential Vext_b1 for controlling whether to turn on or off the transistor 3308 is supplied to the gate terminal of the transistor 3308. A potential Vout is output from the output terminal.

Next, a method for measuring current with the use of the element for characteristic evaluation is described.

First, an initial period in which a potential difference is generated to measure the off-state current is briefly described. In the initial period, the potential Vext_b1 for turning on the transistor 3308 is input to the gate terminal of the transistor 3308. Accordingly, a potential V1 is supplied to a node A that is electrically connected to the other of the source terminal and the drain terminal of the transistor 3304 (that is, the node electrically connected to one of the source terminal and the drain terminal of the transistor 3308, the other of the terminals of the capacitor 3302, and the gate terminal of the transistor 3305). Here, the potential V1 is, for example, a high potential. In addition, the transistor 3304 is turned off.

After that, the potential Vext_b1 for turning off the transistor 3308 is input to the gate terminal of the transistor 3308, so that the transistor 3308 is turned off. After the transistor 3308 is turned off, the potential V1 is set to a low potential. Still, the transistor 3304 is turned off. The potential V2 is equal to the potential V1. Thus, the initial period is completed. When the initial period is completed, a potential difference is generated between the node A and one of the source terminal and the drain terminal of the transistor 3304. In addition, a potential difference is generated between the node A and the other of the source terminal and the drain terminal of the transistor 3308. Accordingly, a small amount of electric charge flows through the transistor 3304 and the transistor 3308. That is, the off-state current is generated.

Next, a measurement period of the off-state current is briefly described. In the measurement period, the potential (that is, V2) of one of the source terminal and the drain terminal of the transistor 3304 and the potential (that is, V1) of the other of the source terminal and the drain terminal of the transistor 3308 are fixed to a low potential. On the other hand, the potential of the node A is not fixed (the node A is in a floating state) in the measurement period. Accordingly, charge flows through the transistor 3304, and the amount of charge held at the node A changes over time. The potential of the node A changes depending on the change in the amount of charge held at the node A. That is, the output potential Vout of the output terminal also changes.

Figure 29:
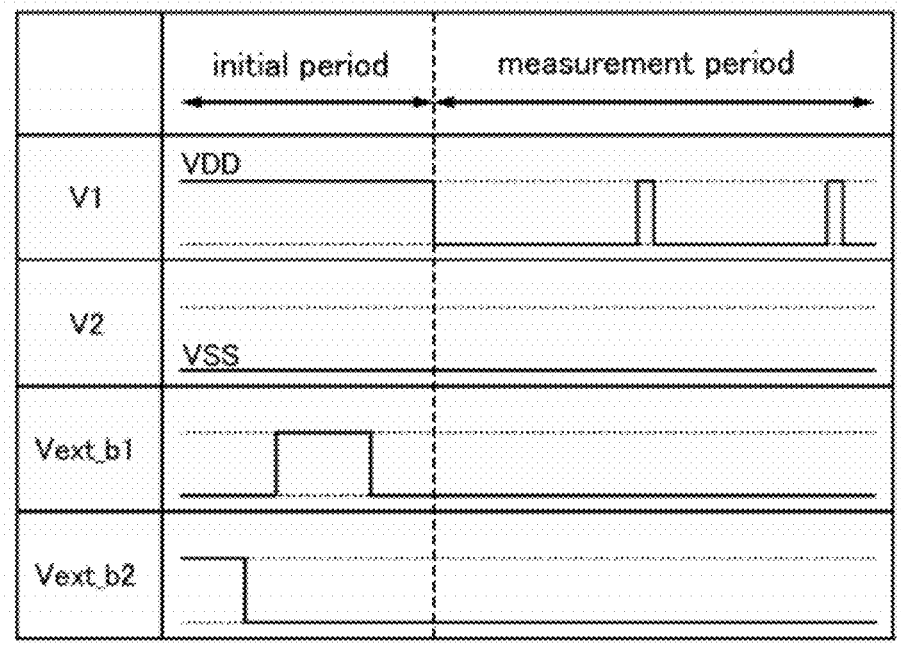
FIG. 29 is a timing chart for an element for evaluating characteristics of a transistor including an oxide semiconductor.

FIG. 29 shows details (a timing chart) of the relation among potentials in the initial period in which the potential difference is generated and those in the subsequent measurement period.

In the initial period, first, the potential Vext_b2 is set to a potential (a high potential) at which the transistor 3304 is turned on. Thus, the potential of the node A becomes V2, that is, a low potential (VSS). Note that it is not essential to supply a low potential (VSS) to the node A. After that, the potential Vext_b2 is set to a potential (a low potential) at which the transistor 3304 is turned off, so that the transistor 3304 is turned off. Next, the potential Vext_b1 is set to a potential (a high potential) at which the transistor 3308 is turned on. Accordingly, the potential of the node A becomes V1, that is, a high potential (VDD). Then, the potential Vext_b1 is set to a potential at which the transistor 3308 is turned off, which places the node A in a floating state and finishes the initial period.

In the measurement period after the initial period, the potential V1 and the potential V2 are set such that charge flows to the node A or charge flows out of the node A. Here, the potential V1 and the potential V2 are set to a low potential (VSS). Note that at the time when the output potential Vout is measured, it is necessary to operate an output circuit and thus temporarily set V1 to a high potential (VDD) in some cases. Note that the period in which V1 is set to a high potential (VDD) is made short to such a degree that the measurement is not influenced.

When the potential difference is generated and the measurement period is started as described above, the amount of charge held at the node A changes over time, which causes the potential of the node A to change. This means that the potential of the gate terminal of the transistor 3305 changes; thus, the output potential Vout of the output terminal also changes over time.

A method for calculating the off-state current on the basis of the obtained output potential Vout is described below.

The relation between a potential $V_A$ of the node A and the output potential Vout is obtained before calculation of the off-state current, whereby the potential $V_A$ of the node A can be obtained using the output potential Vout. In accordance with the above relation, the potential $V_A$ of the node A can be expressed as a function of the output potential Vout by the following formula (1).

[Formula 1]

$$V_A = F(V\text{out}) \tag{1}$$

Charge $Q_A$ of the node A can be expressed by the following formula (2) with the use of the potential $V_A$ of the node A, capacitance $C_A$ connected to the node A, and a constant (const). Here, the capacitance $C_A$ connected to the node A is the sum of the capacitance of the capacitor 3302 and other capacitance.

[Formula 2]

$$Q_A = C_A V_A + \text{const} \tag{2}$$

Current $I_A$ of the node A is a time derivative of charge which flows to the node A (or charge which flows out of the node A), and is thus expressed by the following formula (3).

[Formula 3]
$$I_A = \frac{\Delta Q_A}{\Delta t} = \frac{C_A \cdot \Delta F(Vout)}{\Delta t} \quad (3)$$

In this manner, the current $I_A$ of the node A can be obtained from the capacitance $C_A$ connected to the node A and the output potential Vout of the output terminal.

In accordance with the above method, it is possible to measure leakage current (off-state current) which flows between a source and a drain of a transistor in an off state.

In this embodiment, the transistor 3304, the transistor 3305, the transistor 3306, and the transistor 3308 were manufactured using a purified oxide semiconductor with a channel length L of 10 μm and a channel width W of 50 μm. In addition, in the measurement systems 3300 which are arranged in parallel, the capacitances of the capacitors 3302 were 100 fF, 1 pF, and 3 pF.

Note that VDD was 5 V and VSS was 0 V in the measurement of this embodiment. In the measurement period, Vout was measured while the potential V1 was basically set to VSS and changed to VDD for 100 msec at intervals of 10 sec to 300 sec. In addition, Δt used in calculation of current I which flows through the element was approximately 30000 sec.

Figure 30:
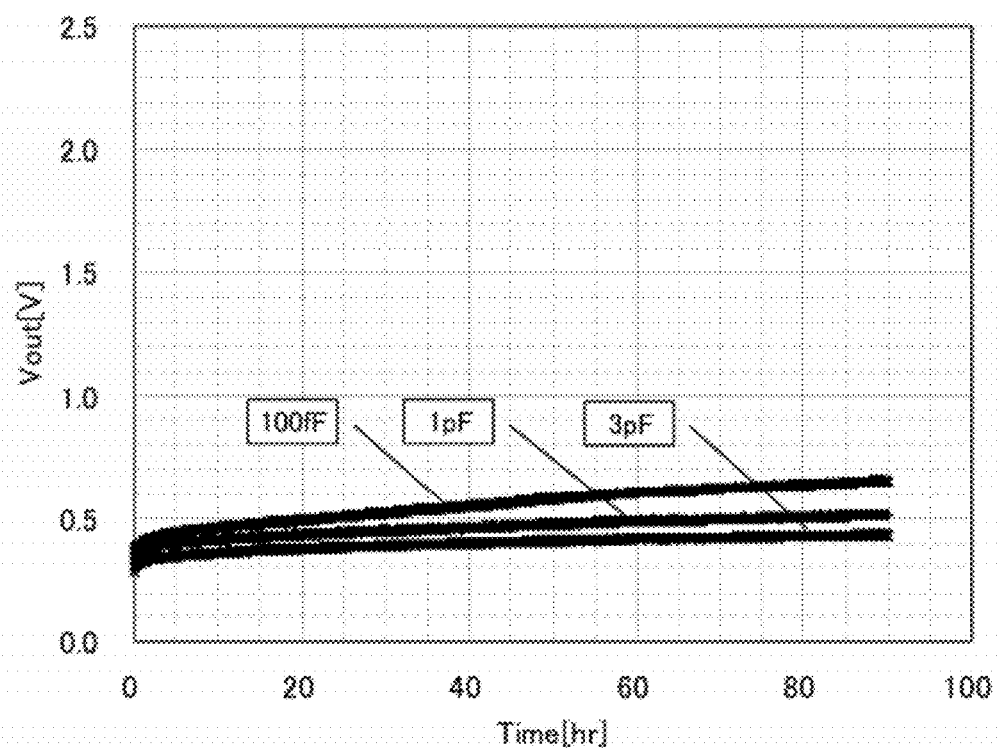
FIG. 30 is a graph showing characteristics of a transistor including an oxide semiconductor.

FIG. 30 shows the relation between the elapsed time Time in the above current measurement and the output potential Vout. It can be confirmed from FIG. 30 that the potential changes as time elapses.

Figure 31:
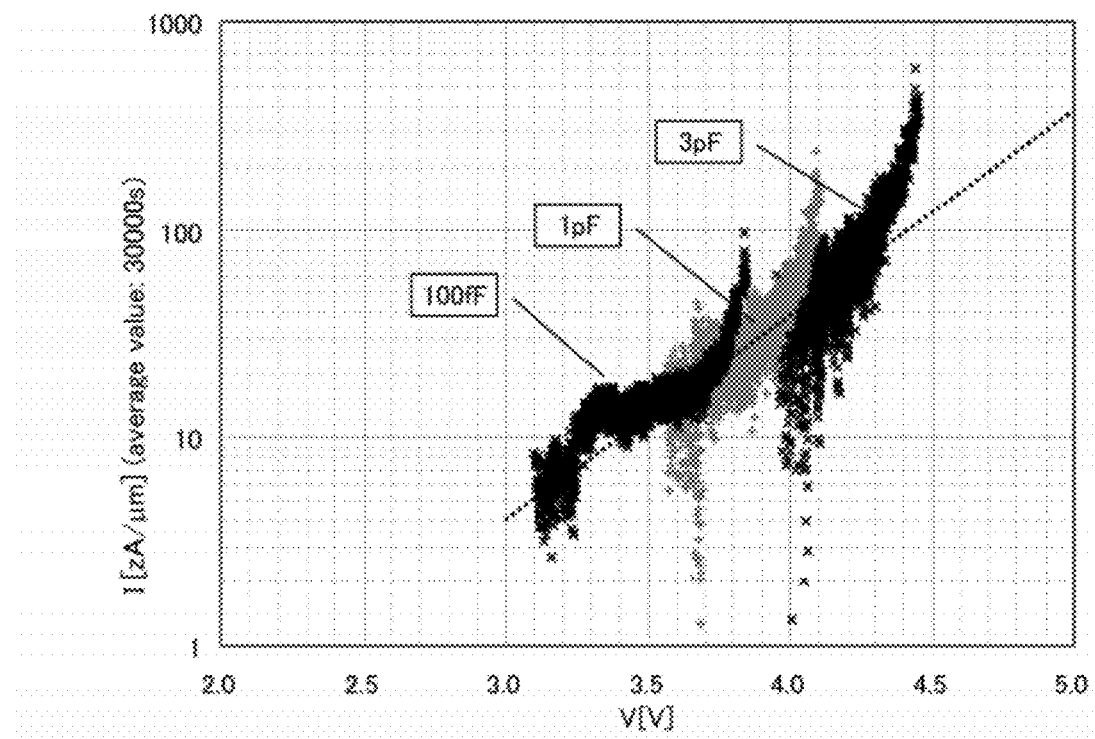
FIG. 31 is a graph showing characteristics of a transistor including an oxide semiconductor.

FIG. 31 shows the off-state current at room temperature (25° C.) which is calculated in the above current measurement. Note that FIG. 31 shows the relation between the source-drain voltage V and the off-state current I. It is found from FIG. 31 that the off-state current is about 40 zA/μm under the condition where the source-drain voltage is 4 V. It is also found that the off-state current is smaller than or equal to 10 zA/μm under the condition where the source-drain voltage is 3.1 V. Note that 1 zA represents $10^{-21}$ A.

Figure 32:
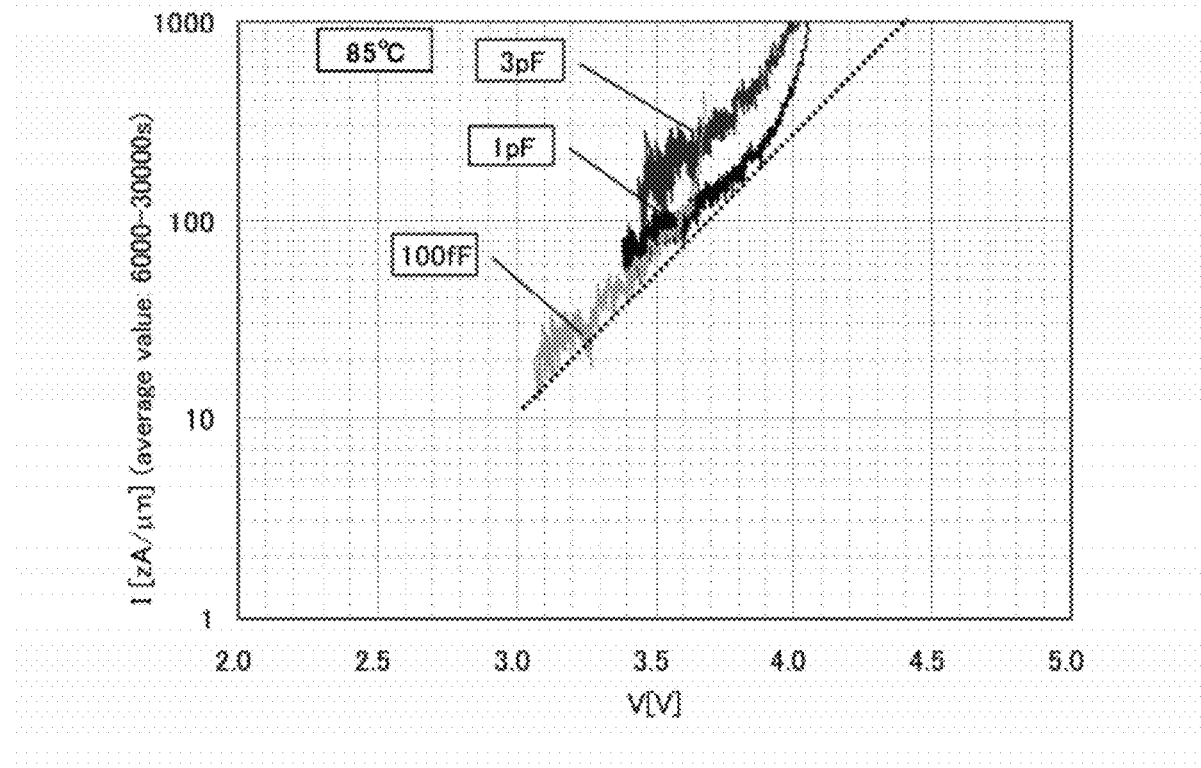
FIG. 32 is a graph showing characteristics of a transistor including an oxide semiconductor.

Furthermore, FIG. 32 shows the off-state current in an environment at a temperature of 85° C., which is calculated in the above current measurement. FIG. 32 shows the relation between the source-drain voltage V and the off-state current I in an environment at a temperature of 85° C. It is found from FIG. 32 that the off-state current is smaller than or equal to 100 zA/μm under the condition where the source-drain voltage is 3.1 V.

As described above, it is confirmed from this example that the off-state current of a transistor including a purified oxide semiconductor is sufficiently small.

When the reference potential V(st) is supplied to the writing circuit 111, the reference potential V(st) is applied to the bit line BL(1) which is the second signal line 122. At the same time, the potential of the word line WL(1) is decreased from a high potential $V_H$ (e.g., 5 V) to a low potential VL (e.g., 0 V). Then, the potential of the word line WL_OS(1) is increased up to the high potential VH (e.g., 5 V), so that the high potential VH is applied to the gate electrode of the OS transistor 201, whereby the OS transistor 201 is turned on. Then, a charge whose potential is equivalent to the reference potential V(st) applied to the bit line BL(1) is stored in a floating node 202 in the memory cell 102. Then, the potential of the word line WL_OS(1) is changed to the low potential VL (e.g., 0 V), whereby the OS transistor 201 is turned off. After that, the potential applied to the word line WL(1) is increased from the low potential VL (e.g., 0 V) to the high potential VH (e.g., 5 V), and at the same time, the potential of a write signal line WRITE is decreased to the low potential VL, so that the writing circuit 111 is electrically disconnected from the bit line BL(1) which is the second signal line 122, and the bit line BL(1) is brought into a floating state. The OS transistor 201 has a characteristic of extremely small off-state current, which facilitates holding of charge stored in the floating node 202 and reading of stored data.

After that, verifying operation is performed, so that the bit line BL(1) which is the second signal line 122 is precharged to the low potential VL (e.g., 0 V) and is brought into a floating state. The word line WL_OS(1) is kept at the low potential VL and the potential of the signal line VSL is increased to the high potential VH (e.g., 5 V). In a period during which the bit line BL(1) is at the low potential VL, the first potential (low potential VL (e.g., 0 V) in this embodiment) is input to the reading circuit 113 and the first potential is also output from the reading circuit 113 to the switching element 119.

In the period during which the first potential (low potential VL (e.g., 0 V) in this embodiment) is kept input, the switching element 119 is short-circuited and the control signal generating circuit 116 is electrically connected to the writing circuit 111, whereby the control signal generated in the control signal generating circuit 116 is input to the writing circuit 111. Note that the potential of the word line WL(1) is changed according to generation of a control signal in the control signal generating circuit 116.

For example, in the case where the reference potential V(st) of 1 V is written to the floating node 202, the word line WL(1) is supplied with a voltage of 5 V, and the signal line VSL is supplied with a voltage of 5 V; the potential of floating node 202 is assumed to be 6 V by capacitive coupling of the reference potential V(st) (1 V) and the potential of the word line WL(1) (5 V). In addition, since a high potential of 5 V is applied to the signal line VSL, Vgs of the transistor 203 is 1 V.

Suppose that the threshold potential of the transistor 203 is −1.3 V, the transistor 203 is kept off when the Vgs is 1 V and the potential of the bit line BL(1) is kept at the first potential (low potential VL (e.g., 0 V)). Then, the first potential (low potential VL (e.g., 0 V)) is read by the reading circuit 113 and is also input to the switching element 119.

In the period during which the first potential (low potential VL (e.g., 0 V)) is input to the switching element 119, the control signal generated in the control signal generating circuit 116 is input to the writing circuit 111 and the write data potential selected in the writing circuit 111 is changed according to the input of the control signal. For example, in the case where data is input from the data buffer 112 and the write data potential of V(1,4) is selected in the writing circuit 111, when the control signal is input to the writing circuit 111 once, the write data potential of V(1,3) is selected. That is, the write data potential supply line (corresponding to the first signal line 121) is changed according to the input of the control signal.

In addition, according to generation of the control signal (in synchronization with generation of the control signal), the potential of the word line WL(1) gradually changes until the operation of the switching element 119 is stopped (is opened, or is brought into an insulating state). Note that the amount of change in the potential of the word line WL(1) depends on the potential of the reference potential V(st) and the variation range of the actual threshold value Vth of the memory cell 102.

For example, in the case where the reference potential V(st) is 1.0 V, the designed threshold voltage of the transistor 203 is −1.0 V, the actual threshold voltage is −1.3 V, the potential of the word line WL(1) is 5 V, and the potential of the signal line VSL is 5 V; the amount of change in the potential of the word line WL(1) is, at first, −2 V, which is the amount needed to turn the transistor 203 on (i.e., Vgs is the designed threshold voltage of −1.0 V or less). At this time, apparent Vgs of the transistor 203 is −1.0 V which is the designed threshold voltage of Vgs by capacity coupling; however, the actual threshold voltage of the transistor 203 is −1.3 V and thus the transistor 203 is kept off.

Accordingly, the first potential (low potential VL (e.g., 0 V) in this embodiment) is output from the bit line BL(1) which is the second signal line 122 to the reading circuit 113 and is also output from the reading circuit 113 to the switching element 119. In a period during which the first potential (low potential VL (e.g., 0 V)) is input to the switching element 119, the control signal generated in the control signal generating circuit 116 is input to the writing circuit 111, so that the potential of the word line WL(1) is changed according to generation of the control signal (in synchronization with the generation of the control signal) for the second time.

The amount of potential change for the second and subsequent times can be set at an arbitrary potential determined by a designer so that the amount of potential change can be lower than the variation range of the actual threshold voltage Vth of the memory cell 102. It is preferable that the arbitrary potential be less than half of a potential of variation range of the threshold voltage Vth of the memory cell. In the case where five kinds of potentials are written to a piece of data in the potential generating circuit 103, potentials each changed by the arbitrary potential are preferably used as the five kinds of potentials. For example, when a potential decrease for the second and subsequent time is set to 0.1 V, five kinds of potentials may be set to 1.0 V, 0.9 V, 0.8 V, 0.7 V, and 0.6 V, or 1.0 V, 1.1 V, 1.2 V, 1.3 V, and 1.4 V.

As described above, when the amount of potential change of the word line WL(1) for the second and subsequent times is set to be 0.1 V, Vgs of the transistor 203 is −1.3 V after the fourth decrease of the potential, so that the transistor 203 is turned on. Thus, the bit line BL(1) is electrically connected to the signal line VSL, the potential of the bit line BL(1) is changed to the potential equal to that of signal line VSL (5 V), and the second potential (high potential VH (5 V) in this embodiment) is read by the reading circuit 113. Further, the second potential (high potential VH (5 V) in this embodiment) is also input to the switching element 119, whereby the operation of the switching element 119 is stopped (the switching element 119 is opened or is brought into an insulating state); thus, the control signal generating circuit 116 is electrically disconnected from the writing circuit 111.

In the writing circuit 111, the control signal is input until the operation of the switching element 119 is stopped and the selected write data potential is changed according to the input of the control signal.

For example, in the case where V(3,5) is selected as the write data potential just after the data is input from the data buffer 112, when the control signal generated in the control signal generating circuit 116 is input four times, the potential of the first signal line 121 changed by "(the number of input pulse signals) −1", that is, V(3,2) which is one of the plurality of writing potentials is selected as the write data potential. Consequently, the write data potential selected in the writing circuit 111 becomes a potential compensated for the variation in the threshold voltage of the memory cells.

Note that although operation of one of the memory cells 102 is described in the above, the operation is similarly performed in the other memory cells 102 in the same row at the same time. Further, when the above operation is performed in all the memory cells in one row, the potential of the write signal line WRITE becomes the high potential VH, so that the writing circuit 111 is electrically connected to the bit line BL(1) which is the second signal line 122, whereby the write data potential compensated for the variation in threshold voltage of the memory cells 102 is written to the memory cells 102.

In such a manner, with the semiconductor device and the verifying operation described in this embodiment, the write data potentials each compensated for the variation in threshold voltage of the memory cells 102 can be written to the memory cells 102 by two writing operations (writing of the reference potential V(st) to the memory cell and writing of the write data potential compensated by the variation in the threshold voltages to the memory cell) and one verifying reading operation. Accordingly, the variation in the threshold voltage Vth of the memory cell can be smaller than the conventional one and writing operation can be performed at high speed. Note that when both of the two transistors which form the memory cell in FIG. 2 include a material other than an oxide semiconductor, there is a problem in that charge stored in the floating node 202 is discharged as time passes and thus refresh operation needs to be performed. However, the problem can be solved as illustrated in FIG. 2 with the structure in which one of the source and the drain of the transistor including an oxide semiconductor is electrically connected to the gate of the transistor including a material other than an oxide semiconductor. Thus, as described in this embodiment, it is important that a transistor including an oxide semiconductor be used as a transistor which forms the memory cell 102 in order to realize the technical characteristics described in this specification.

Accordingly, with the semiconductor device and the verifying operation described in this embodiment, the number of writing operations and verifying operations can be significantly reduced as compared to those in the conventional memory cell, leading to a high-speed operation and a reduction in power consumption of the semiconductor device.

In the above verifying operation with the semiconductor device described in this embodiment, the variation in the threshold voltage of the transistors which form the memory cell 102, or the like may cause a variation (distribution width) in potentials needed for driving the plurality of memory cells 102 (such a potential is also referred to as the threshold voltage of the memory cell).

Figure 4A:
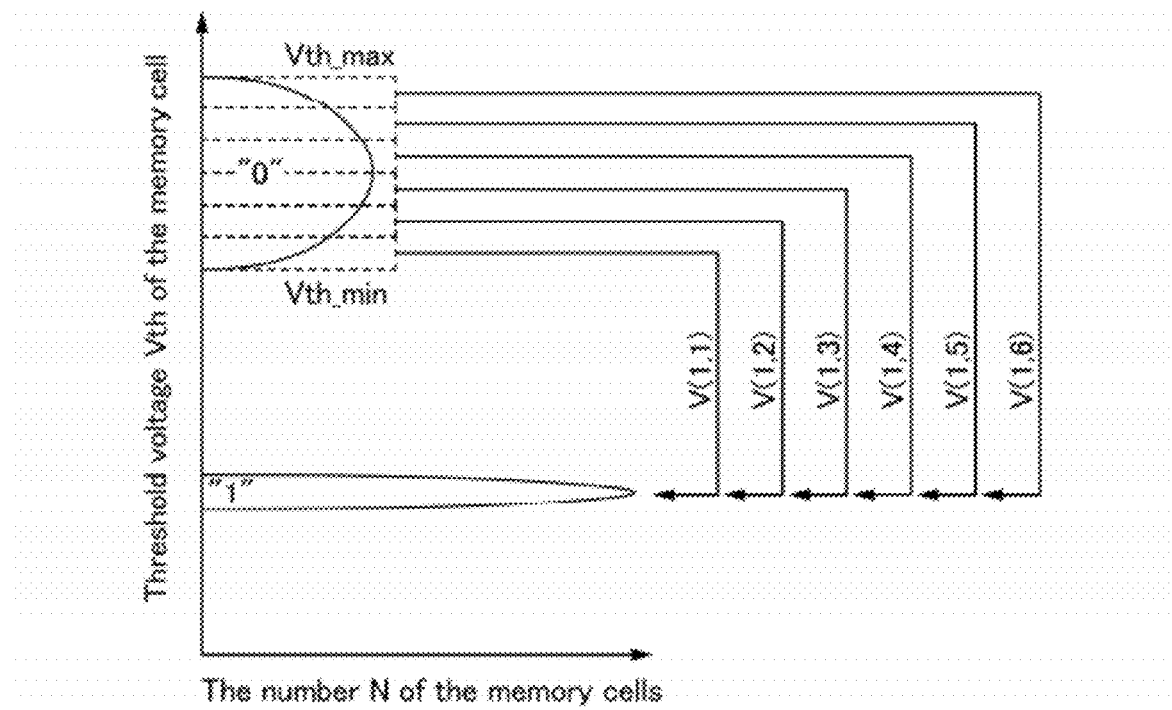
FIGS. 4A and 4B each show a distribution of the threshold voltages of memory cells included in a semiconductor device.
Figure 4B:
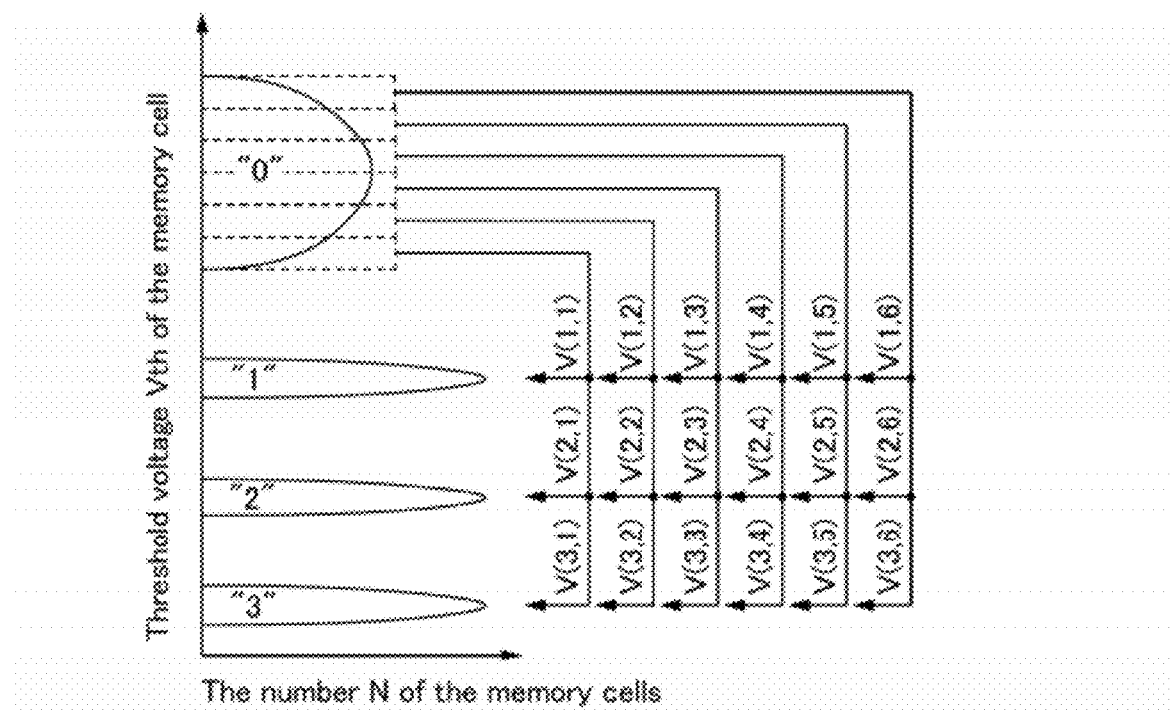

An example of a procedure for writing data "1" to the plurality of memory cells 102 in the case where there is the variation (distribution width) in the threshold voltage of the plurality of memory cells 102 is shown in FIGS. 4A and 4B. Note that the write data potentials from V(1,1) to V(1,j) of the plurality of write data potentials (from V(0,1) to V(i,j)) which are generated in the potential generating circuit 109 are the potentials for writing data "1".

FIG. 4A is a graph showing a distribution of the threshold voltages Vth of the plurality of memory cells 102, where the horizontal axis represents the number N of memory cells and the vertical axis represents the threshold voltage Vth of the memory cells 102. FIG. 4A shows the distribution of the threshold voltages Vth before writing (data "0") and after writing (data "1"). The distribution of the threshold voltages Vth after writing (data "1") is shown beyond the arrow extending from the distribution of the threshold voltages Vth before writing (data "0"). The level of a potential used for writing is shown beside the arrow.

As shown in FIG. 4A, the first potential (here, V(1,1)) of the plurality of write data potentials (from V(0,1) to V(i,j)) generated in the potential generating circuit 103 is used as the write data potential and is written to the memory cell in the first range where the threshold voltage Vth of the memory cell 102 is the lowest. Consequently, the distribution of the threshold voltages Vth before writing (data "0") changes to the distribution of the threshold voltages Vth after writing (data "1").

As shown in FIG. 4A, the second potential different from the first potential (here, V(1,2)) of the plurality of write data potentials (from V(0,1) to V(i,j)) generated in the potential generating circuit 103 is used as the write data potential and is written to the memory cells in the second range where the threshold voltage Vth of the memory cell 102 is higher than the first range by an arbitrary potential. Consequently, the distribution of the threshold voltages Vth before writing (data "0") changes to the distribution of the threshold voltages Vth after writing (data "1").

As shown in FIG. 4A, the third potential different from the second potential (here, V(1,3)) of the plurality of write data potentials (from V(0,1) to V(i,j)) generated in the potential generating circuit 103 is used as the write data potential and is written to the memory cells in the third range where the threshold voltage Vth of the memory cell 102 is higher than the second range by the arbitrary potential. Consequently, the distribution of the threshold voltages Vth before writing (data "0") changes to the distribution of the threshold voltages Vth after writing (data "1").

As shown in FIG. 4A, the fourth potential different from the third potential (here, V(1,4)) of the plurality of write data potentials (from V(0,1) to V(i,j)) generated in the potential generating circuit 103 is used as the write data potential and is written to the memory cells in the fourth range where the threshold voltage Vth of the memory cell 102 is higher than the third range by the arbitrary potential. Consequently, the distribution of the threshold voltages Vth before writing (data "0") changes to the distribution of the threshold voltages Vth after writing (data "1").

As shown in FIG. 4A, the fifth potential different from the fourth potential (here, V(1,5)) of the plurality of write data potentials (from V(0,1) to V(i,j)) generated in the potential generating circuit 103 is used as the write data potential and is written to the memory cells in the fifth range where the threshold voltage Vth of the memory cell 102 is higher than the fourth range by the arbitrary potential. Consequently, the distribution of the threshold voltages Vth before writing (data "0") changes to the distribution of the threshold voltages Vth after writing (data "1").

As shown in FIG. 4A, the sixth potential different from the fifth potential (here, V(1,5)) of the plurality of write data potentials (from V(0,1) to V(i,j)) generated in the potential generating circuit 103 is used as the write data potential and is written to the memory cells in the sixth range where the threshold voltage Vth of the memory cell 102 is higher than the fifth range by the arbitrary potential. Consequently, the distribution of the threshold voltages Vth before writing (data "0") changes to the distribution of the threshold voltages Vth after writing (data "1").

In such a manner, among the plurality of write data potentials for writing data "1" (from V(0,1) to V(i,j)) generated in the potential generating circuit 103, the potential at which the threshold voltage Vth of the memory cell after writing can be within a defined range is selected depending on the level of the threshold voltage Vth of the memory cell, so that the distribution width of the threshold voltages Vth after writing (data "1") can be small.

An example in which the memory cell 102 has two-level data "0" or "1" is described above; however, the above structure can also be applied in the case where the memory cell 102 has data of three or more levels (multi-level data). Since variation (distribution width) in the threshold voltages Vth after writing can be made smaller than variation (distribution width) in the threshold voltages Vth before writing, the above structure is advantageous also in the case of a multi-leveled memory cell. As shown in FIG. 4B, for example, a variation (distribution width) in the threshold voltages Vth after writing (data "1", "2", and "3") can be made smaller than variation (distribution width) in the threshold voltages Vth before writing (data "0"). Consequently, the storage capacity can be increased without increasing the operation voltage and the area of a memory cell.

Variation (distribution width) in the threshold voltages Vth after writing can be suppressed to around a potential width between adjacent potentials of plurality of potentials for writing of the same data. The plurality of potentials for writing of the same data is generated at short intervals, so that a variation (distribution width) in the threshold voltage Vth of the memory cells after writing can be reduced.

As shown in FIG. 4A, in the case where there is variation (distribution width) in the threshold voltage of the plurality of memory cells 102, the potential determined as the write data potential might differ between a memory cell with the minimum threshold voltage (Vth_min) and a memory cell with the maximum threshold voltage (Vth_max) even when the same data is written.

For example, a potential determined as the write data potential for writing data "1" into the memory cell 102 with the minimum threshold voltage (Vth_min) is the potential V(1,1) as shown in FIG. 4A, whereas a potential determined as the write data potential for writing data "1" into the memory cell 102 with the maximum threshold voltage (Vth_max) is the potential V(1,6) as shown in FIG. 4A.

In the semiconductor device according to this embodiment, even when the threshold voltage of a transistor included in the memory cell 102 varies, a variation (distribution width) in the threshold voltage of the plurality of memory cells 102 after writing can be reduced, whereby the operation voltage of the semiconductor device can be reduced. A memory can be multi-leveled without increasing the operation voltage and the area of a memory cell, so that the storage capacity per unit area of the semiconductor device can be increased. A semiconductor device in which operation such as writing, holding, or reading can be surely performed can be provided.

The methods and structures described in this embodiment can be combined as appropriate with any of the methods and structures described in the other embodiments.

Embodiment 2

In this embodiment, a circuit configuration and operation of a semiconductor device according to one embodiment of the disclosed invention are described with reference to FIG. 5 to FIG. 12.

<Description of Driver Circuit>

Figure 5:
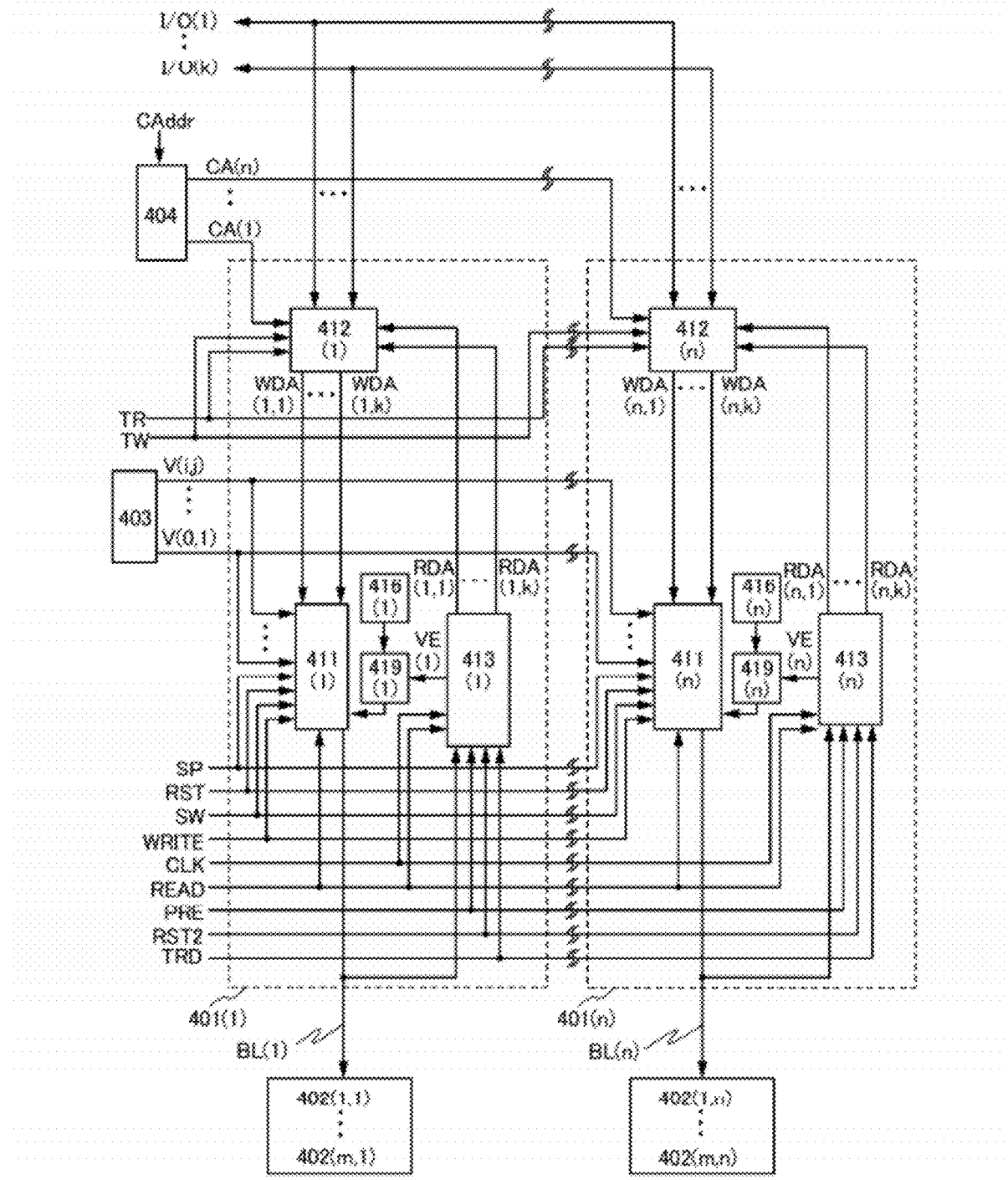
FIG. 5 is a circuit diagram of a semiconductor device.

FIG. 5 is a block diagram of a semiconductor device.

A driver circuit 401 includes a data buffer 412, a writing circuit 411, a reading circuit 413, a control signal generating circuit 416, and a switching element 419 and has a function of writing, reading, and verifying data. The driver circuit 401 is provided for each column.

A potential generating circuit 403 is electrically connected to i×j (i is an integer of 2 or more, and j is an integer of 2 or more) write data potential supply lines (corresponding to the first signal lines 121 in FIG. 1). Each of the write-data-potential supply lines is electrically connected to writing circuits 411(1) to 411(n) in the driver circuit 401 and supplies a plurality of write data potentials to the writing circuits 411(1) to 411(n). Note that i represents the number of data (values)

that can be stored in the memory cell 102, and j represents a kind of potential that can be written to one piece of data. Note also that n is an integer of 1 or more, which represents the number of columns.

The number of the memory cells 402 is m (rows)×n (columns), and the memory cells 402 are electrically connected to the driver circuits 401(1) to 401(n) through respective bit lines BL(1) to BL(n) (each corresponding to the second signal line 122 in FIG. 1) in respective rows. The memory cells 402 store potentials supplied to the bit lines BL(1) to BL(n) in writing, and output stored data to the bit lines BL(1) to BL(n) in reading. Note that FIG. 5 illustrates an example in which the bit lines BL(1) to BL(n) serve as both write signal lines and read signal lines; however, the write signal lines and the read signal lines may be separately provided. Note also that m is an integer of 1 or more, which represents the number of rows.

Data buffers 412(1) to 412(n) are electrically connected to the writing circuits 411(1) to 411(n) and reading circuits 413(1) to 413(n). Further, the data buffers 412(1) to 412(n) are electrically connected to data input/output lines I/O(1) to I/O(k) (k is an integer of 2 or more), address selection signal lines CA(1) to CA(n), a write data transfer signal line TW, and a read data transfer signal line TR. As for the data buffers 412(1) to 412(n), the data buffer 412 which is selected by the address selection signal lines CA(1) to CA(n) is electrically connected to the data input/output lines I/O(1) to I/O(k) when writing is performed; thus, data input through the data input/output lines I/O(1) to I/O(k) is held in any of the data buffers 412(1) to 412(n). Then, when a write data transfer signal is input through the write data transfer signal line TW, the data stored in the data buffers 412(1) to 412(n) is output to the writing circuits 411(1) to 411(n). When a read data transfer signal is input through the read data transfer signal line TR in reading, data output from the reading circuits 413(1) to 413(n) is stored in the data buffers 412(1) to 412(n). Then, any of the data buffers 412(1) to 412(n), which is selected by the address selection signal lines CA(1) to CA(n), is electrically connected to the data input/output lines I/O(1) to I/O(k), and the data stored in the data buffers 412(1) to 412(n) is output to the data input/output lines I/O(1) to I/O(k). Note that k is an integer of 1 or more which represents the amount of information of write data; k can be 2 in the case where four levels of data can be stored in one memory cell, and k can be 3 in the case where eight levels of data can be stored in one memory cell.

The writing circuits 411(1) to 411(n) are electrically connected to the potential generating circuit 403 through the write-data-potential supply lines. Further, the writing circuits 411(1) to 411(n) are electrically connected to the data buffers 412(1) to 412(n), the reading circuits 413(1) to 413(n), and the memory cells 402(1,1) to 402(m,n). A signal line SP, a signal line RST, a signal line SW, a signal line CLK, a write signal line WRITE, and a read signal line READ are electrically connected to the writing circuits 411(1) to 411(n). The writing circuits 411(1) to 411(n) have a function of selecting one write-data-potential supply line based on signals VE(1) to VE(n) input from the reading circuit 413 and electrically connecting the bit lines BL(1) to BL(n).

The reading circuits 413(1) to 413(n) are electrically connected to the data buffers 412(1) to 412(n), the memory cells 402(1,1) to 402(m,n), and the writing circuits 411(1) to 411(n), respectively. Further, the reading circuits 413(1) to 413(n) are electrically connected to a signal line PRE, a signal line TRD, a signal line PULSE, a signal line RST2, and a read signal line READ. The reading circuits 413(1) to 413(n) read data from any one row of the memory cells 402(1,1) to 402(m,n) when a read signal is input through the read signal line READ. In addition, when a pulse is input to the signal line TRD, the reading circuits 413(1) to 413(n) output the read data to the data buffers 412(1) to 412(n), and when verifying operation is performed, the reading circuits 413(1) to 413(n) output the read data to the switching elements 419(1) to 419(n).

The control signal generating circuits 416(1) to 416(n) are electrically connected to the switching elements 419(1) to 419(n) and have a function of generating a control signal having a constant cycle. The control signal generating circuits 416(1) to 416(n) further have a function of generating the control signal in synchronization with the change in the potential of word lines WL(1) to WL(m) (see FIG. 11) of the plurality of memory cells 102.

The switching elements 419(1) to 419(n) are electrically connected to the control signal generating circuits 416(1) to 416(n), the writing circuits 411(1) to 411(n), and the reading circuits 413(1) to 413(n). The switching elements 419(1) to 419(n) have a function of outputting the control signal input from the control signal generating circuits 416(1) to 416(n) to the writing circuits 411(1) to 411(n) or stopping the output of the control signal according to signal from the reading circuits 413(1) to 413(n).

A decoder 404 is electrically connected to an address signal line CAddr and the data buffers 412(1) to 412(n) in the driver circuits 401 and selects the driver circuit 401 in which writing and reading of data are to be performed, in accordance with an address signal CAddr.

Specific circuit configurations and operation of the data buffer 412, the potential generating circuit 403, the writing circuit 411, the memory cell 402, and the reading circuit 413 are described below. Note that specific description of structures and operation of the control signal generating circuit 416 and the switching element 419 are omitted here and known techniques may be employed thereto.

<Description of Data Buffer>

Figure 6:
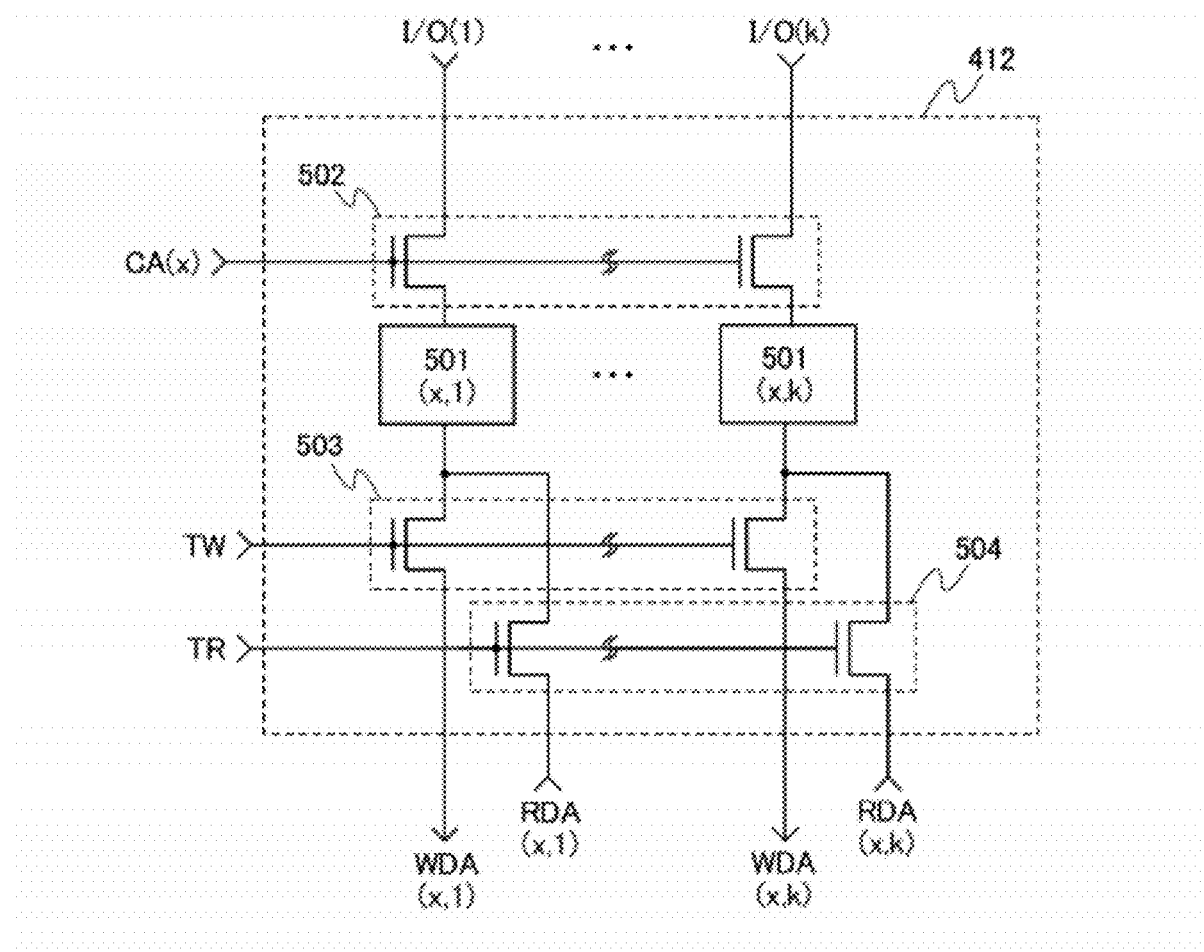
FIG. 6 is a circuit diagram of a data buffer included in a semiconductor device.

FIG. 6 shows an example of a circuit configuration of the data buffer 412 of FIG. 5. Data input/output lines I/O(1) to I/O(k) are electrically connected to respective drain electrodes of transistors 502. Address selection signal line CA(x) (x is an integer of 1 or more) is electrically connected to a gate electrode of the transistor 502. Source electrodes of the transistors 502 are electrically connected to respective one terminals of latch circuits 501(x,1) to 501(x,k). The other terminals of the latch circuits 501(x,1) to 501(x,k) are electrically connected to respective drain electrodes of transistors 503 and transistors 504. Each gate electrode of the transistors 503 is electrically connected to the write data transfer signal line TW. Source electrodes of the transistors 503 are electrically connected to respective signal lines WDA(x,1) to WDA(x,k). Each gate electrode of the transistors 504 is electrically connected to the read data transfer signal line TR. Source electrodes of the transistors 504 are electrically connected to respective signal lines RDA(x,1) to RDA(x,k).

Input operation of write data to the data buffer 412 is described. First, given write data is sequentially transmitted through the data input/output lines I/O(1) to I/O(k). In synchronization with the timing of transmitting the data, a high potential VH (e.g., 5 V) is supplied to the address selection signal line CA(x) to turn on the transistors 502, so that data of the data input/output lines I/O(1) to I/O(k) is stored in the latch circuits 501(x,1) to 501(x,k). Then, a low potential VL (e.g., 0 V) is supplied to the address selection signal line CA(x) to which the high potential VH is supplied and the transistors 502 are turned off. Data is stored by the above-described procedure in all the latch circuits 501 in first to n-th columns or data is stored by the above-described procedure in the latch circuits 501 in columns on which writing needs to be performed. Then, the high potential VH is supplied to the write data transfer signal line TW to turn on the transistors 503, so that the given data stored in the latch circuits 501(1,1) to 501(*n,k*) is transmitted to signal lines WDA(1,1) to WDA (n,k).

Operation of outputting read data to the data buffer 412 is described. When data is read, the read data is input from the signal lines RDA(x,1) to RDA(x,k). At this time, the signal line TW has the low potential VL and the signal line TR is increased from a low potential VL to a high potential VH. Thus, the signal lines RDA(x,1) to RDA(x,k) are electrically connected to latch circuits 501(1,1) to 501(*x,k*), respectively, so that the read data is stored in the latch circuits 501(*x*,1) to 501(*x,k*). Then, the signal line TR is decreased from the high potential VH to the low potential VL. After the data for one row are stored in the latch circuits 501(*x*,1) to 501(*x,k*), the high potential VH is applied to the address selection signal line CA(x), so that the transistor 502 is turned on, whereby the latch circuits 501(*x*,1) to 501(*x,k*) are electrically connected to data input/output lines I/O(1) to I/O(k), respectively, and thus the data stored in the latch circuits 501(*x*,1) to 501(*x,k*) are sequentially output to the data input/output lines I/O(1) to I/O(k), respectively.

The data buffer 412 can be formed using a known circuit instead of the circuit in FIG. 6; thus, the circuit of the data buffer 412 is not limited to the circuit in FIG. 6.

<Description of Potential Generating Circuit>

Figure 7:
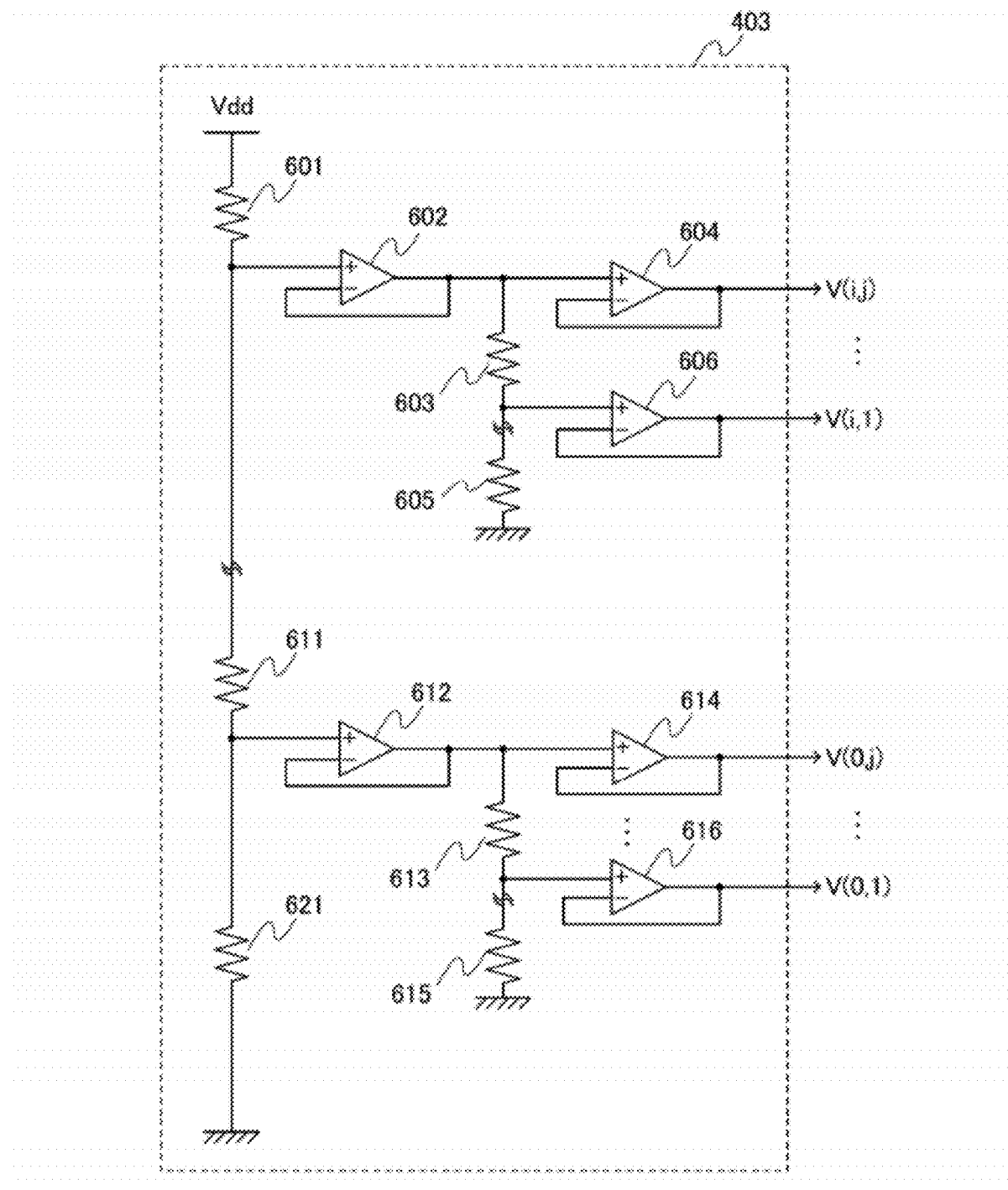
FIG. 7 is a circuit diagram of a potential generating circuit included in a semiconductor device.

FIG. 7 shows an example of the potential generating circuit in FIG. 5. The potential generating circuit 403 has a function of generating a potential supplied to the bit line BL(n) of the memory cell 402.

First, a configuration of the potential generating circuit 403 is described with reference to FIG. 7. The potential generating circuit 403 has the following configuration. A power supply potential Vdd (e.g., 5 V) is electrically connected to one terminal of a resistor 601. The other terminal of the resistor 601 is electrically connected to one terminal of a resistor 611. The other terminal of the resistor 611 is electrically connected to one terminal of a resistor 621. The other terminal of the resistor 621 is grounded (or supplied with the low potential). An input terminal of a voltage follower 602 is electrically connected between the resistor 601 and the resistor 611 and an input terminal of a voltage follower 612 is electrically connected between the resistor 611 and the resistor 621. A resistor 603 and a resistor 605 are electrically connected to each other between an output terminal of the voltage follower 602 and the ground potential (or a low potential). A resistor 613 and a resistor 615 are electrically connected to each other between an output terminal of the voltage follower 612 and the ground potential (or the low potential). A voltage follower 604 and a voltage follower 606 are electrically connected between the output terminal of the voltage follower 602 and the resistors 603 and 605. A voltage follower 614 and a voltage follower 616 are electrically connected between the output terminal of the voltage follower 612 and the resistors 613 and 615.

Next, operation of the potential generating circuit 403 is described. When the power supply potential Vdd is supplied, a potential which is dropped by an amount corresponding to the ratio of the resistance of the resistor electrically connected between the power supply potential Vdd and the voltage follower 602 or the voltage follower 612 with respect to the sum of the resistance of the resistor 601, the resistor 611, and the resistor 621 is input to the input terminals of the voltage follower 602 and the voltage follower 612. Thus, output potentials of the voltage followers 602 and 612 become the same potentials as input potentials of the voltage followers 602 and 612. The output potentials of the voltage followers 602 and 612 are input to the voltage followers 604 and 614, respectively. Output potentials of the voltage followers 604 and 614 are input to the write-data-potential supply lines as V(0,j) and V(i,j), respectively, which are equal to the input potentials of the voltage followers 604 and 614. Meanwhile, the resistor 603 and the resistor 605 are electrically connected in series between the output terminal of the voltage follower 602 and the ground potential (or the low potential), and the resistor 613 and the resistor 615 are electrically connected in series between the output terminal of the voltage follower 612 and the ground potential (or the low potential). In addition, an input terminal of the voltage follower 606 is electrically connected between the resistor 603 and the resistor 605. Thus, a potential which is dropped by an amount corresponding to the ratio of the resistance of the resistor electrically connected between the output terminal of the voltage follower 602 and the voltage follower 606 with respect to the sum of the resistance of the resistor 603 and the resistor 605 is input to the voltage follower 606. Thus, a potential equal to the input potential of the voltage follower 606 is output as V(1,1) from the output terminal of the voltage follower 606 to the write-data-potential supply line. In a similar manner, a potential equal to an input potential of the voltage follower 616 is output as V(0,1) from the output terminal of the voltage follower 616 to the write-data-potential supply line.

Figure 8:
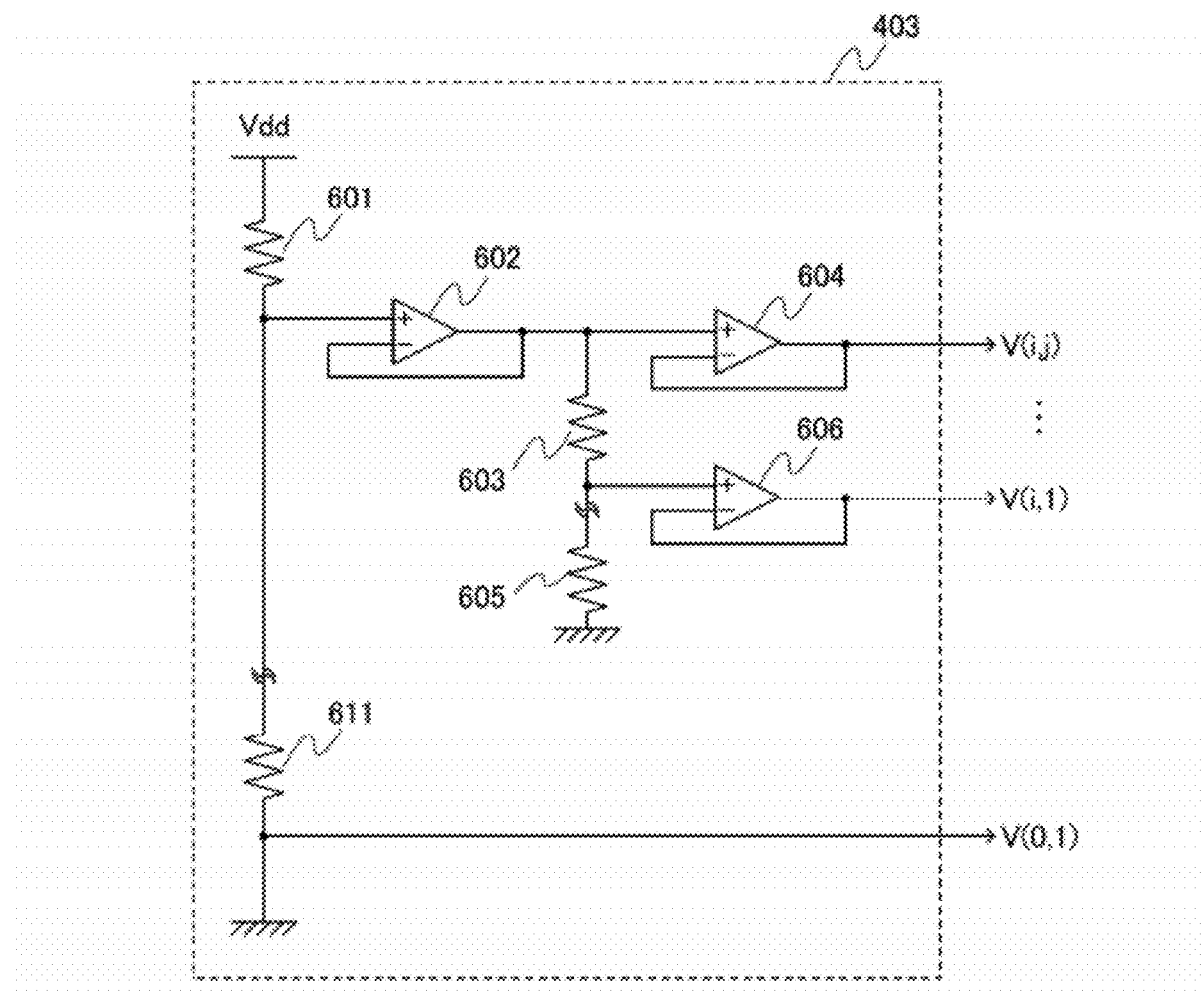
FIG. 8 is a circuit diagram of a potential generating circuit included in a semiconductor device.

Note that although j write-data-potential supply lines of V(0,1) to V(0,j) are used to write data "0" (the potential written to the memory cell 102 is 0 V) in FIG. 7, the number of write-data-potential supply lines to write data "0" can be one as shown in FIG. 8. Accordingly, the number of write-data-potential supply lines is reduced, and thus the area occupied by the memory cell 102 can be increased owing to a reduction in the number of wirings. By using one write-data-potential supply line only when data "i" is written (when the maximum potential is written into the memory cell 102), an effect similar to that described above can be obtained. Furthermore, by using one write-data-potential supply line when data "0" and data "i" are written, the number of write-data-potential supply lines connected to the potential generating circuit 103 can be (i−2)×j+2; accordingly, the area occupied by the memory cell 102 can be further increased owing to a reduction in the number of wirings.

The potential generating circuit 103 is not limited to the circuits in FIG. 7 and FIG. 8 and can be formed using known circuits; thus, the circuit of the potential generating circuit 103 is not limited to the circuits in FIG. 7 and FIG. 8.

<Description of Writing Circuit>

Figure 9:
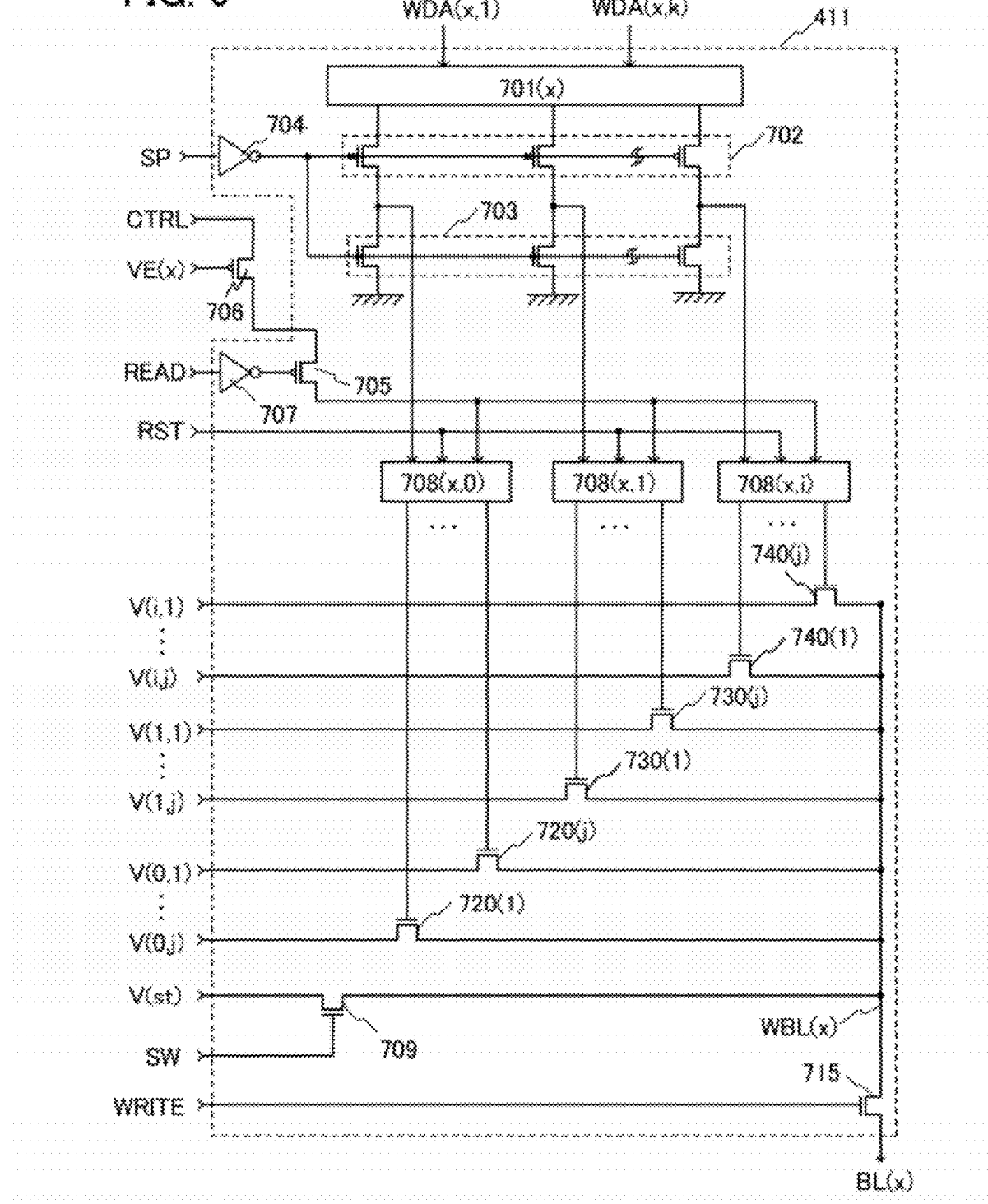
FIG. 9 is a circuit diagram of a writing circuit included in a semiconductor device.
Figure 13:
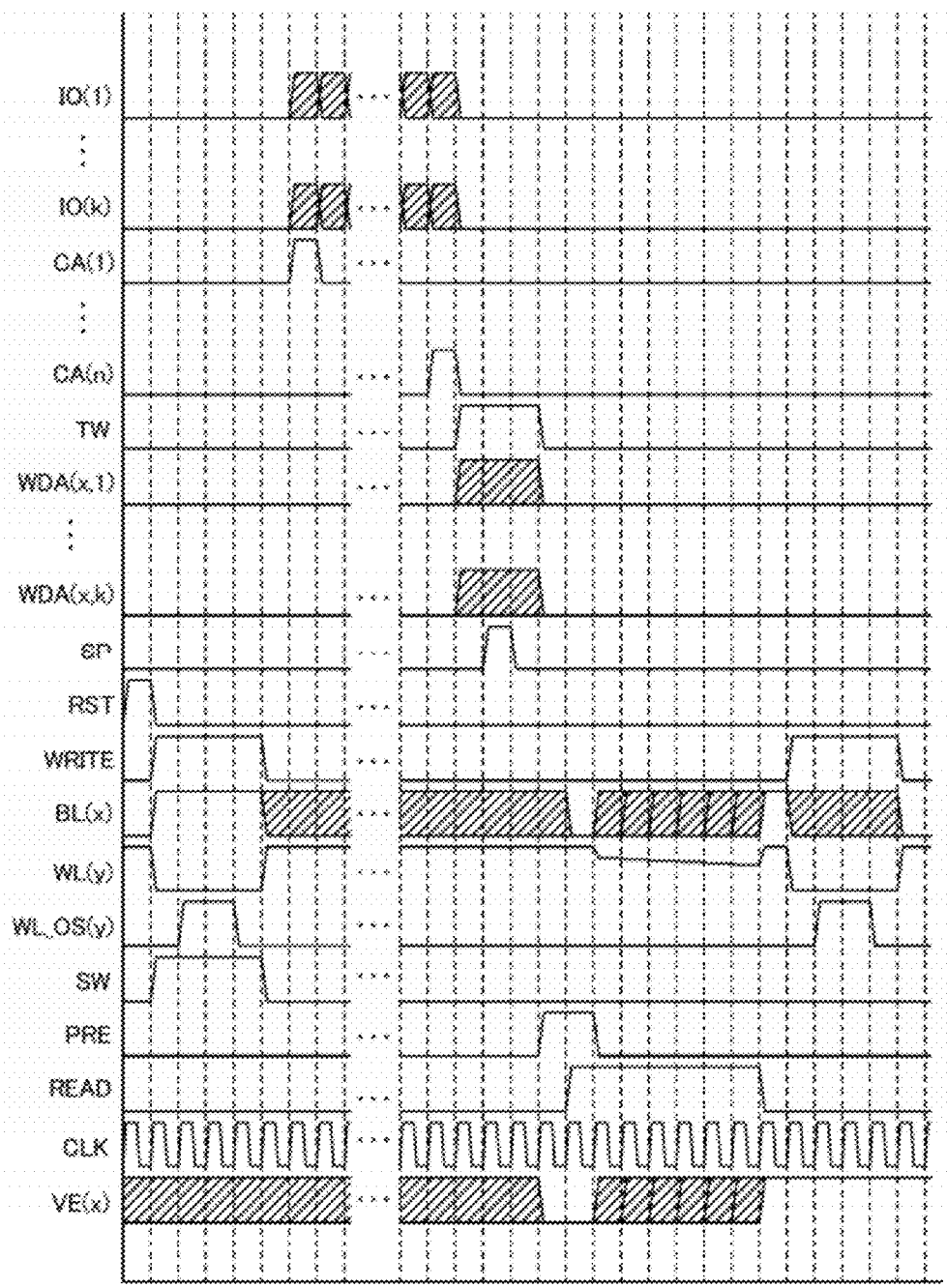
FIG. 13 is a timing chart of a writing circuit included in a semiconductor device.

FIG. 9 shows an example of the writing circuit in FIG. 5. The writing circuit 411 has a function of electrically connecting one of a plurality of write-data-potential supply lines to a bit line (BL) to supply a write data potential to the bit line (BL). FIG. 13 shows a timing chart of writing operation.

Signal lines WDA(x,1) to WDA(x,k) which are electrically connected to the data buffer 412(*x*) in FIG. 5 are electrically connected to input terminals of the decoder 701(*x*), each output terminal of the decoder 701(*x*) is electrically connected to respective source electrodes of transistors 702. Each gate electrode of the transistor 702 and a transistor 703 is electrically connected to an output terminal of an inverter 704. Each source electrode of the transistor 703 is grounded. The input terminal of the inverter 704 is electrically connected to the signal line SP. Each drain electrode of the transistors 702 and 703 is electrically connected to any of shift registers 708(*x*,0) to 708(*x,i*). The signal line RST is electrically connected to the shift registers 708(x,0) to 708(x,i). A source electrode of a transistor 706 which is the switching element 419 is electrically connected to the control signal generating circuit (denoted by CTRL in FIG. 9). A gate electrode of the transistor 706 is electrically connected to a signal line VE(x). A drain electrode of the transistor 706 is electrically connected to a source electrode of a transistor 705. A gate electrode of the transistor 705 is electrically connected to an output terminal of an inverter 707. An input terminal of the inverter 707 is electrically connected to the signal line READ. A drain electrode of the transistor 705 is electrically connected to input terminals of the shift registers 708(x,0) to 708(x,i). Output terminals of the shift register 708(x,0) are electrically connected to respective gate electrodes of the transistors 720(1) to 720(j). Output terminals of the shift register 708(x,1) are electrically connected to respective gate electrodes of the transistors 730(1) to 730(j). Output terminals of the shift register 708(x,i) are electrically connected to respective gate electrodes of the transistors 730(1) to 730(j). A drain electrode of a transistor 709 is electrically connected to the reference potential supply line V(st). A gate electrode of the transistor 709 is electrically connected to the signal line SW. Drain electrodes of the transistors 720(1) to 720(j), the transistors 730(1) to 730(j), and the transistors 740(1) to 740(j) are electrically connected to respective write-date-potential supply lines. Source electrodes of the transistors 720(1) to 720(j), the transistors 730(1) to 730(j), and the transistors 740(1) to 740(j) are electrically connected to a drain electrode of a transistor 715. A gate electrode of the transistor 715 is electrically connected to the write signal line WRITE. A source electrode of the transistor 715 is electrically connected to the bit line BL(x).

Figure 10:
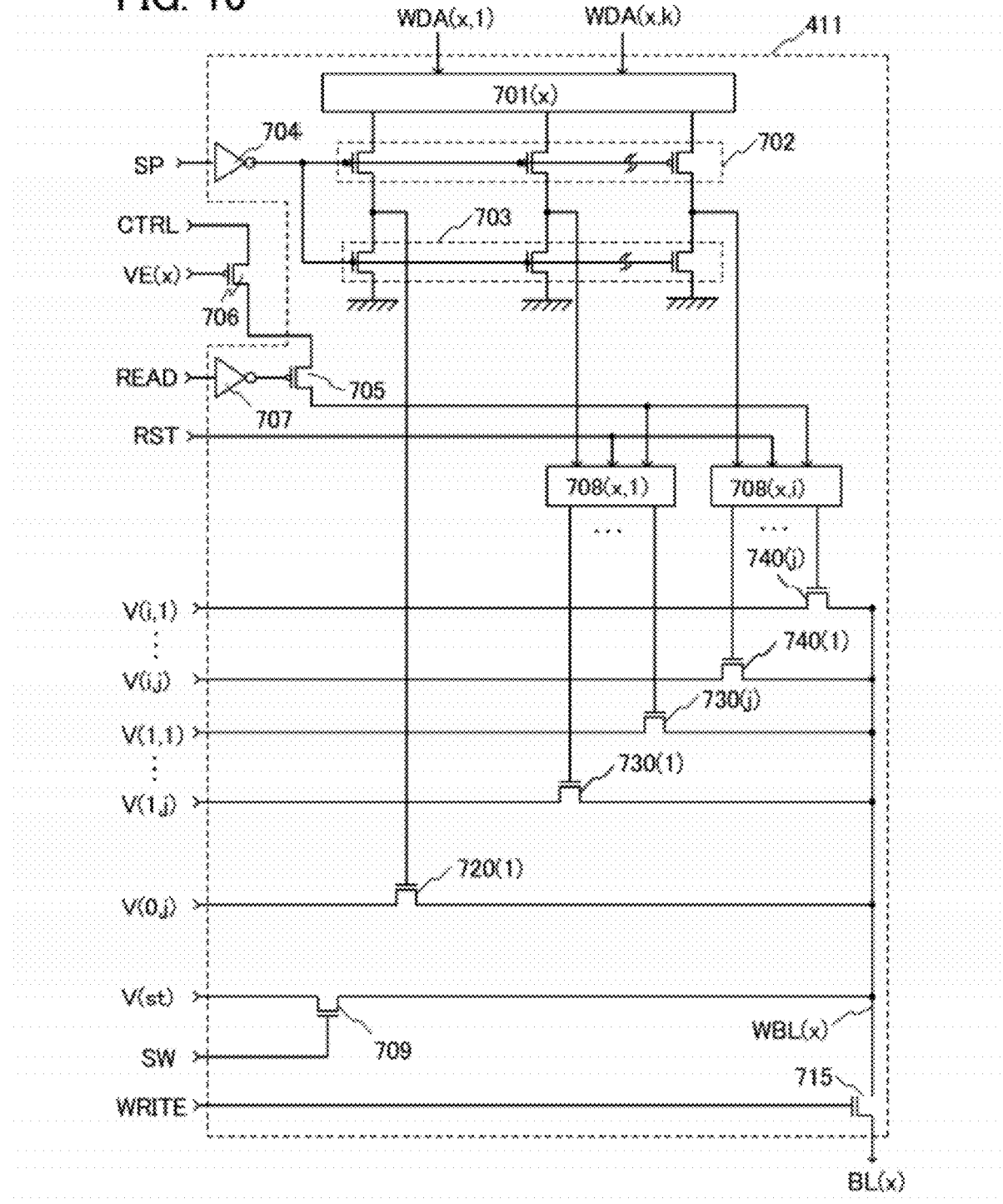
FIG. 10 is a circuit diagram of a writing circuit included in a semiconductor device.

Note that in the case where only one kind of potential is needed for each data, a structure illustrated in FIG. 10 may be employed: one write-data-potential line and one switching element (720(1)) are used for data which needs only one kind of potential (here, data "0"), and the shift register 708 (x,0) is not used.

Next, operation of the writing circuit 411 is described with reference to FIG. 9. First, the low potential VL is applied to the signal line SP, so that the transistors 702 are in the off state and the transistors 703 are in the on state, whereby the ground potential is input to start pulses of the shift registers 708(x,0) to 708(x,i). The low potential VL (e.g., 0 V) is output to output terminals of the shift registers 708, whereby the transistors 720(1) to 740(j) are in the off state. Then, the high potential VH is applied to the signal line RST, so that the shift registers 708(x,0) to 708(x,i) go into a reset state, whereby the signal line RST has the low potential VL. Then, the signal line SW has the high potential VH, whereby a transistor 709 is turned on and thus, the potential of the signal line WBL(x) becomes equal to the reference potential V(st). Further, the high potential VH is applied to the signal line WRITE, so that the transistor 715 is turned on and the potential of the bit line BL(x) which is the second signal line 122 also becomes V(st); thus, writing operation into the memory cell is performed.

When the reference potential V(st) is written to the memory cell, the high potential VH is applied to the write data transfer signal line TW (see FIG. 5), so that the write data stored in the data buffers 412(1) to 412(n) (see FIG. 5) is input to the writing circuits 411(1) to 411(n) through the signal line WDA(1,1) to WDA(n,k). The write data input to the writing circuits 411(1) to 411(n) are input to the decoder 701(x). Among the output terminals of the decoder 701(x), only the output terminal corresponding to the write data outputs a high potential, so that the high potential is applied to any of the source electrode of the transistor 702.

After the write data is output from the decoder 701(x), the high potential VH is applied to the signal line SP and thus the transistors 703 are turned off and the transistors 702 are turned on, so that output results of the decoder 701(x) are input to the shift registers 708(x,0) to 708(x,i). Note that the high potential VH is input to any of the shift registers 708(x,0) to 708(x,i) and the low potential VL is input to the other shift registers. After the output results of the decoder 701(x) are input to the shift registers 708(x,0) to 708(x,i), only the shift register 708 to which the high potential VH is input starts operating. When the shift register 708 starts operating, the high potential VH is applied to the signal line with the lowest output and the low potential VL is applied to the other signal lines. When the high potential VH is applied to the signal line with the lowest output of the shift register 708 in operation, the high potential is also applied to a gate electrode of one of the plurality of transistors electrically connected to the output terminals of the shift register 708. The high potential VH is applied to the gate electrode of any of the transistors 720(1) to 740(j), whereby the signal line WBL is electrically connected to any of the write-data-potential supply line, and the signal line WBL is supplied with any of the data potentials V(0,1) to V(i,j) which is equal to the write data.

After the write data potential is supplied to the signal line WBL(x), the low potential VL is applied to the signal line SP and the high potential VH is applied to the respective gate electrodes of the transistors 702 and the respective gate electrode of the transistors 703, whereby the transistors 702 are turned off and the output terminals of the decoder 701(x) and the input terminals of the shift registers 708(x,0) to 708(x,i) go out of conduction (also referred to as an off state). Meanwhile, a ground potential is input to the shift registers 708(x,0) to 708(x,i) because the transistors 703 are turned on, whereas the state of the output terminals of the shift registers 708 in operation, which is at the start of operation, is maintained.

After the write data potential is supplied to the signal line WBL(x), verifying operation is performed, and the potential compensated for the variation in the threshold value of memory cells 102 is written to the plurality of memory cells 102 in one row (see Embodiment 1 for details). Then, the operation is similarly performed in the other rows.

In this manner, the reference potential V(st) is written to the plurality of memory cells 102 before data is written from the decoder 701(x), and verifying operation is performed, so that a potential compensated for a variation in the threshold value Vth of the memory cells can be written to the memory cells. Accordingly, the variation in the threshold value Vth of the memory cells after data writing can be suppressed.

<Description of Memory Cell>

Figure 11:
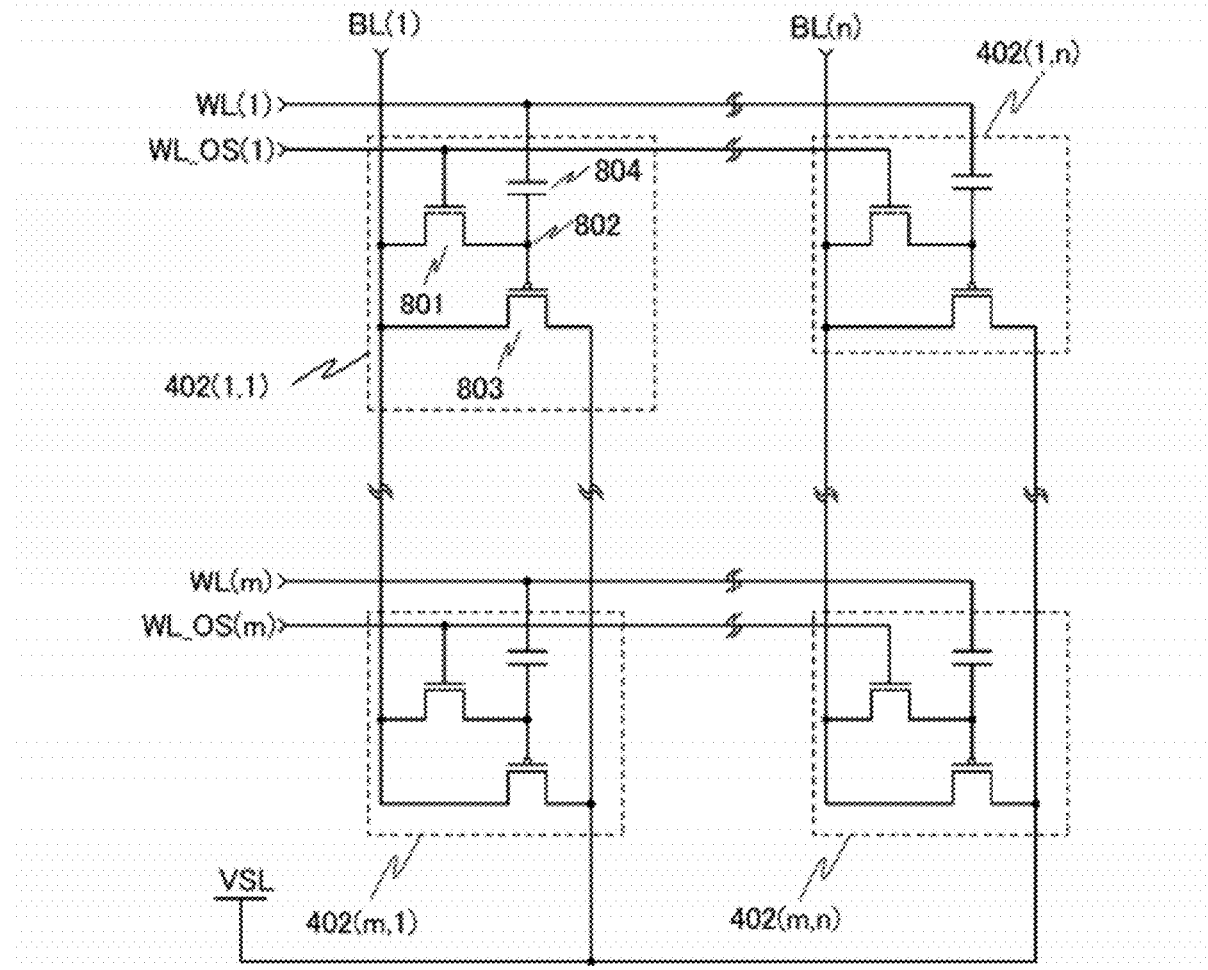
FIG. 11 is a circuit diagram of a memory cell included in a semiconductor device.
Figure 14:
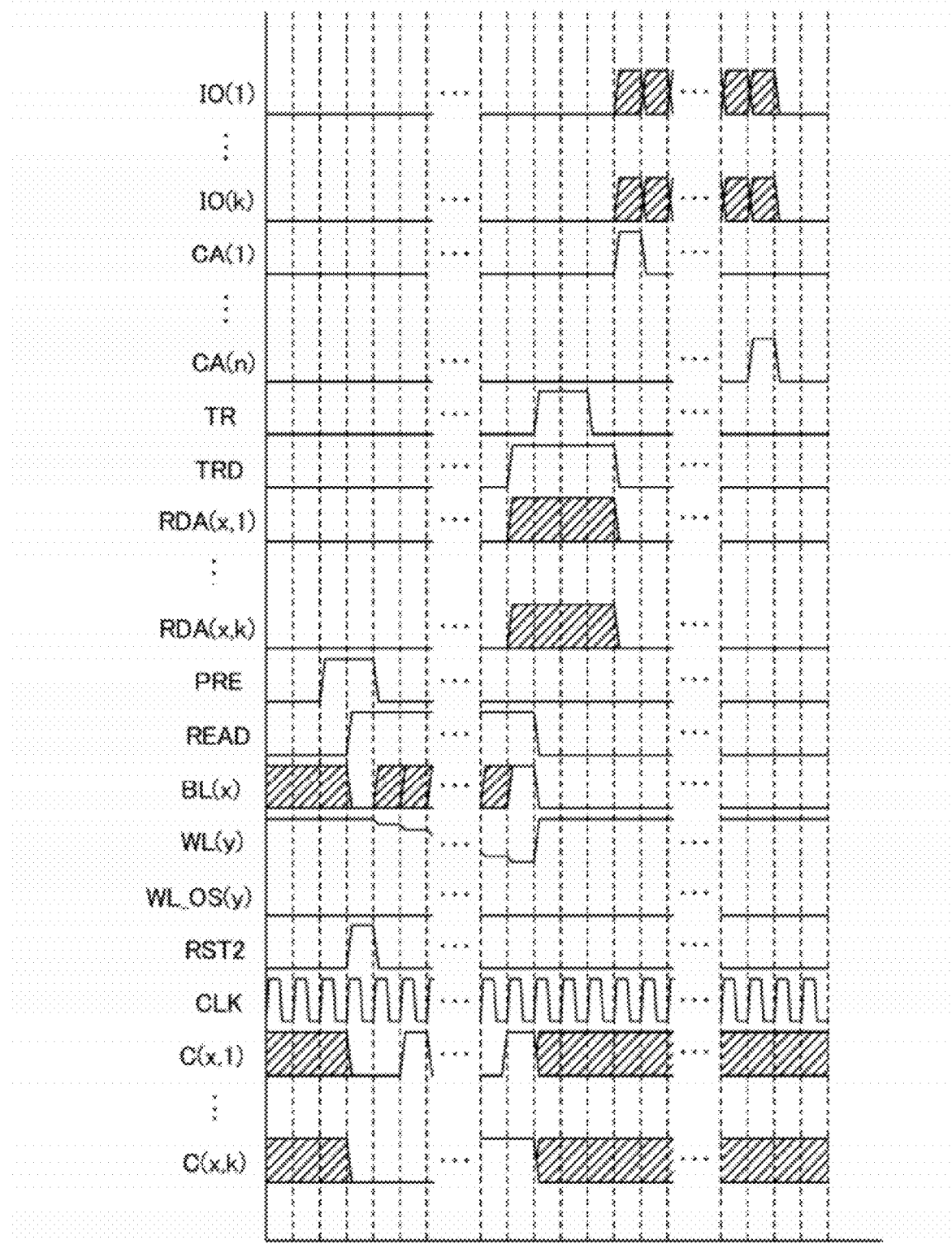
FIG. 14 is a timing chart of a reading circuit included in a semiconductor device.

FIG. 11 illustrates the memory cells 402(1,1) to 402(m,n) in FIG. 5. FIG. 13 is a timing chart of the writing operation. FIG. 14 is a timing chart of the reading operation.

First, a configuration of the memory cell 402 is described. In the memory cell 402(1,1), the bit line BL(1) is electrically connected to a drain electrode of an OS transistor 801, a gate electrode of the OS transistor 801 is electrically connected to a word line WL_OS(1), a source electrode of the OS transistor 801 and a gate electrode of a transistor 803 are electrically connected to one electrode of a capacitor 804, and the other electrode of the capacitor 804 is connected to a word line WL(1). Further, the bit line BL(1) is electrically connected to a source electrode of the transistor 803, and the transistor 803 is electrically connected to the signal line VSL.

Next, the writing operation is described. When data is written into the memory cells 402, the potential of the write signal line WRITE in FIG. 9 is raised to the high potential VH and a write data potential is supplied to the bit lines BL(1) to BL(n). The potential of one of word lines WL(1) to WL(m) of a row to which data is to be written is decreased from the high potential VH to the low potential VL at the same time as the potential of the write signal line WRITE is raised to the high potential VH. Then, the potential of one of word lines WL_OS (1) to WL_OS(m) of the row to which data is to be written is also raised to the high potential VH. For example, when the potential of the word line WL_OS(1) is raised to the high potential VH, the high potential VH is applied to the gate electrode of the OS transistor 801 and gate electrodes of all OS transistors in the first row which are electrically connected to the word line WL_OS(1), so that the OS transistors are turned on. Then, charge with a potential equal to the write data potential supplied to the bit line BL(1) is stored in a floating node 802 in the memory cell 402. Then, the word line WL_OS (1) has the low potential and all the OS transistors in the first row whose gate electrodes are electrically connected to the word line WL_OS(1) are turned off. After that, the potential supplied to the word line WL(1) is raised from the low potential VL to the high potential VH, and at the same time, the potential of the signal line WRITE is decreased from the high potential VH to the low potential VL. The OS transistor 801 has a characteristic of extremely small off-state current, which facilitates holding of charge stored in the floating node 802 and reading of stored data.

<Description of Reading Circuit>

Figure 12:
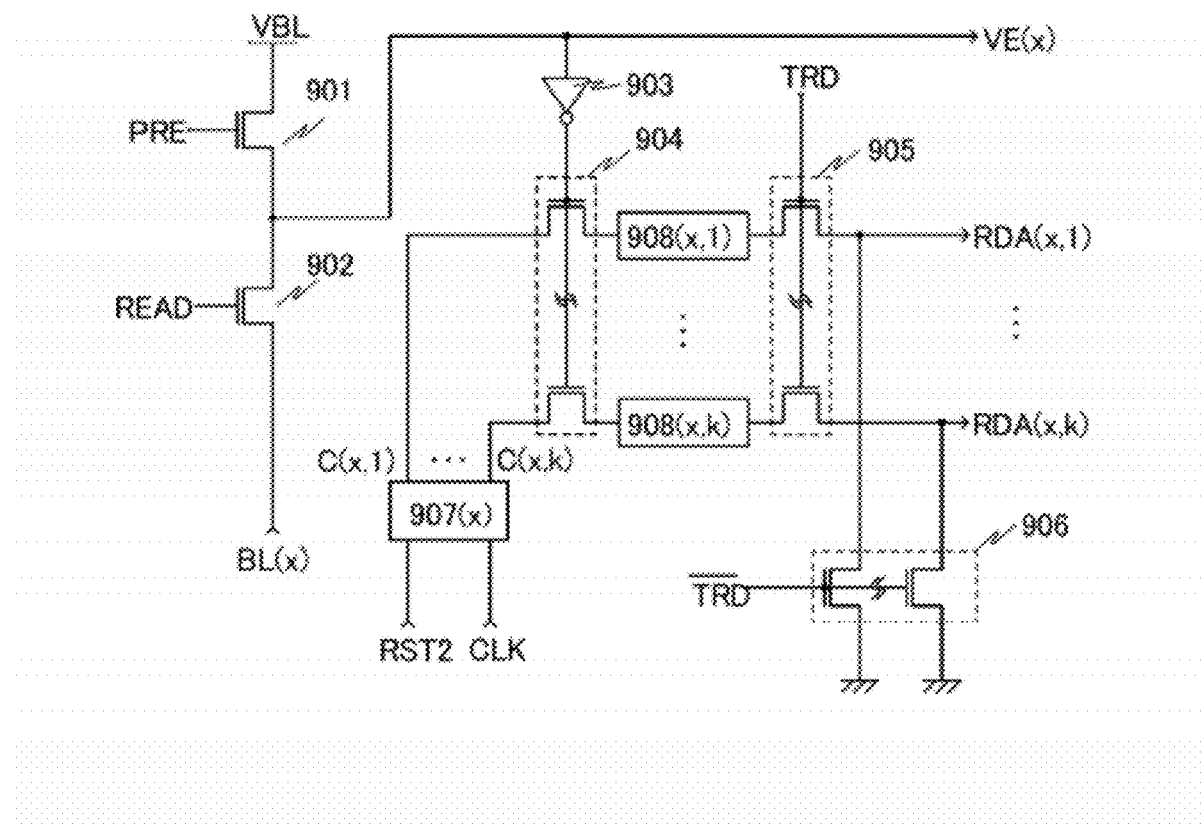
FIG. 12 is a circuit diagram of a reading circuit included in a semiconductor device.

FIG. 12 is an example of the reading circuit in FIG. 5. The reading circuit 413 has a function of reading data written to the memory cell 402. FIG. 14 is a timing chart of the reading operation.

In the reading circuit 413, a low potential VBL is applied to a source electrode of a transistor 901, a gate electrode of the transistor 901 is electrically connected to the signal line PRE, a drain electrode of the transistor 901, a source electrode of a transistor 902, and an input terminal of an inverter 903 are electrically connected to a signal line VE(x), and an output terminal of the inverter 903 is electrically connected to each gate electrode of transistors 904. A gate electrode of the transistor 902 is electrically connected to the read signal line READ, and a drain electrode of the transistor 902 is electrically connected to the bit line BL(x). Drain electrodes of the transistors 904 are electrically connected to signal lines C(x, 1) to C(x,k). The signal lines C(x,1) to C(x,k) are electrically connected to output terminals of a counter 907(x). Input terminals of the counter 907(x) are electrically connected to the signal line CLK and the signal line RST2. Source electrode of the transistors 904 are electrically connected to input terminals of respective latch circuits 908(x,1) to 908(x,k). Output terminals of the latch circuits 908(x,1) to 908(x,k) are electrically connected to drain electrodes of respective transistors 905. Gate electrodes of the transistors 905 are electrically connected to the signal line TRD. Pairs of source electrodes of the transistors 905 and drain electrodes of transistors 906 are electrically connected to respective signal lines RDA(x,1) to RDA(x,k). Each gate electrode of the transistor 906 is electrically connected to a signal line for outputting an inverted signal of the signal line TRD (in FIG. 12, represented by drawing a line over "TRD"). Each source electrode of the transistor 906 is grounded (or supplied with a low potential).

Next, operation of the reading circuit 413 is described with reference to FIG. 14. When reading or verifying operation is performed, the potential of the signal line PRE becomes the high potential VH, so that the transistor 901 is turned on. Then, the potential of the signal line READ becomes the high potential VH, so that the transistor 902 is turned on. Then, the potential of the bit line BL(x) becomes equal to the low potential VBL. At this time, the high potential VH is applied to the gate electrodes of the transistors 904, so that the transistors 904 are turned on. At the same time as the potential of the read signal line READ becomes the high potential VH, a pulse is applied to the signal line RST2, so that the counter 907(x) is brought into a reset state, and the low potential VL is output to the signal lines C(x,1) to C(x,k). At the same time as the potential of the signal line RST2 becomes the low potential VL, the potential of the signal line PRE also becomes the low potential, so that the potential of the bit line BL(x) becomes the low potential and is put into a floating state.

After the bit line BL(x) is brought into a floating state, the potential of the word line WL(y) (y is an integer greater than or equal to 1 and less than or equal to m) of the memory cell is decreased by stages. When the potential of the word line WL(y) is decreased, the transistor 803 is turned on according to the data written in the floating node 802, so that the potential of the bit line BL(x) becomes equal to the high potential VH.

The counter 907(x) increases the value of the output signals C(x,1) to C(x,k) every time the signal CLK rises. Note that the potential of the word line WL(y) is gradually decreased in synchronization with rising of the signal line CLK shown in FIG. 14. The latch circuits 908(1) to 908(k) store potentials equal to the output signals C(x,1) to C(x,k), respectively, as long as the transistors 904 are on. When data is read from the memory cell and the potential of the bit line BL(x) becomes the high potential VH, the low potential VL is applied to the gate electrodes of the transistors 904, so that the transistors 904 are turned off. Thus, the latch circuits 908(1) to 908(k) hold data of the signal lines C(x,1) to C(x,k), respectively, in the state before the transistors 904 are turned off. The data stored in the latch circuits 908(1) to 908(k) are determined to be read data.

When the potential of the word line WL(y) is decreased gradually to reach the low potential VL, one of data "0" to "i" of the memory cells is read and the read data is stored in the latch circuits 908(1) to 908(k) in FIG. 9. Then, the potential of the signal line TRD becomes the high potential VH, so that the transistors 905 are turned on and the transistors 906 are turned off. Then, potentials equal to those of the latch circuits 908(1) to 908(k) are output to the signal lines RDA(x,1) to RDA(x,k). Note that while the potential of the signal line TRD is kept at the low potential, the transistors 905 are off and the transistors 906 are on, and a ground potential (or the low potential) is output to the signal lines RDA(x,1) to RDA(x,k). After the read data is output to the signal lines RDA(x,1) to RDA(x,k), the potential of the signal line TRD becomes the low potential VL, and the ground potential (or the low potential) is output to the signal lines RDA(x,1) to RDA(x,k).

The structures, methods, and the like described in this embodiment can be combined as appropriate with any of the structures, methods, and the like described in the other embodiments.

Embodiment 3

In this embodiment, a circuit configuration and operation of a memory cell included in a semiconductor device according to one embodiment of the disclosed invention are described with reference to FIGS. 15A1, 15A2, and 15B.

<Basic Configuration of Memory Cell>

In a memory cell illustrated in FIG. 15A1, a first wiring (a 1st Line) and a source electrode (or a drain electrode) of a transistor 1600 are electrically connected to each other, and a second wiring (a 2nd Line) and the drain electrode (or the source electrode) of the transistor 1600 are electrically connected to each other. In addition, a third wiring (a 3rd Line) and a source electrode (or a drain electrode) of a transistor 1602 are electrically connected to each other, and a fourth wiring (a 4th Line) and a gate electrode of the transistor 1602 are electrically connected to each other. In addition, a gate electrode of the transistor 1600 and the drain electrode (or the source electrode) of the transistor 1602 are electrically connected to one electrode of a capacitor 1604, and a fifth wiring (a 5th Line) and the other electrode of the capacitor 1604 are electrically connected to each other.

Here, for example, a transistor including an oxide semiconductor is used as the transistor 1602. A transistor including an oxide semiconductor has a characteristic of extremely small off-state current. Therefore, when the transistor 1602 is turned off, a potential of the gate electrode of the transistor 1600 can be held for an extremely long time. Provision of the capacitor 1604 facilitates holding of charge given to the gate electrode of the transistor 1600 and reading of stored data.

A transistor including a material other than an oxide semiconductor is used as the transistor 1600. In terms of increasing the speed of reading data, it is preferable to use, for example, a transistor with high switching rate such as a transistor formed using single crystal silicon.

Alternatively, a structure in which the capacitor 1604 is not provided as illustrated in FIG. 15B can be employed.

The memory cell illustrated in FIG. 15A1 utilizes a characteristic in which the potential of the gate electrode of the transistor 1600 can be held, whereby writing, holding, and reading of data can be performed as follows.

Firstly, writing and holding of data are described. First, the potential of the fourth wiring is set to a potential at which the transistor 1602 is turned on, so that the transistor 1602 is turned on. Accordingly, the potential of the third wiring is supplied to the gate electrode of the transistor 1600 and the capacitor 1604. In other words, a predetermined charge is supplied to the gate electrode of the transistor 1600 (writing). Here, one of charges for supply of two different potentials (hereinafter, a charge for supply of a low potential is referred to as a charge QL and a charge for supply of a high potential is referred to as a charge QH) is given to the gate electrode of the transistor 1600. Note that charges for supply of three or more different potentials may be employed to improve the storage capacity. After that, the potential of the fourth wiring is set to a potential at which the transistor 1602 is turned off, so that the transistor 1602 is turned off. Thus, the charge supplied to the gate electrode of the transistor 1600 is held (holding).

Since the off-state current of the transistor 1602 is extremely small, the charge of the gate electrode of the transistor 1600 is held for a long time.

Secondly, reading of data is described. By supplying an appropriate potential (a reading potential) to the fifth wiring while supplying a predetermined potential (a constant potential) to the first wiring, the potential of the second wiring varies depending on the amount of charge held in the gate electrode of the transistor 1600. This is because in general, when the transistor 1600 is an n-channel transistor, an apparent threshold voltage Vth_H in the case where QH is given to the gate electrode of the transistor 1600 is lower than an apparent threshold voltage Vth_L in the case where QL is given to the gate electrode of the transistor 1600. Here, an apparent threshold voltage refers to the potential of the fifth wiring, which is needed to turn on the transistor 1600. Thus, by setting the potential of the fifth wiring to a potential V0 which is between Vth_H and Vth_L, charge given to the gate electrode of the transistor 1600 can be determined. For example, in the case where QH is supplied in writing, when the potential of the fifth wiring is V0 (>Vth_H), the transistor 1600 is turned on. In the case where QL is supplied in writing, even when the potential of the fifth wiring is $V_0$ (<Vth_L), the transistor 1600 remains off. Therefore, the data stored can be read by measuring the potential of the second wiring.

However, a variation in the threshold voltage of transistors (e.g., the transistor 1600) included in the memory cells may cause a variation in potentials needed for driving the memory cells (such a potential is also referred to as the threshold voltage of a memory cell). For example, a variation in the threshold voltage of the transistor 1600 may cause a variation in the threshold voltage of the memory cells in data reading. Therefore, the operation voltages of the plurality of memory cells are each set to have a certain range in consideration of the variation in the threshold voltage of the memory cells. This has limited a reduction in the operation voltages of the memory cells.

In the semiconductor device according to one embodiment of the disclosed invention, writing, reading, and verifying are performed while the write potential is sequentially changed to another potential as described in Embodiment 1 with reference to FIG. 1, FIG. 2, FIGS. 3A and 3B, FIGS. 4A and 4B, and FIG. 5; thus, the write potentials for the plurality of memory cells are determined. Accordingly, a semiconductor device in which a variation (distribution width) in the threshold voltage of memory cells after writing is reduced so that the operation voltage can be reduced, the storage capacity can be increased, or operation such as writing, holding, or reading can be surely performed with the writing speed increased, and a method for driving the semiconductor device can be provided.

Note that in the case where a plurality of memory cells is arrayed to be used, only data of desired memory cells needs to be read. Thus, in the case where data of predetermined memory cells is read and data of the other memory cells is not read, a potential which allows the transistor 1600 to be turned off regardless of a state of the gate electrode, that is, a potential lower than Vth_H may be applied to fifth wirings of the memory cells whose data is not to be read. Alternatively, a potential which allows the transistor 1600 to be turned on regardless of a state of the gate electrode, that is, a potential higher than Vth_L may be supplied to the fifth wirings.

Next, rewriting of data (also referred to as another writing) is described. Rewriting of data is performed in a manner similar to that of the writing and holding of data. The potential of the fourth wiring is set to a potential at which the transistor 1602 is turned on, so that the transistor 1602 is turned on. Accordingly, the potential of the third wiring (a potential for new data) is supplied to the gate electrode of the transistor 1600 and to the capacitor 1604. After that, the potential of the fourth wiring is set to a potential at which the transistor 1602 is turned off, so that the transistor 1602 is turned off. Accordingly, charge for new data is supplied to the gate electrode of the transistor 1600.

In the memory cell included in the semiconductor device according to one embodiment of the disclosed invention, data can be directly rewritten by another writing of data as described above. Therefore, extracting of charge from a floating gate with the use of a high voltage needed in a flash memory or the like is not necessary and thus, reduction in operation speed, which is attributed to erasing operation, can be suppressed. In other words, high-speed operation of the semiconductor device including the memory cell can be realized.

Note that the third wiring illustrated in FIGS. 15A1 and 15B corresponds to the second signal line 122 illustrated in FIG. 1 in Embodiment 1. The second wiring illustrated in FIGS. 15A1 and 15B corresponds to the third signal line 125 illustrated in FIG. 1 in Embodiment 1.

Note that the source electrode (or the drain electrode) of the transistor 1602 is electrically connected to the gate electrode of the transistor 1600, thereby having an effect similar to that of a floating gate of a floating gate transistor used for a non-volatile memory element. Hereinafter, the portion where the drain electrode (or the source electrode) of the transistor 1602 and the gate electrode of the transistor 1600 are electrically connected to each other is called a node FG in some cases. When the transistor 1602 is turned off, the node FG can be regarded as being embedded in an insulator and thus charge is held in the node FG. The off-state current of the transistor 1602 including an oxide semiconductor is smaller than or equal to $1/100000$ of the off-state current of a transistor including a silicon semiconductor; thus, loss of the charge accumulated in the node FG due to leakage in the transistor 1602 is negligible. That is, with the transistor 1602 including an oxide semiconductor, a nonvolatile storage device which can hold data without being supplied with power can be realized.

For example, when the off-state current of the transistor 1602 is smaller than or equal to 10 zA (1 zA (zeptoampere) is $1 \times 10^{-21}$ A) at room temperature (25° C.) and the capacitance value of the capacitor 1604 is approximately 10 fF, data can be stored for $10^4$ seconds or longer. It is needless to say that the holding time depends on transistor characteristics and capacitance values.

Further, the memory cell included in the semiconductor device of one embodiment of the disclosed invention does not have a problem of deterioration of a gate insulating film (tunnel insulating film), which occurs in a conventional floating gate transistor. That is, the deterioration of a gate insulating film due to injection of an electron into a floating gate, which has been regarded as a problem, can be solved. This means that there is no limit on the number of times of writing in principle. Furthermore, a high voltage needed for writing or erasing in a conventional floating gate transistor is not necessary.

Components such as transistors in the memory cell illustrated in FIG. 15A1 can be regarded as including resistors and capacitors as illustrated in FIG. 15A2. That is, in FIG. 15A2, the transistor 1600 and the capacitor 1604 are each regarded as including a resistor and a capacitor. R1 and C1 denote the resistance value and the capacitance value of the capacitor 1604, respectively. The resistance value R1 corresponds to the resistance value of an insulating layer included in the capacitor 1604. R2 and C2 denote the resistance value and the capacitance value of the transistor 1600, respectively. The resistance value R2 corresponds to the resistance value of a gate insulating layer at the time when the transistor 1600 is on. The capacitance value C2 corresponds to the capacitance value of so-called gate capacitance (capacitance between the gate electrode and the source electrode or drain electrode and capacitance between the gate electrode and the channel formation region).

A charge holding period (also referred to as a data holding period) is determined mainly by the off-state current of the transistor 1602 under the conditions where the gate leakage current of the transistor 1602 is sufficiently small and R1 and R2 satisfy R1≥ROS(R1 is greater than or equal to ROS) and R2≥ROS(R2 is greater than or equal to ROS), where ROS is the resistance (also referred to as effective resistance) between the source electrode and the drain electrode in a state where the transistor 1602 is off.

On the other hand, in the case where the conditions are not satisfied, it is difficult to sufficiently secure the holding period even if the off-state current of the transistor 1602 is sufficiently small. This is because a leakage current other than the off-state current of the transistor 1602 (e.g., a leakage current generated between the source electrode and the gate electrode of the transistor 1600) is large. Accordingly, it can be said that the memory cell disclosed in this embodiment preferably satisfies the relations R1≥ROS and R2≥ROS.

Meanwhile, it is desirable that C1≥C2 (C1 is greater than or equal to C2) be satisfied. This is because by increasing C1, the potential of the fifth wiring can be efficiently applied to the node FG when the potential of the node FG is controlled by the fifth wiring, and thus the difference between the potentials supplied to the fifth wiring (e.g., a read potential and a non-read potential) can be reduced.

When the above relations are satisfied, a semiconductor device including a more favorable memory cell can be realized. Note that R1 and R2 are controlled by the gate insulating layer of the transistor 1600 and the insulating layer of the capacitor 1604. The same applies to C1 and C2. Therefore, the material, the thickness, and the like of the gate insulating layer are desirably set as appropriate to satisfy the above relation.

In the semiconductor device described in this embodiment, the node FG has an effect similar to a floating gate of a floating gate transistor in a flash memory or the like, but the node FG of this embodiment has a feature which is essentially different from that of the floating gate in the flash memory or the like.

In a flash memory, since a potential applied to a control gate is high, it is necessary to keep a proper distance between cells in order to prevent the potential from affecting a floating gate of the adjacent cell. This is one of factors inhibiting higher integration of the semiconductor device. The factor is attributed to a basic principle of a flash memory, in which tunneling current is generated by application of a high electric field.

In contrast, the memory cell included in the semiconductor device according to this embodiment is operated by switching of a transistor including an oxide semiconductor and does not use the above principle of charge injection by tunneling current. That is, a high electric field for charge injection is not necessary, unlike in a flash memory. Accordingly, it is not necessary to consider an influence of a high electric field from a control gate on an adjacent cell, which facilitates high integration.

In addition, there is another advantage over a flash memory in that a high electric field and a large peripheral circuit (such as a booster circuit) are unnecessary. For example, the highest voltage applied to the memory cell according to this embodiment (the difference between the highest potential and the lowest potential applied to terminals of the memory cell at the same time) can be 5 V or lower, preferably 3 V or lower in each memory cell in the case where two levels (one bit) of data are written.

In the case where the relative permittivity ∈r1 of the insulating layer included in the capacitor 1604 is different from the relative permittivity ∈r2 of the insulating layer included in the transistor 1600, it is easy to satisfy C1≥C2 (C1 is greater than or equal to C2) while satisfying 2·S2≥S1 (2·S2 is greater than or equal to S1), preferably S2≥S1 (S2 is greater than or equal to S1), where S1 is the area of the insulating layer included in the capacitor 1604 and S2 is the area of the insulating layer forming a gate capacitor of the transistor 1600. Specifically, for example, a film formed of a high-k material such as hafnium oxide or a stack of a film formed of a high-k material such as hafnium oxide and a film formed of an oxide semiconductor is used for C1 so that ∈r1 can be set to 10 or more, preferably 15 or more, and silicon oxide is used for C2 so that ∈r2 can be set to 3 to 4.

Combination of such structures enables higher integration of the memory cell included in the semiconductor device according to one embodiment of the disclosed invention.

Note that in addition to the increase in the integration degree, a multi-level technique can be employed in order to increase the storage capacity of the memory cell included in the semiconductor device. For example, three or more levels of data are written to one memory cell, whereby the storage capacity can be increased as compared to that in the case where two-level (one-bit) data is written. The multilevel technique can be achieved by, for example, giving charge Q, which is different from charge QL for supplying a low potential and charge QH for supplying a high potential, to the gate electrode of the transistor 1600, in addition to the charge QL and the charge QH.

Since the off-state current of the transistor 1602 including an oxide semiconductor is extremely small in the semiconductor device described in this embodiment, stored data can be stored for an extremely long period owing to such a transistor. In other words, power consumption can be adequately reduced because refresh operation becomes unnecessary or the frequency of refresh operation can be extremely low. Moreover, stored data can be stored for a long period even when power is not supplied (note that a potential is preferably fixed).

In a semiconductor device according to one embodiment of the disclosed invention, even when the threshold voltage of a transistor included in a memory cell varies, a variation (distribution width) in the threshold voltage of a plurality of memory cells after writing can be reduced, whereby the operation voltage of the semiconductor device can be reduced. A memory can be multi-leveled without increasing the operation voltage and the area of a memory cell, so that the storage capacity per unit area of the semiconductor device can be increased. A semiconductor device in which operation such as writing, holding, or reading can be surely performed can be provided.

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Since a transistor including a material other than an oxide semiconductor can operate at sufficiently high speed, a semiconductor device in which the transistor is used in combination with a transistor including an oxide semiconductor can perform operation (e.g., data reading) at sufficiently high speed. Further, a transistor including a material other than an oxide semiconductor can favorably realize a variety of circuits (such as a logic circuit or a driver circuit) which is required to operate at high speed.

Thus, a semiconductor device having a novel feature can be achieved by being provided with both the transistor including a semiconductor material other than an oxide semiconductor (a transistor capable of operation at sufficiently high speed, in general) and the transistor including an oxide semiconductor (a transistor whose off-state current is sufficiently small, in general).

The structures, methods, and the like described in this embodiment can be combined as appropriate with any of the structures, methods, and the like described in the other embodiments.

Embodiment 4

In this embodiment, application examples of a semiconductor device according to one embodiment of the disclosed invention are described with reference to FIGS. 16A to 16C. Here, an example of a storage device is described. Note that in each of circuit diagrams, in some cases, "OS" is written beside a transistor in order to indicate that the transistor includes an oxide semiconductor.

Figure 16A:
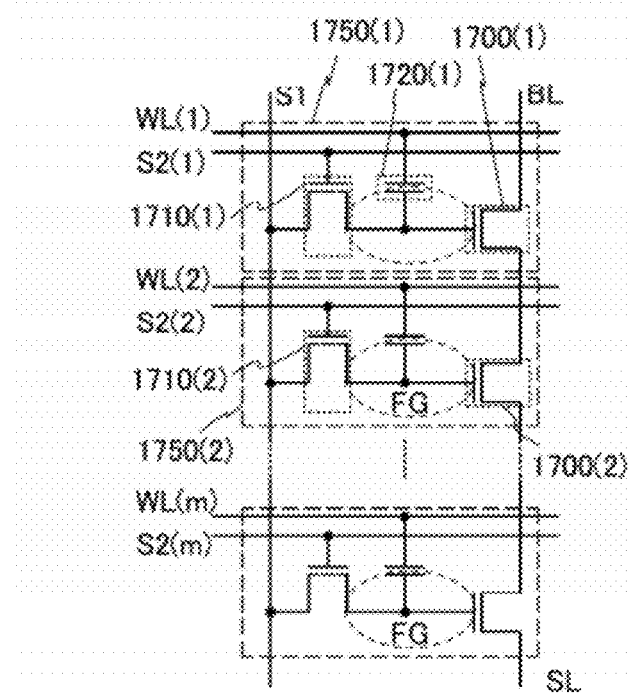
FIGS. 16A to 16C are circuit diagrams of a semiconductor device.
Figure 16B:
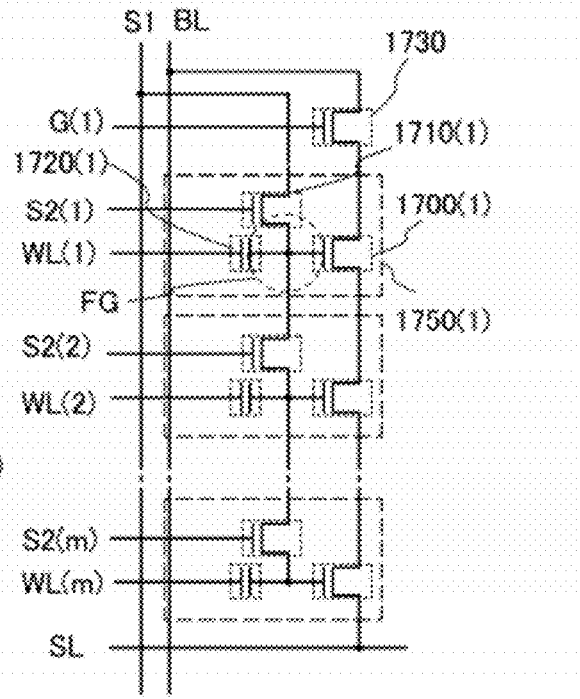
Figure 16C:
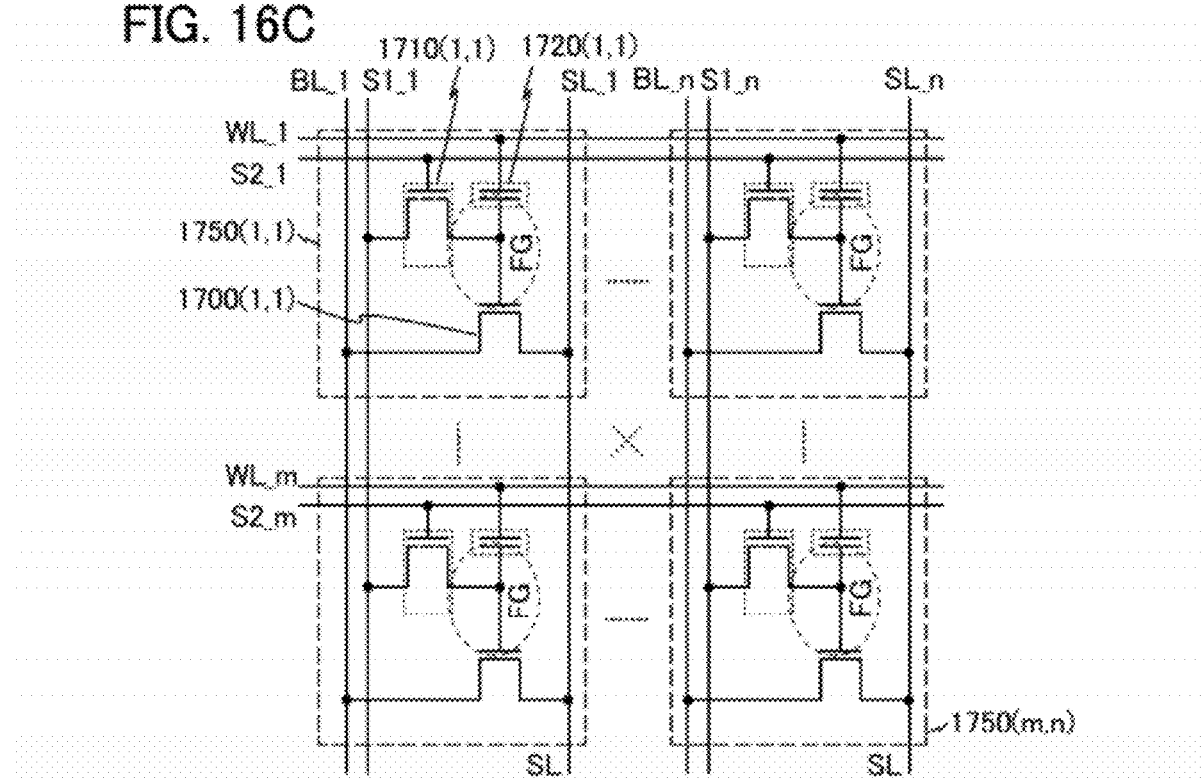

FIGS. 16A to 16C are circuit diagrams of semiconductor devices each of which can be used as a storage device and includes a plurality of semiconductor devices (hereinafter also referred to as memory cells) illustrated in FIG. 15A1. Each of FIGS. 16A and 16B is a circuit diagram of a NAND semiconductor device in which memory cells are connected in series. FIG. 16C is a circuit diagram of a NOR semiconductor device in which memory cells are connected in parallel.

The semiconductor device in FIG. 16A includes a source line SL, a bit line BL, a first signal line S1, m second signal lines S2, m word lines WL, and m memory cells. In FIG. 16A, one source line SL and one bit line BL are provided in the semiconductor device; however, one embodiment of the disclosed invention is not limited to this. A plurality of source lines SL and a plurality of bit lines BL may be provided.

A memory cell 1750($i$) is considered as a typical example of the memory cells, where i is an integer greater than or equal to 1 and less than or equal to m. In the memory cell 1750($i$), a gate electrode of a transistor 1700($i$), a drain electrode (or a source electrode) of a transistor 1710($i$), and one electrode of a capacitor 1720($i$) are electrically connected to each other. The first signal line S1 and the source electrode (or the drain electrode) of the transistor 1710($i$) are electrically connected to each other, and the second signal line S2($i$) and a gate electrode of the transistor 1710($i$) are electrically connected to each other. The word line WL(i) and the other electrode of the capacitor 1720($i$) are electrically connected to each other.

Further, a source electrode of the transistor 1700($i$) included in the memory cell 1750($i$) is electrically connected to a drain electrode of a transistor 1700($i$–1) in an adjacent memory cell 1750($i$–1). A drain electrode of the transistor 1700($i$) included in the memory cell 1750($i$) is electrically connected to a source electrode of a transistor 1700($i$+1) in an adjacent memory cell 1750($i$+1). Note that a drain electrode of a transistor 1700(1) in a memory cell 1750(1) among the m memory cells connected in series is electrically connected to the bit line BL. In addition, a source electrode of a transistor 1700($m$) included in a memory cell 1750($m$) among the m memory cells connected in series is electrically connected to the source line SL.

The transistor 1700(1) in the memory cell 1750(1) may be electrically connected to the bit line BL through a selection transistor (not shown). In that case, a selection line G(1) is connected to a gate electrode of the selection transistor. Further, the transistor 1700($m$) in the memory cell 1750($m$) may be electrically connected to the source line SL through a selection transistor (not shown). In that case, a selection line G(2) is connected to a gate electrode of the selection transistor.

In the semiconductor device in FIG. 16A, writing operation and reading operation are performed in each row. The writing operation is performed as follows. A potential at which the transistor 1710(*i*) is turned on is supplied to the second signal line S2(*i*) in a row subjected to writing (e.g., the i-th row), so that the transistor 1710(*i*) in the row subjected to writing is turned on. Accordingly, the potential of the first signal line S1 is applied to the gate electrode of the transistor 1700(*i*) in the specified row, so that predetermined charge is given to the gate electrode. Thus, data can be written to the memory cell of the specified row.

Further, the reading operation is performed as follows. Word lines WL of rows other than the row subjected to reading (e.g., the i-th row) are supplied with a potential at which the transistors 1700 that are not in the row subjected to reading are turned on regardless of charge given to the gate electrode of the transistor 1700(*i*), so that the transistors 1700 in the rows other than the row subjected to reading are turned on. Then, the word line WL(i) of the row subjected to reading is supplied with a potential (a reading potential) at which the on state or the off state of the transistor 1700(*i*) is selected depending on data to which the charge stored in the gate electrode of the transistor 1700(*i*) corresponds. Moreover, a constant potential is supplied to the source line SL so that a reading circuit (not shown) connected to the bit line BL operates. Here, among a plurality of transistors 1700(1) to 1700(*m*) between the source line SL and the bit line BL, all the transistors 1700 except the transistor 1700(*i*) of the row subjected to reading are on; therefore, the level of the conductance between the source line SL and the bit line BL is determined by the state (the on state or the off state) of the transistor 1700(*i*) in the row subjected to reading. The state (the on state or the off state) of the transistor 1700(*i*) differs depending on data to which the charge stored in the gate electrode of the transistor 1700(*i*) in the row subjected to reading corresponds; thus, the potential of the bit line BL varies accordingly. By reading the potential of the bit line BL with the reading circuit, data can be read from the memory cell of the specified row.

However, a variation in the threshold voltage of a transistor (e.g., the transistor 1700(*i*)) included in the memory cell may cause a variation in potentials needed for driving the plurality of memory cells (such a potential is also referred to as the threshold voltage of a memory cell). For example, the variation in the threshold voltage of the transistor 1700(*i*) may cause a variation in the threshold voltage of the memory cells in data reading. Therefore, the operation voltages of the plurality of memory cells are each set to have a certain range in consideration of the variation in the threshold voltages of the memory cells. This has limited a reduction in the operation voltages of the memory cells.

In the semiconductor device according to one embodiment of the disclosed invention, writing, reading, and verifying are performed while the write potential is sequentially changed to another potential as described in Embodiment 1 with reference to FIG. 1, FIG. 2, FIGS. 3A and 3B, FIGS. 4A and 4B, and FIG. 5; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed, and a method for driving the semiconductor device can be provided.

Note that the first signal line S1 illustrated in FIG. 16A corresponds to the second signal line 122 illustrated in FIG. 1 in Embodiment 1. The bit line BL illustrated in FIG. 16A corresponds to the third signal line 125 illustrated in FIG. 1 in Embodiment 1.

FIG. 16B illustrates a semiconductor device whose structure is partly different from that in FIG. 16A.

One of differences between the semiconductor device in FIG. 16B and the semiconductor device in FIG. 16A is that the bit line BL and the drain electrode of the transistor 1700 (1) in the memory cell 1750(1) are electrically connected to each other through a selection transistor 1730 in the semiconductor device in FIG. 16B. A gate electrode of the selection transistor 1730 is electrically connected to the selection line G(1) for switching between the on and off states of the selection transistor 1730.

Another difference between the semiconductor device in FIG. 16B and the semiconductor device in FIG. 16A is that the source electrode (or the drain electrode) of the transistor 1710 in each memory cell is connected to the first signal line S1 in the semiconductor device in FIG. 16A, whereas the transistors 1710 in the memory cells are connected in series in the semiconductor device in FIG. 16B. That is, the source electrode of the transistor 1710(*i*) in the memory cell 1750(*i*) is electrically connected to a drain electrode of a transistor 1710(*i*−1) in the adjacent memory cell 1750(*i*−1). The drain electrode of the transistor 1710(*i*) in the memory cell 1750(*i*) is electrically connected to a source electrode of a transistor 1710(*i*+1) in the adjacent memory cell 1750(*i*+1). Note that a source electrode of a transistor 1710(1) in the memory cell 1750(1) among the m memory cells connected in series is electrically connected to the first signal line S1. Moreover, in each of the memory cells connected in series, the drain electrode (or the source electrode) of the transistor 1710(*i*) is electrically connected to the gate electrode of the transistor 1700(*i*) and one electrode of the capacitor 1720(*i*) as in the semiconductor device in FIG. 16A.

The structure of other portions of the semiconductor device in FIG. 16B is similar to that of the semiconductor device in FIG. 16A; therefore, the above description can be referred to for the details.

Note that the first signal line S1 and the bit line BL are separately provided in the semiconductor device in FIG. 16B; however, the disclosed invention is not limited to this structure. The first signal line S1 and the bit line BL may be one line.

Also in the semiconductor device in FIG. 16B, writing operation and reading operation are performed in each row. The writing operation is performed as follows.

The writing operation is sequentially performed row by row from the m-th row. In order to perform writing on the i-th row (i is one of 1 to m), a potential at which the transistor 1710(*i*) is turned on is supplied to the second signal line S2(*i*) in the row subjected to writing (the i-th row), so that the transistor 1710(*i*) in the row subjected to writing is turned on. Here, in the case where the transistors 1710(1) to 1710(*i*−1) exist between the transistor 1710(*i*) and the first signal line S1, the transistors 1710(1) to 1710(*i*−1) in the rows that precede the row subjected to writing are turned on so that the potential of the first signal line S1 is applied to the memory cell 1750(*i*) in the row subjected to writing. Accordingly, the potential of the first signal line S1 is supplied to the gate electrode of the transistor 1700(*i*) of the specified row, so that predetermined charge is given to the gate electrode. Then, the potential of the second signal line S2(*i*) is fixed at GND, so that charge accumulated in the gate electrode of the transistor 1700(*i*) is held. Thus, data can be written into the memory cell of the specified row (the i-th row).

Note that in the semiconductor device in FIG. 16B, since the transistors 1710 included in the memory cells 1750 are connected in series, it is difficult to rewrite data only in a given row. Therefore, operation for erasing data in a plurality of rows all at once is preferably performed in the above driving method. For example, erasing per block is preferably performed, dividing the first to m-th rows into blocks. In order to rewrite data in a predetermined block, it is preferable that data in the block be erased first, and then data writing be sequentially performed from the m-th row. Note that in the case where data in a row on which writing has just been performed is rewritten, erasing operation is unnecessary.

Further, the reading operation is performed as follows. First, a potential is supplied to the selection line G(1) so that the selection transistor is turned on. Note that in the case where there are a selection transistor connected to the selection line G(1) and a selection transistor connected to the selection line G(2), the two transistors are turned on. Moreover, word lines WL of rows other than the row subjected to reading (e.g., the i-th row) are supplied with a potential at which the transistors 1700 that are not in the row subjected to reading are turned on regardless of charge given to the gate electrode of the transistor 1700(*i*), so that the transistors 1700 in the rows other than the row subjected to reading are turned on. Then, the word line WL(i) of the row subjected to reading is supplied with a potential (a reading potential) at which the on state or the off state of the transistor 1700(*i*) is selected depending on data to which the charge stored in the gate electrode of the transistor 1700(*i*) corresponds. Moreover, a constant potential is supplied to the source line SL so that a reading circuit (not shown) connected to the bit line BL operates. Here, among a plurality of transistors 1700(1) to 1700(*m*) between the source line SL and the bit line BL, all the transistors 1700 except the transistor 1700(*i*) of the row subjected to reading are on; therefore, the level of the conductance between the source line SL and the bit line BL is determined by the state (the on state or the off state) of the transistor 1700(*i*) in the row subjected to reading. The state (the on state or the off state) of the transistor 1700(*i*) differs depending on data to which the charge stored in the gate electrode of the transistor 1700(*i*) in the row subjected to reading corresponds; thus, the potential of the bit line BL varies accordingly. By reading the potential of the bit line BL with the read-out circuit, data can be read out from the memory cell of the specified row.

Also in the semiconductor device illustrated in FIG. 16B, writing, reading, and verifying are performed while the write potential is sequentially changed to another potential as described in Embodiment 1 with reference to FIG. 1, FIG. 2, FIGS. 3A and 3B, FIGS. 4A and 4B, and FIG. 5; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed, and a method for driving the semiconductor device can be provided.

Note that the first signal line S1 illustrated in FIG. 16B corresponds to the second signal line 122 illustrated in FIG. 1 in Embodiment 1. The bit line BL illustrated in FIG. 16B corresponds to the third signal line 125 illustrated in FIG. 1 in Embodiment 1.

The semiconductor device in FIG. 16C includes n source lines SL, n bit lines BL, n first signal lines S1, m second signal lines S2, m word lines WL, and a plurality of memory cells 1750(1,1) to 1750(*m,n*).

A memory cell 1750(*i,j*) is considered as a typical example of the memory cells, where i is an integer greater than or equal to 1 and less than or equal to m and j is an integer of greater than or equal to 1 and less than or equal to n. In the memory cell 1750(*i,j*), a gate electrode of a transistor 1700(*i,j*), a drain electrode (or a source electrode) of a transistor 1710(*i,j*), and one electrode of a capacitor 1720(*i,j*) are electrically connected to each other. A source line SL(j) and a source electrode of the transistor 1700(*i,j*) are electrically connected to each other. A bit line BL(j) and a drain electrode of the transistor 1700(*i,j*) are electrically connected to each other. A first signal line S1(*j*) and the source electrode (or the drain electrode) of the transistor 1710(*i,j*) are electrically connected to each other. The second signal line S2(*i*) and a gate electrode of the transistor 1710(*i,j*) are electrically connected to each other. The word line WL(i) and the other electrode of the capacitor 1720(*i,j*) are electrically connected to each other.

In the semiconductor device in FIG. 16C, writing operation and reading operation are performed in each row. The writing operation is performed in a manner similar to that of the semiconductor device in FIG. 16A. The reading operation is performed as follows. First, the word lines WL of rows other than a row subjected to reading (e.g., the i-th row having the memory cells 1750(*i*,1) to 1750(*i,n*)) are supplied with a potential at which the transistors 1700 that are not in the row subjected to reading are turned off regardless of data to which charge given to gate electrodes of the transistors 1700(*i*,1) to 1700(*i,n*) corresponds, so that the transistors 1700 in the rows other than the row subjected to reading are turned off. Then, the word line WL(i) of the row subjected to reading is supplied with a potential (a reading potential) at which the on state or the off state of the transistors 1700(*i*,1) to 1700(*i,n*) is selected depending on data to which the charge stored in the gate electrodes of the transistors 1700(*i*,1) to 1700(*i,n*) corresponds. Moreover, a constant potential is supplied to the source line SL(j) so that a reading circuit (not shown) connected to the bit line BL(j) operates. Here, the level of the conductance between the source line SL(j) and the bit line BL(j) is determined by the state (the on state or the off state) of the transistors 1700(*i*,1) to 1700(*i,n*) in the row subjected to reading. That is, the potential of the bit line BL(j) differs depending on data to which the charge stored in the gate electrodes of the transistors 1700(*i*,1) to 1700(*i,n*) in the row subjected to reading corresponds. By reading the potential of the bit line BL(j) with the reading circuit, data can be read out from the memory cell of the specified row.

Also in the semiconductor device illustrated in FIG. 16C, writing, reading, and verifying are performed while the write potential is sequentially changed to another potential as shown in FIG. 1, FIG. 2, FIGS. 3A and 3B, FIGS. 4A and 4B, and FIG. 5; thus, the write potentials for the plurality of memory cells are determined. Accordingly, a semiconductor device in which variation (distribution width) in the threshold voltages of memory cells after writing is reduced so that the operation voltage can be reduced, the storage capacity can be increased, or operation such as writing, holding, or reading can be surely performed, and a method for driving the semiconductor device can be provided.

Note that each of the first signal lines S1 illustrated in FIG. 16C corresponds to the second signal line 122 illustrated in FIG. 1. Each of the bit lines BL illustrated in FIG. 16C corresponds to the third signal line 125 illustrated in FIG. 1.

Although the amount of data which can be stored in each of the memory cells 1750 is one bit in the above description, the structure of the semiconductor device of this embodiment is not limited to this example. The amount of data stored in each memory cell 1750 may be increased by preparation of three or more potentials to be supplied to the gate electrode of the transistor 1700 at the time of data writing. For example, in the case where four kinds of potentials are supplied to the gate electrode of the transistor 1700 at the time of data writing, data of two bits can be stored in each of the memory cells.

In FIGS. 16A to 16C, the first signal line S1 and the bit line BL may be one wiring. When one wiring serves as both the first signal line S1 and the bit line BL, the number of wirings can be reduced. Further, in FIG. 16C, the source line SL may be shared by a plurality of memory cells.

In the semiconductor device according to one embodiment of the disclosed invention, even when the threshold voltage of a transistor included in a memory cell varies, variation (distribution width) in the threshold voltages of a plurality of memory cells after writing can be reduced, whereby the operation voltage of the semiconductor device can be reduced. A memory can be multi-leveled without increasing the operation voltage and the area of a memory cell, so that the storage capacity per unit area of the semiconductor device can be increased. A semiconductor device in which operation such as writing, holding, or reading can be surely performed can be provided.

The structures, methods, and the like described in this embodiment can be combined as appropriate with any of the structures, methods, and the like described in the other embodiments.

Embodiment 5

In this embodiment, a structure and a manufacturing method of a memory cell included in a semiconductor device according to one embodiment of the disclosed invention are described with reference to FIGS. 17A and 17B, FIGS. 18A to 18D, FIGS. 19A to 19D, FIGS. 20A to 20D, FIGS. 21A and 21B, and FIGS. 22A and 22B.

<Cross-sectional Structure and Plan View of Memory Cell>

Figure 17A:
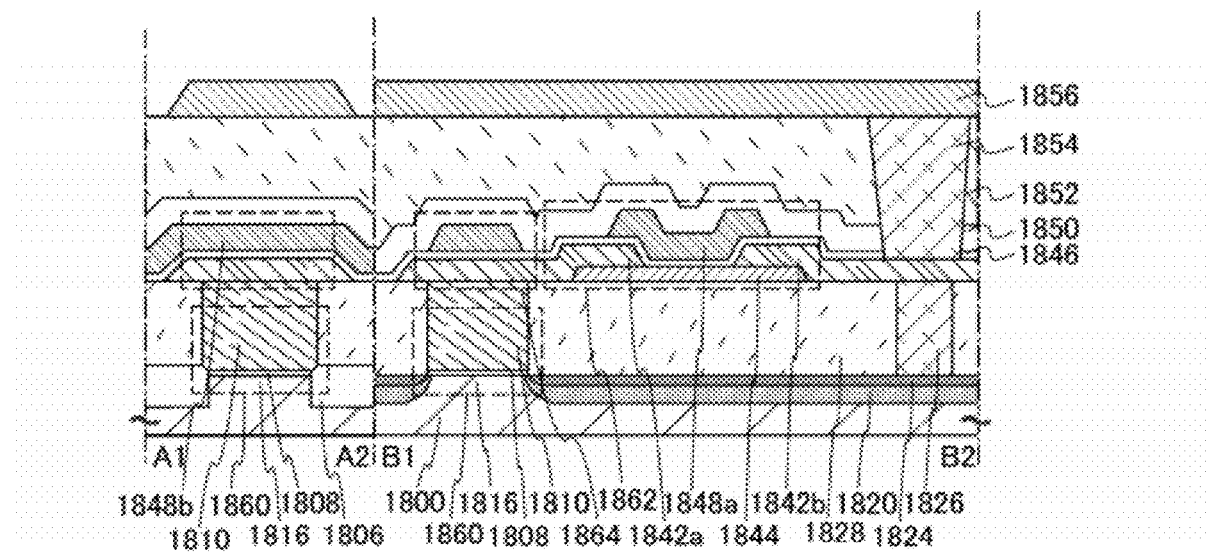
FIGS. 17A and 17B are a cross-sectional view and a plan view of a memory cell included in a semiconductor device.
Figure 17B:
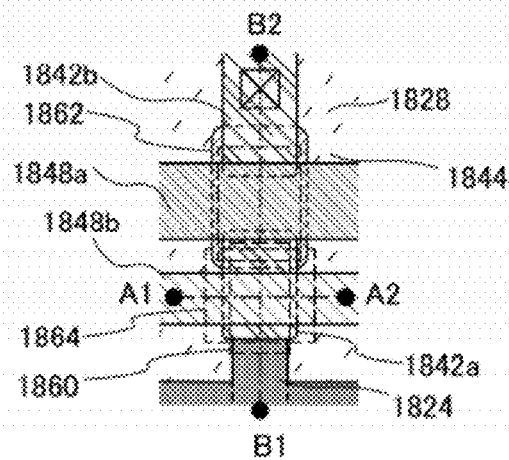

FIGS. 17A and 17B illustrate an example of a structure of a memory cell included in a semiconductor device. FIG. 17A illustrates a cross section of the memory cell included in the semiconductor device, and FIG. 17B illustrates a plan view of the memory cell included in the semiconductor device. In FIG. 17A, A1-A2 is a cross section perpendicular to a channel length direction of a transistor, and B1-B2 is a cross section parallel to the channel length direction of the transistor. The semiconductor device illustrated in FIGS. 17A and 17B includes a transistor 1860 including a first semiconductor material in a lower portion, and a transistor 1862 including a second semiconductor material in an upper portion. FIGS. 17A and 17B illustrate the semiconductor device including one transistor 1860, one transistor 1862, and one capacitor 1864; alternatively, the semiconductor device may include a plurality of transistors 1860, transistors 1862, and capacitors 1864.

Here, the first semiconductor material is preferably different from the second semiconductor material. For example, a semiconductor material other than an oxide semiconductor can be used as the first semiconductor material, and an oxide semiconductor can be used as the second semiconductor material. The semiconductor material other than the oxide semiconductor may be, for example, silicon, germanium, silicon germanium, silicon carbide, gallium arsenide, or the like and is preferably a single crystal semiconductor. Alternatively, an organic semiconductor material or the like may be used. A transistor including such a semiconductor material can operate at high speed easily. On the other hand, a transistor including an oxide semiconductor can hold charge for a long time owing to its characteristics.

Either an n-channel transistor or a p-channel transistor can be used for the transistor 1860 and the transistor 1862. Here, the case where the transistors 1860 and 1862 are n-channel transistors is described. Since the technical feature of one embodiment of the present invention is to use a semiconductor material like an oxide semiconductor, which can sufficiently reduce off-state current, for the transistor 1862 in order to hold data, it is not necessary to limit specific conditions such as a structure or a material of the semiconductor device to those given here.

The transistor 1860 includes a channel formation region 1816 provided in a substrate 1800 including a semiconductor material (e.g., silicon), impurity regions 1820 (also referred to as a source region and a drain region) provided so that the channel formation region 1816 is placed therebetween, metal compound regions 1824 in contact with the impurity regions 1820, a gate insulating layer 1808 provided over the channel formation region 1816, and a gate electrode 1810 provided over the gate insulating layer 1808. Note that FIGS. 17A and 17B illustrate an element in which distinct source and drain electrodes are not provided; such an element is sometimes referred to as a transistor for the sake of convenience. Further, in such a case, in description of connection of a transistor, a source region and a source electrode may be collectively referred to as a "source electrode," and a drain region and a drain electrode may be collectively referred to as a "drain electrode". That is, in this specification, the term "source electrode" may include a source region.

An electrode 1826 is connected to part of the metal compound region 1824 of the transistor 1860. Here, the electrode 1826 functions as a source electrode or a drain electrode of the transistor 1860. Further, an element isolation insulating layer 1806 is formed on the substrate 1800 so as to surround the transistor 1860, and an insulating layer 1828 is formed over the transistor 1860. For high integration, as illustrated in FIGS. 17A and 17B, it is preferable that the transistor 1860 do not include a sidewall insulating layer. On the other hand, in the case where importance is put on characteristics of the transistor 1860, a sidewall insulating layer may be provided on a side surface of the gate electrode 1810, and the impurity regions 1820 may include a region having a different impurity concentration in a region overlapping with the sidewall insulating layer.

The transistor 1862 includes an oxide semiconductor layer 1844 provided over the insulating layer 1828 and the like; a source or drain electrode 1842a and a source or drain electrode 1842b which are electrically connected to the oxide semiconductor layer 1844; a gate insulating layer 1846 covering the oxide semiconductor layer 1844, the source or drain electrode 1842a, and the source or drain electrode 1842b; and a gate electrode 1848a provided over the gate insulating layer 1846 so as to overlap with the oxide semiconductor layer 1844.

Here, the oxide semiconductor layer 1844 used for the transistor 1862 is preferably an oxide semiconductor layer which is purified by sufficiently removing impurities such as hydrogen therefrom or by sufficiently supplying oxygen thereto. For example, the concentration of hydrogen in the oxide semiconductor layer 1844 is $5 \times 10^{19}$ atoms/cm$^3$ or lower, preferably $5 \times 10^{18}$ atoms/cm$^3$ or lower, further preferably $5 \times 10^{17}$ atoms/cm$^3$ or lower. Note that the concentration of hydrogen in the oxide semiconductor layer 1844 is measured by secondary ion mass spectrometry (SIMS). In the oxide semiconductor layer 1844 which is highly purified by sufficiently reducing the hydrogen concentration and in which defect levels in an energy gap due to oxygen vacancy are reduced by supplying a sufficient amount of oxygen, the carrier concentration is less than $1 \times 10^{12}$/cm$^3$, preferably less than $1 \times 10^{11}$/cm$^3$, further preferably less than $1.45 \times 10^{10}$/cm$^3$. For example, the off-state current (here, current per micrometer (μm) of channel width) at room temperature (25° C.) is smaller than or equal to 100 zA (1 zA (zeptoampere) is $1×10^{-21}$ A), preferably smaller than or equal to 10 zA. Thus, the transistor 1862 can have extremely excellent off-state current characteristics by using the i-type (intrinsic) or substantially i-type oxide semiconductor layer 1844.

Although the oxide semiconductor layer which is processed into an island shape is used in the transistor 1862 in order to suppress leakage current generated between elements due to miniaturization, an oxide semiconductor layer which is not processed into an island shape may be used. When an oxide semiconductor layer is not processed into an island shape, contamination of the oxide semiconductor layer due to etching in the processing can be prevented.

The capacitor 1864 includes the source or drain electrode 1842*a*, the gate insulating layer 1846, and a conductive layer 1848*b*. That is, the source or drain electrode 1842*a* functions as one electrode of the capacitor 1864, and the conductive layer 1848*b* functions as the other electrode of the capacitor 1864. With such a structure, sufficient capacitance can be secured. Further, insulation between the source or drain electrode 1842*a* and the conductive layer 1848*b* can be sufficiently secured by stacking the oxide semiconductor layer 1844 and the gate insulating layer 1846. In the case where a capacitor is not needed, the capacitor 1864 may be omitted.

Note that in the transistor 1862 and the capacitor 1864, end portions of the source or drain electrode 1842*a* and the source or drain electrode 1842*b* are preferably tapered. The end portions of the source or drain electrode 1842*a* and the source or drain electrode 1842*b* are tapered, so that coverage with the gate insulating layer 1846 can be improved and disconnection can be prevented. Here, a taper angle is, for example, greater than or equal to 30° and less than or equal to 60°. Note that the taper angle is a tilt angle formed between a side surface and a bottom surface of a layer having a tapered shape (e.g., the source or drain electrode 1842*a*) when the layer is seen in a direction perpendicular to a cross-sectional plane (a plane perpendicular to the surface of a substrate).

An insulating layer 1850 and an insulating layer 1852 are provided over the transistor 1862 and the capacitor 1864. An electrode 1854 is provided in an opening formed in the gate insulating layer 1846, the insulating layer 1850, the insulating layer 1852, and the like, and a wiring 1856 which is connected to the electrode 1854 is formed over the insulating layer 1852. Note that although the metal compound region 1824, the source or drain electrode 1842*b*, and the wiring 1856 are connected to one another through the electrode 1826 and the electrode 1854 in FIGS. 17A and 17B, one embodiment of the present invention is not limited to this. For example, the source or drain electrode 1842*b* may be in direct contact with the metal compound region 1824, or the wiring 1856 may be in direct contact with the source or drain electrode 1842*b*.

In FIGS. 17A and 17B, the electrode 1826 connecting the metal compound region 1824 to the source or drain electrode 1842*b* and the electrode 1854 connecting the source or drain electrode 1842*b* to the wiring 1856 overlap with each other. In other words, a region in which the electrode 1826 functioning as a source electrode or a drain electrode of the transistor 1860 is in contact with the source or drain electrode 1842*b* of the transistor 1862 overlaps with a region in which the source or drain electrode 1842*b* of the transistor 1862 is in contact with the electrode 1854. With such a planar layout, the element area can be prevented from increasing due to contact regions of the electrodes. In other words, the degree of integration of the semiconductor device can be increased.

In FIGS. 17A and 17B, the transistor 1860 and the transistor 1862 are provided to at least partly overlap with each other. Moreover, the transistor 1862 and the capacitor 1864 are provided to overlap with the transistor 1860. For example, the conductive layer 1848*b* of the capacitor 1864 is provided so as to overlap with the gate electrode 1810 of the transistor 1860 at least partly. By employing such a planar layout, high integration can be realized. For example, given that the minimum feature size is F, the area occupied by a memory cell can be $15F^2$ to $25F^2$.

<Method for Manufacturing Memory Cell Included in Semiconductor Device>

Next, an example of a method for manufacturing the memory cell included in the semiconductor device is described. First, a method for manufacturing the transistor 1860 in the lower portion is described below with reference to FIGS. 18A to 18D and FIGS. 19A to 19D, and then a method for manufacturing the transistor 1862 in the upper portion and the capacitor 1864 is described with reference to FIGS. 20A to 20D and FIGS. 21A and 21B.

<Method for Manufacturing Transistor in Lower Portion>

A method for manufacturing the transistor 1860 in a lower portion is described with reference to FIGS. 18A to 18D and FIGS. 19A to 19D.

First, the substrate 1800 including a semiconductor material is prepared. As the substrate including a semiconductor material, a single crystal semiconductor substrate or a polycrystalline semiconductor substrate made of silicon, silicon carbide, or the like; a compound semiconductor substrate of silicon germanium or the like; an SOI substrate; or the like can be used. Here, an example of using a single crystal silicon substrate as the substrate 1800 including a semiconductor material is described. Note that in general, the term "SOI substrate" means a substrate where a silicon semiconductor layer is provided on an insulating surface. In this specification and the like, the term "SOI substrate" also includes a substrate where a semiconductor layer formed using a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

As the substrate 1800 including a semiconductor material, a single crystal semiconductor substrate of silicon or the like is preferably used because the speed of reading operation of the semiconductor device can be increased.

Figure 18A:
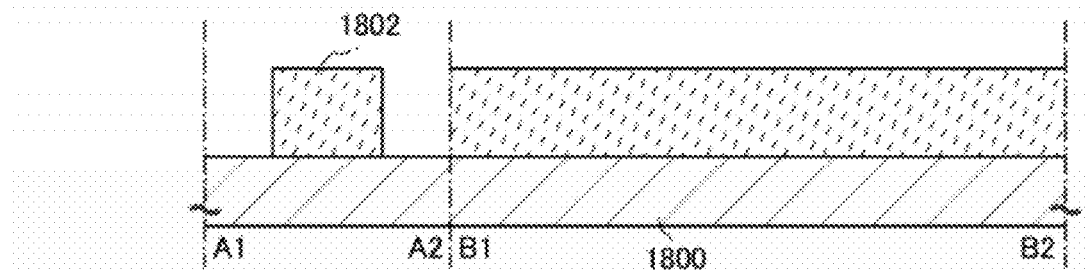
FIGS. 18A to 18D are cross-sectional views illustrating a manufacturing process of a semiconductor device.
Figure 18B:
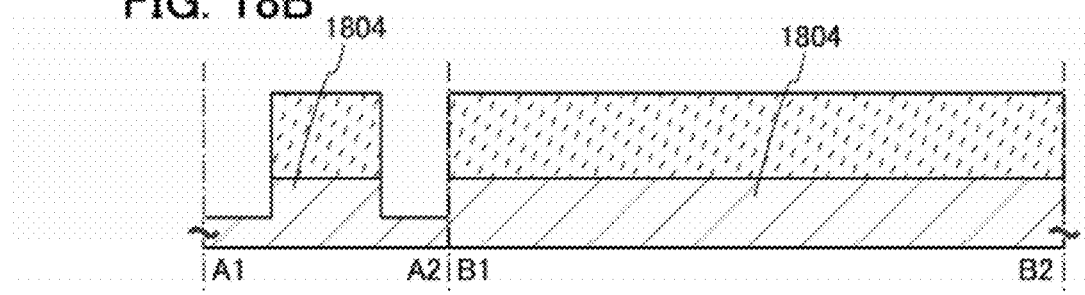

Over the substrate 1800, a protective layer 1802 serving as a mask for formation of the element isolation insulating layer is formed (see FIG. 18A). As the protective layer 1802, for example, an insulating layer formed using silicon oxide, silicon nitride, silicon oxynitride, or the like can be used. Note that before or after this step, an impurity element imparting n-type conductivity or an impurity element imparting p-type conductivity may be added to the substrate 1800 in order to control the threshold voltage of the transistor. In the case where silicon is used as the semiconductor, phosphorus, arsenic, or the like can be used as an impurity element imparting n-type conductivity. On the other hand, boron, aluminum, gallium, or the like can be used as an impurity element imparting p-type conductivity.

Then, part of the substrate 1800 in a region that is not covered with the protective layer 1802 (in an exposed region) is removed by etching using the protective layer 1802 as a mask. Thus, a semiconductor region 1804 isolated from the other semiconductor regions is formed (see FIG. 18B). As the etching, dry etching is preferably performed, but wet etching may be performed. An etching gas and an etchant can be selected as appropriate in accordance with a material to be etched.

Figure 18C:
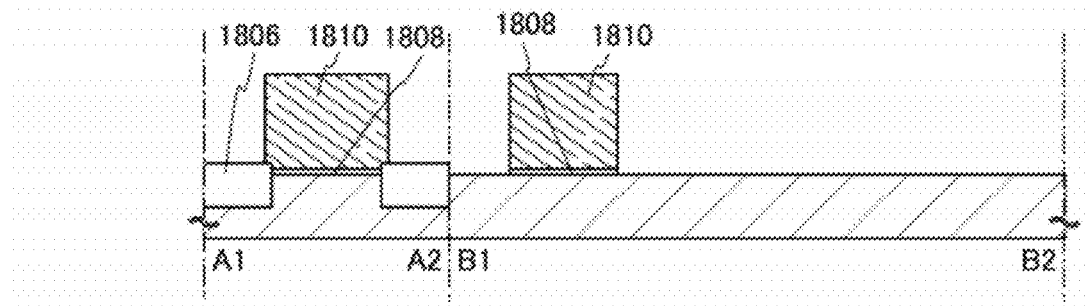

Then, an insulating layer is formed so as to cover the semiconductor region 1804, and the insulating layer in a region overlapping with the semiconductor region 1804 is selectively removed, so that the element isolation insulating layer 1806 is formed (see FIG. 18C). The insulating layer is formed using silicon oxide, silicon nitride, silicon oxynitride, or the like. For removing the insulating layer, any of etching treatment, polishing treatment such as chemical mechanical polishing (CMP), and the like can be employed. Note that the protective layer 1802 is removed after the formation of the semiconductor region 1804 or after the formation of the element isolation insulating layer 1806.

Here, the CMP treatment is treatment of planarizing a surface of an object to be processed by a combination of chemical and mechanical actions using the surface as a reference. Specifically, the CMP treatment is a method in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

Note that as a formation method of the element isolation insulating layer 1806, a method in which an insulating region is formed by introduction of oxygen or the like can be used as well as a method in which an insulating layer is selectively removed.

Next, an insulating layer is formed over a surface of the semiconductor region 1804, and a layer including a conductive material is formed over the insulating layer.

The insulating layer is to be a gate insulating layer later and can be formed by heat treatment (e.g., thermal oxidation treatment or thermal nitridation treatment) on the surface of the semiconductor region 1804, for example. Instead of heat treatment, high-density plasma treatment may be employed. The high-density plasma treatment can be performed using, for example, a mixed gas of a rare gas such as He, Ar, Kr, or Xe and any of oxygen, nitrogen oxide, ammonia, nitrogen, and hydrogen. Needless to say, the insulating layer may be formed using a CVD method, a sputtering method, or the like. The insulating layer preferably has a single-layer structure or a stacked-layer structure including any of silicon oxide, silicon oxynitride, silicon nitride, hafnium oxide, aluminum oxide, tantalum oxide, yttrium oxide, hafnium silicate (Hf-$Si_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, and the like. The insulating layer can have a thickness of, for example, greater than or equal to 1 nm and less than or equal to 100 nm, preferably greater than or equal to 10 nm and less than or equal to 50 nm.

The layer including a conductive material can be formed using a metal material such as aluminum, copper, titanium, tantalum, or tungsten. The layer including a conductive material may be formed using a semiconductor material such as polycrystalline silicon. There is no particular limitation on the formation method, and a variety of film formation methods such as an evaporation method, a CVD method, a sputtering method, or a spin coating method can be employed. Note that this embodiment shows an example of the case where the layer including a conductive material is formed using a metal material.

After that, the insulating layer and the layer including a conductive material are selectively etched; thus, the gate insulating layer 1808 and the gate electrode 1810 are formed (see FIG. 18C).

Figure 18D:
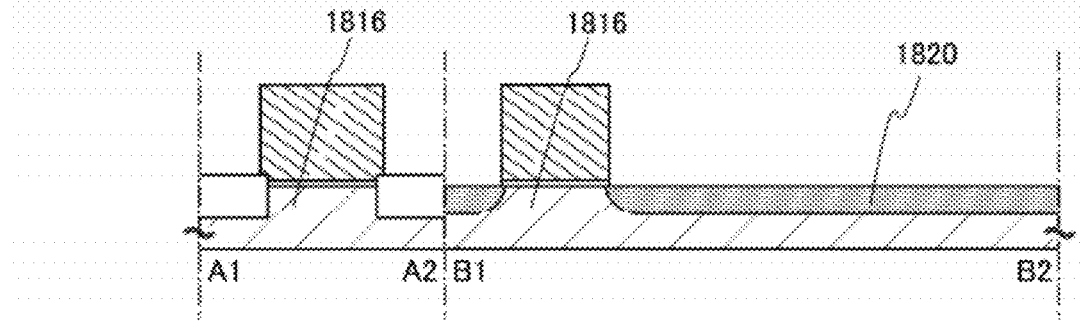

Next, phosphorus (P), arsenic (As), or the like is added to the semiconductor region 1804, so that the channel formation region 1816 and the impurity regions 1820 are formed (see FIG. 18D). Note that phosphorus or arsenic is added here in order to form an n-channel transistor; an impurity element such as boron (B) or aluminum (Al) may be added in the case of forming a p-channel transistor. Here, the concentration of the impurity added can be set as appropriate; the concentration is preferably increased when the size of a semiconductor element is extremely decreased.

Note that a sidewall insulating layer may be formed around the gate electrode 1810 so that impurity regions to which impurity elements are added at different concentrations are formed.

Figure 19A:
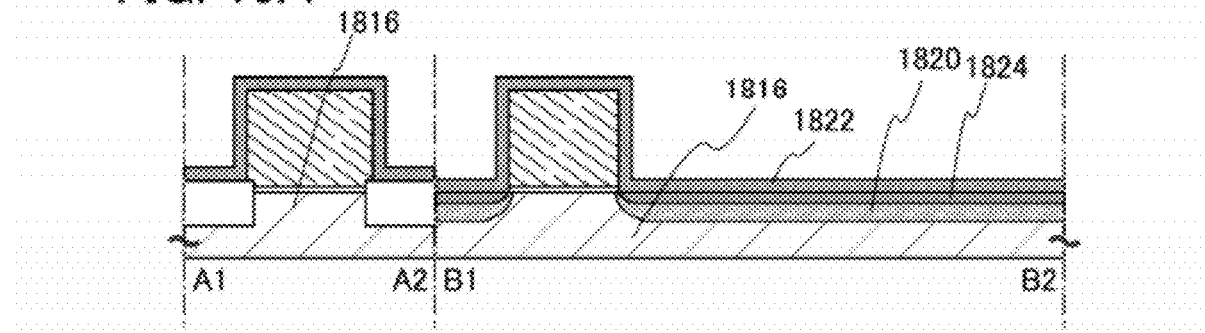
FIGS. 19A to 19D are cross-sectional views illustrating a manufacturing process of a semiconductor device.

Next, a metal layer 1822 is formed so as to cover the gate electrode 1810, the impurity regions 1820, and the like (see FIG. 19A). The metal layer 1822 can be formed by any of a variety of film formation methods such as a vacuum evaporation method, a sputtering method, and a spin coating method. The metal layer 1822 is preferably formed using a metal material which forms a low-resistance metal compound by reacting with the semiconductor material included in the semiconductor region 1804. Examples of such metal materials include titanium, tantalum, tungsten, nickel, cobalt, and platinum.

Next, heat treatment is performed so that the metal layer 1822 reacts with the semiconductor material. Thus, the metal compound regions 1824 that are in contact with the impurity regions 1820 are formed (see FIG. 19A). Note that when the gate electrode 1810 is formed using polycrystalline silicon or the like, a metal compound region is also formed in a region of the gate electrode 1810 which is in contact with the metal layer 1822.

As the heat treatment, irradiation with a flash lamp can be employed, for example. Although it is needless to say that another heat treatment method may be used, a method by which heat treatment for an extremely short time can be achieved is preferably used in order to improve the controllability of chemical reaction in formation of the metal compound. Note that the metal compound regions are formed by reaction of the metal material and the semiconductor material and have sufficiently high conductivity. The formation of the metal compound regions can properly reduce the electric resistance and improve element characteristics. Note that the metal layer 1822 is removed after the metal compound regions 1824 are formed.

Figure 19B:
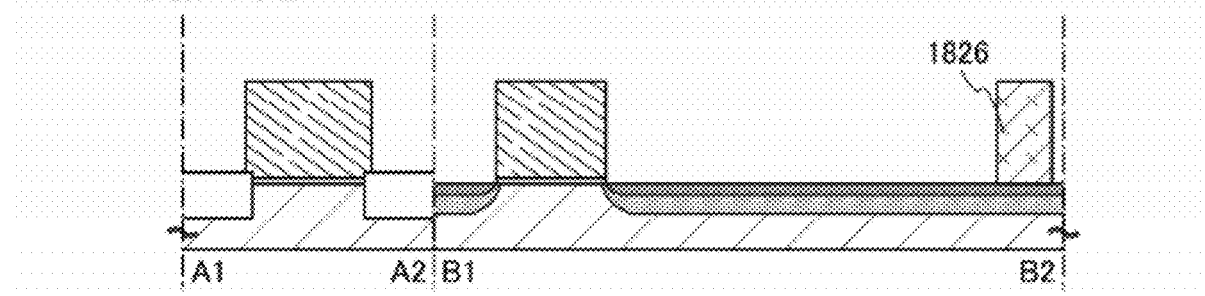

Next, the electrode 1826 is formed in a region overlapping with part of the metal compound region 1824 (see FIG. 19B). For example, the electrode 1826 is formed in such a manner that a layer including a conductive material is formed and then the layer is selectively etched. The layer including a conductive material can be formed using a metal material such as aluminum, copper, titanium, tantalum, or tungsten. The layer including a conductive material may be formed using a semiconductor material such as polycrystalline silicon. There is no particular limitation on the method for forming the layer including a conductive material, and a variety of film formation methods such as an evaporation method, a CVD method, a sputtering method, or a spin coating method can be employed.

Figure 19C:
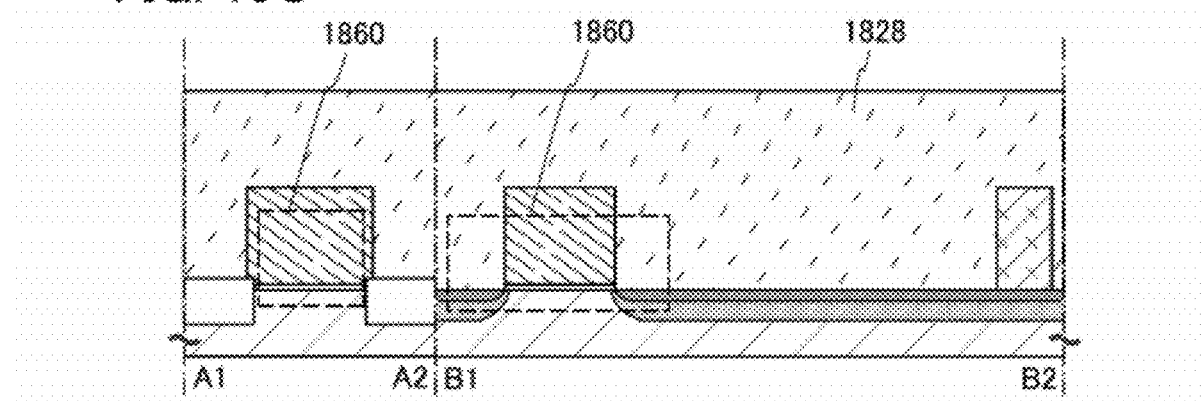

Then, the insulating layer 1828 is formed so as to cover the components formed in the above steps (see FIG. 19C). The insulating layer 1828 can be formed using a material including an inorganic insulating material such as silicon oxide, silicon oxynitride, silicon nitride, or aluminum oxide. In particular, the insulating layer 1828 is preferably formed using a low dielectric constant (low-k) material, whereby capacitance caused by an overlap of electrodes or wirings can be sufficiently reduced. Note that the insulating layer 1828 may be a porous insulating layer formed using any of the above materials. Since the porous insulating layer has low dielectric constant as compared to a dense insulating layer, capacitance due to electrodes or wirings can be further reduced. Moreover, the insulating layer 1828 can be formed using an organic insulating material such as polyimide or acrylic. Note that although the insulating layer 1828 has a single-layer structure here, one embodiment of the present invention is not limited to this example. The insulating layer 1828 may have a stacked-layer structure including two or more layers. In the case of a three-layer structure, for example, a stacked structure of a silicon oxynitride layer, a silicon nitride oxide layer, and a silicon oxide layer can be employed.

Alternatively, the electrode 1826 can be formed by forming an opening reaching the metal compound region 1824 in the insulating layer 1828 after the formation of the insulating layer 1828 and then by filling the opening.

In that case, it is possible to use a method, for example, in which a thin titanium film is formed in a region including the opening by a PVD method and a thin titanium nitride film is formed by a CVD method, and then a tungsten film is formed so as to fill the opening. Here, the titanium film formed by a PVD method has a function of reducing an oxide film (e.g., a native oxide film) formed on a surface over which the titanium film is formed, to decrease the contact resistance with the lower electrode or the like (here, the metal compound region 1824). The titanium nitride film formed after the formation of the titanium film has a barrier function of preventing diffusion of the conductive material. A copper film may be formed by a plating method after the formation of the barrier film of titanium, titanium nitride, or the like.

Through the above steps, the transistor 1860 is formed with the use of the substrate 1800 including a semiconductor material (see FIG. 19C). A feature of the transistor 1860 is that it can operate at high speed. Thus, when the transistor is used as a reading transistor, data can be read at high speed.

Figure 19D:
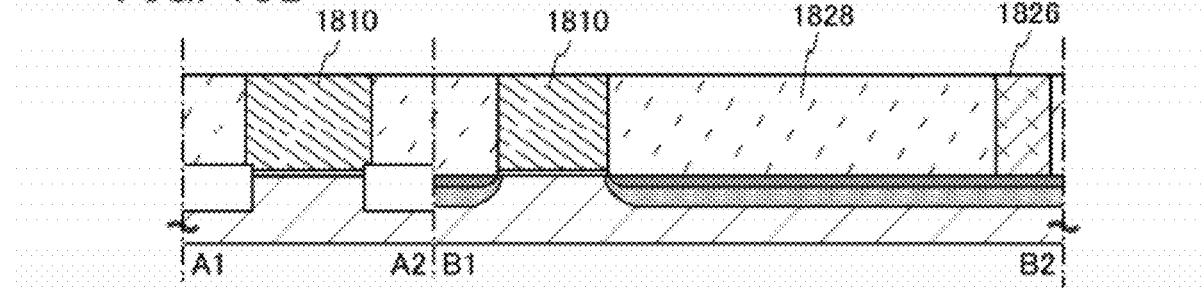

Then, as pretreatment for the formation of the transistor 1862 and the capacitor 1864, CMP treatment is performed on the insulating layer 1828 to expose the upper surfaces of the gate electrode 1810 and the electrode 1826 (see FIG. 19D). As treatment for exposing the upper surfaces of the gate electrode 1810 and the electrode 1826, etching treatment or the like can be employed instead of CMP treatment; in order to improve characteristics of the transistor 1862, the surface of the insulating layer 1828 is preferably made as flat as possible. The average surface roughness (Ra) of the insulating layer 1828 is preferably greater than or equal to 0.1 nm and less than 0.5 nm. This is because crystal orientation can be aligned when an oxide semiconductor film is crystalline.

Note that the average surface roughness (Ra) is obtained by expanding into three dimensions center line average surface roughness Ra which is defined by JIS B 0601:2001 (ISO 4287:1997) so as to be able to apply Ra to a measurement surface. The average surface roughness (Ra) is represented by an average value of the absolute values of deviations from a reference surface to a specific surface.

Note that dry etching or the like may be performed instead of CMP treatment in order to planarize the insulating layer 1828. As an etching gas, a chloride gas such as chlorine, boron chloride, silicon chloride, or carbon tetrachloride; a fluoride gas such as carbon tetrafluoride, sulfur fluoride, or nitrogen fluoride can be used.

Alternatively, plasma treatment or the like may be performed instead of CMP treatment in order to planarize the insulating layer 1828. In the plasma treatment here, a rare gas can be used. By this plasma treatment, the treatment surface is irradiated with ions of an inert gas, so that minute depressions and projections on the treatment surface are planarized due to a sputtering effect. Such plasma treatment is also referred to as reverse sputtering.

Note that in order to planarize the insulating layer 1828, at least one of the above treatments can be employed. For example, only reverse sputtering may be performed, or dry etching may be performed after CMP treatment. Note that dry etching or reverse sputtering is preferably employed in order to prevent entry of water into the insulating layer 1828 over which an oxide semiconductor is formed. In particular, in the case where planarization treatment is performed after the second heat treatment is performed, dry etching or reverse sputtering is preferably employed. In CMP treatment, a solution such as slurry is used when the insulating layer 1828 is polished, and thus, sufficient cleaning and drying are preferably performed after the treatment.

Note that before or after the above steps, a step for forming an additional electrode, wiring, semiconductor layer, or insulating layer may be performed. For example, a multilayer wiring structure in which an insulating layer and a conductive layer are stacked is employed as a wiring structure, so that a highly-integrated semiconductor device can be provided.

<Method for Manufacturing Transistor in Upper Portion>

Next, a method for manufacturing the transistor 1862 in the upper portion and the capacitor 1864 is described with reference to FIGS. 20A to 20D and FIGS. 21A and 21B.

Figure 20A:
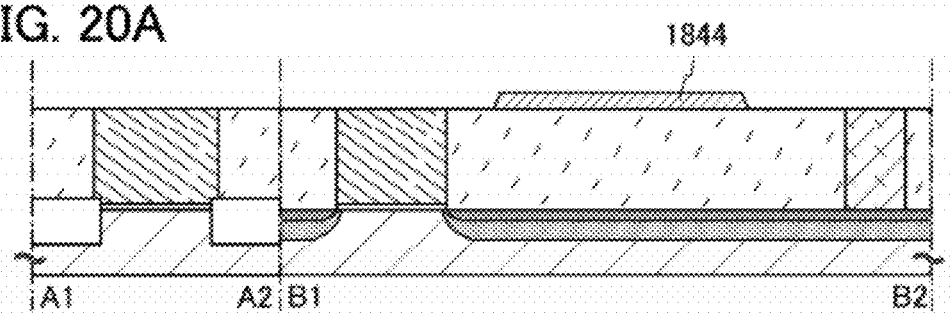
FIGS. 20A to 20D are cross-sectional views illustrating a manufacturing process of a semiconductor device.

First, an oxide semiconductor layer is formed over the gate electrode 1810, the electrode 1826, the insulating layer 1828, and the like and is processed, so that the oxide semiconductor layer 1844 is formed (see FIG. 20A). Note that an insulating layer functioning as a base may be formed over the gate electrode 1810, the electrode 1826, and the insulating layer 1828 before the oxide semiconductor layer is formed. The insulating layer can be formed by a PVD method such as a sputtering method, or a CVD method such as a plasma CVD method.

As a material of the oxide semiconductor film, at least one element selected from In, Ga, Sn, and Zn is contained. For example, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor layer, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based material; or a single-component metal oxide such as an In—O-based oxide semiconductor, a Sn—O-based oxide semiconductor, or a Zn—O-based oxide semiconductor can be used. In addition, any of the above oxide semiconductors may contain an element other than In, Ga, Sn, and Zn, for example, $SiO_2$.

For example, an In—Ga—Zn—O-based oxide semiconductor means an oxide film containing indium (In), gallium (Ga), and zinc (Zn), and there is no limitation on the composition ratio thereof.

For the oxide semiconductor layer, a thin film expressed by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

The thickness of the oxide semiconductor layer is preferably greater than or equal to 3 nm and less than or equal to 30 nm. This is because the transistor might possibly be normally on when the oxide semiconductor layer is too thick (e.g., the thickness is 50 nm or more).

The oxide semiconductor layer is preferably formed by a method in which impurities such as hydrogen, water, a hydroxyl group, and hydride do not enter the oxide semiconductor layer. For example, a sputtering method can be used.

In this embodiment, an In—Ga—Zn—O-based oxide semiconductor film is formed by a sputtering method; however, the In—Ga—Zn—O-based oxide semiconductor film may be formed by a method other than a sputtering method.

Note that as the In—Ga—Zn—O-based oxide target, a target that can be expressed by a composition ratio of $In_2O_3$:$Ga_2O_3$:ZnO=1:x:y (x is greater than or equal to 0 and y is greater than or equal to 0.5 and less than or equal to 5) is preferably used. For example, a target having a composition ratio of $In_2O_3$:$Ga_2O_3$:ZnO=1:1:2 [molar ratio], or the like can be used. Moreover, it is possible to use a target with a composition ratio of $In_2O_3$:$Ga_2O_3$:ZnO=1:1:1 [molar ratio]), a target with a composition ratio of $In_2O_3$:$Ga_2O_3$:ZnO=1:1:4 [molar ratio]), or a target with a composition ratio of $In_2O_3$:$Ga_2O_3$:ZnO=1:0:2 [molar ratio]).

In the case where an In—Zn—O-based material is used as an oxide semiconductor, a target therefor has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

When an In—Sn—Zn—O-based material film is deposited using an oxide semiconductor target, the oxide semiconductor target having a composition ratio of In:Sn:Zn=1:2:2, 2:1:3, 1:1:1, or 20:45:35 in an atomic ratio can be used, for example.

The relative density of a metal oxide in the target is greater than or equal to 80%, preferably greater than or equal to 95%, further preferably greater than or equal to 99.9%. The use of a target with high relative density makes it possible to form an oxide semiconductor layer with a dense structure.

In forming the oxide semiconductor layer by a sputtering method, for example, an object to be processed is held in a treatment chamber that is maintained under reduced pressure, and the object to be processed is heated to a temperature higher than or equal to 100° C. and lower than 550° C., preferably higher than or equal to 200° C. and lower than or equal to 400° C. Alternatively, the temperature of an object to be processed in forming the oxide semiconductor layer may be room temperature. Then, moisture in the treatment chamber is removed, a sputtering gas from which hydrogen, water, and the like is removed is introduced, and the above-described target is used; thus, the oxide semiconductor layer is formed. By forming the oxide semiconductor layer while the object to be processed is heated, impurities in the oxide semiconductor layer, such as hydrogen and water, can be reduced. Moreover, damage due to sputtering can be reduced. In order to remove moisture in the treatment chamber, an entrapment vacuum pump is preferably used. For example, a cryopump, an ion pump, a titanium sublimation pump, or the like can be used. Alternatively, a turbo pump provided with a cold trap may be used. Since impurities such as hydrogen and water can be removed from the treatment chamber evacuated with a cryopump or the like, the concentration of impurities in the oxide semiconductor layer can be reduced.

In the case where the oxide semiconductor layer is formed by a sputtering method, for example, the following conditions can be set: the distance between the object to be processed and the target is 170 mm; the pressure is 0.4 Pa; the direct current (DC) power is 0.5 kW; and the atmosphere is an oxygen (100% oxygen) atmosphere, an argon (100% argon) atmosphere, or a mixed atmosphere of oxygen and argon. Note that a pulsed direct current (DC) power source is preferably used because particles (such as powder substances generated in film formation) can be reduced and the film thickness can be uniform. The thickness of the oxide semiconductor layer is greater than or equal to 1 nm and less than or equal to 50 nm, preferably greater than or equal to 1 nm and less than or equal to 30 nm, further preferably greater than or equal to 1 nm and less than or equal to 10 nm. With the oxide semiconductor layer having such thickness, a short-channel effect due to miniaturization can be suppressed. Note that the appropriate thickness of the oxide semiconductor layer differs depending on the oxide semiconductor material to be used, the intended use of the semiconductor device, or the like; therefore, the thickness can be determined as appropriate in accordance with the material, the intended use, or the like.

Note that before the oxide semiconductor layer is formed by a sputtering method, reverse sputtering in which plasma is generated with an argon gas introduced is preferably performed so that a material attached to a surface where the oxide semiconductor layer is to be formed (e.g., a surface of the insulating layer 1828) is removed. Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

The oxide semiconductor layer can be processed by being etched after a mask having a desired shape is formed over the oxide semiconductor layer. The mask may be formed by a method such as photolithography or an ink-jet method. For the etching of the oxide semiconductor layer, either wet etching or dry etching may be employed. It is needless to say that both of them may be employed in combination.

Note that the etching of the oxide semiconductor layer may be dry etching, wet etching, or both wet etching and dry etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate RIE (reactive ion etching) method or an ICP (inductively coupled plasma) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

As an etchant used for the wet etching, a mixed solution of phosphoric acid, acetic acid, and nitric acid, or organic acid such as citric acid or oxalic acid can be used. In this embodiment, ITO-07N (produced by KANTO CHEMICAL CO., INC.) is used.

The oxide semiconductor layer 1844 formed in the above manner has a non-single-crystal structure in some cases. Here, a non-single-crystal structure includes an amorphous structure, a microcrystalline structure (also including a nanocrystalline structure and the like), a polycrystalline structure, a structure in which microcrystals or polycrysrtals are included in an amorphous structure, a structure in which microcrystals or polycrystals are formed at a surface of an amorphous structure, and the like.

Note that the oxide semiconductor layer 1844 formed by the above method contains moisture and hydrogen (including a hydroxyl group) as impurities in some cases. Moisture and hydrogen easily form donor levels and thus serve as impurities in the oxide semiconductor. In order to reduce impurities such as moisture and hydrogen in the oxide semiconductor film (dehydrate or dehydrogenate the oxide semiconductor film), the oxide semiconductor film may be subjected to heat treatment for dehydration or dehydrogenation (hereinafter abbreviated to first heat treatment) in a reduced-pressure atmosphere, an inert gas atmosphere such as a nitrogen atmosphere or a rare gas atmosphere, an oxygen gas atmosphere, or the like.

By performing the first heat treatment on the oxide semiconductor layer 1844, moisture or hydrogen in the oxide semiconductor layer 1844 can be removed. Specifically, heat treatment may be performed at a temperature higher than or equal to 250° C. and lower than or equal to 750° C., preferably higher than or equal to 400° C. and lower than the strain point of a substrate. For example, heat treatment may be performed at 500° C. for 3 minutes to 6 minutes. When an RTA method is used for the heat treatment, dehydration or dehydrogenation can be performed in a short time; therefore, treatment can be performed even at a temperature higher than the strain point of a glass substrate.

The heat treatment apparatus is not limited to an electric furnace, and may have a device for heating an object to be processed by thermal conduction or thermal radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon is used.

In the first heat treatment, it is preferable that moisture, hydrogen, and the like be not contained in nitrogen or the rare gas, such as helium, neon, or argon. Alternatively, the purity of nitrogen or a rare gas such as helium, neon, or argon which is introduced into the heat treatment apparatus is preferably greater than or equal to 6N (99.9999%), more preferably greater than or equal to 7N (99.99999%) (i.e., the impurity concentration is preferably less than or equal to 1 ppm, further preferably less than or equal to 0.1 ppm).

Further, a second heat treatment may be performed on the oxide semiconductor layer 1844 which has been subjected to the first heat treatment. By performing the second heat treatment in an oxidation atmosphere, oxygen is supplied to the oxide semiconductor layer 1844; oxygen vacancy caused in the oxide semiconductor layer 1844 by the first heat treatment is accordingly filled. Thus, the second heat treatment may be referred to as an oxygen supplying treatment. The second heat treatment may be performed at a temperature of higher than or equal to 200° C. and lower than the strain point of the substrate, and is preferably performed at a temperature of higher than or equal to 250° C. and lower than or equal to 450° C. The treatment time is 3 minutes to 24 hours. As the treatment time is increased, the proportion of a crystal region with respect to that of an amorphous region in the oxide semiconductor layer 1844 can be increased. However, a heat treatment time longer than 24 hours is not preferable because productivity is decreased.

The oxidizing atmosphere is an atmosphere containing an oxidizing gas. Oxidation gas is oxygen, ozone, nitrous oxide, or the like, and it is preferable that the oxidation gas does not contain water, hydrogen, and the like. For example, the purity of oxygen, ozone, or nitrous oxide introduced into a heat treatment apparatus is 8N (99.999999%) or higher, preferably 9N (99.9999999%) or higher (i.e., the impurity concentration is 1 ppm or lower, preferably lower than 0.1 ppm). As the oxidizing atmosphere, an oxidizing gas and an inert gas may be mixed to be used. In that case, the mixture contains an oxidizing gas at a concentration of greater than or equal to 10 ppm. Further, an inert atmosphere refers to an atmosphere containing an inert gas (such as nitrogen or a rare gas (e.g., helium, neon, argon, krypton, or xenon)) as the main component. Specifically, the concentration of a reactive gas such as an oxidizing gas is lower than 10 ppm.

Note that the second heat treatment can be performed using the same heat treatment apparatus and the same gas as those used for the first heat treatment. It is preferable that the first heat treatment for dehydration or dehydrogenation and the second heat treatment for oxygen supply be successively performed. When the first heat treatment and the second heat treatment are successively performed, the productivity of a semiconductor device can be increased.

The oxide semiconductor film is in a single crystal state, a polycrystalline (also referred to as polycrystal) state, an amorphous state, or the like. The oxide semiconductor film is preferably a c-axis aligned crystalline oxide semiconductor (CAAC-OS) film. Thus, the transistor has high reliability.

A CAAC-OS film can be obtained by depositing an oxide semiconductor film while an object to be processed is heated. For example, the substrate temperature is higher than or equal to 150° C. and lower than or equal to 450° C., preferably higher than or equal to 200° C. and lower than or equal to 350° C. In addition, the atmosphere during deposition can be an oxidizing atmosphere, an inert atmosphere, or a reduced-pressure atmosphere, and an oxygen atmosphere is further preferable. An atmosphere in which the proportion of oxygen flow rata is 100% is still further preferable. By performing the deposition in an oxygen atmosphere, crystallinity of the formed oxide semiconductor film is improved. Note that a specific structure of the CAAC-OS film is described in Embodiment 6.

Figure 20B:
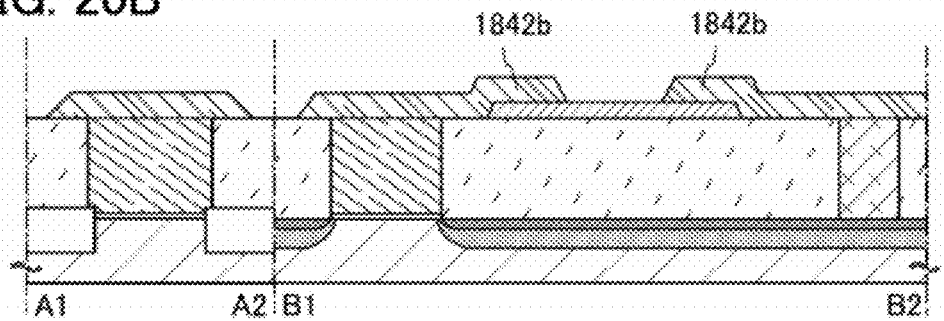

Next, a conductive layer for forming a source electrode and a drain electrode (including a wiring formed in the same layer as the source electrode and the drain electrode) is formed over the oxide semiconductor layer 1844 and the like and is processed, so that the source or drain electrode 1842a and the source or drain electrode 1842b are formed (see FIG. 20B).

The conductive layer can be formed by a PVD method or a CVD method. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used.

The conductive layer can have a single-layer structure or a stacked-layer structure including two or more layers. For example, the conductive layer can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that in the case where the conductive layer has the single-layer structure of a titanium film or a titanium nitride film, there is an advantage that the source or drain electrode 1842a and the source or drain electrode 1842b can be easily processed to be tapered.

Alternatively, the conductive layer may be formed using a conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, which is abbreviated to ITO in some cases), indium oxide-zinc oxide ($In_2O_3$—ZnO), or any of these metal oxide materials in which silicon or silicon oxide is contained can be used.

The conductive layer is preferably etched so that edge portions of the source or drain electrode 1842a and the source or drain electrode 1842b are tapered. Here, a taper angle is, for example, preferably greater than or equal to 30° and less than or equal to 60°. When etching is performed so that the end portions of the source or drain electrode 1842a and the source or drain electrode 1842b are tapered, the coverage with the gate insulating layer 1846 to be formed later can be improved and disconnection can be prevented.

The channel length (L) of the transistor in the upper portion is determined by a distance between a lower edge portion of the source or drain electrode 1842a and a lower edge portion of the source or drain electrode 1842b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet rays, the resolution is high and the focus depth is large. For these reasons, the channel length (L) of the transistor to be formed later can be in the range of greater than or equal to 10 nm and less than or equal to 1000 nm (1 μm), and the circuit can operate at higher speed. Moreover, miniaturization can lead to low power consumption of a semiconductor device.

Figure 20C:
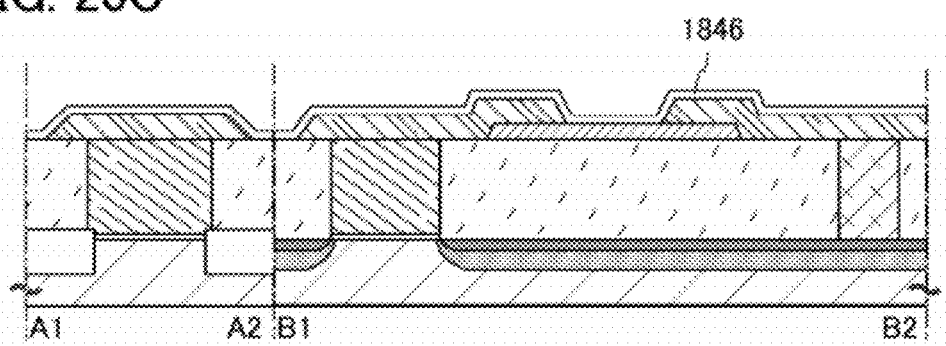

Next, the gate insulating layer 1846 is formed so as to cover the source or drain electrode 1842a and the source or drain electrode 1842b and to be in contact with part of the oxide semiconductor layer 1844 (see FIG. 20C).

The gate insulating layer 1846 can be formed by a CVD method, a sputtering method, or the like. The gate insulating layer 1846 is formed using a material such as silicon oxide, silicon nitride, or silicon oxynitride. Alternatively, the gate insulating layer 1846 can be formed using a material including a Group 13 element and oxygen. As the material including a Group 13 element and oxygen, for example, gallium oxide, aluminum oxide, aluminum gallium oxide, or the like can be used. Furthermore, the gate insulating layer 1846 may be formed so as to include tantalum oxide, hafnium oxide, yttrium oxide, hafnium silicate ($HfSi_xO_y$ (x>0, y>0)), hafnium silicate ($HfSi_xO_y$ (x>0, y>0)) to which nitrogen is added, hafnium aluminate ($HfAl_xO_y$ (x>0, y>0)) to which nitrogen is added, or the like. The gate insulating layer 1846 may have a single-layer structure or a stacked-layer structure in which these materials are combined. There is no particular limitation on the thickness; however, in the case where a semiconductor device is miniaturized, the thickness is preferably small for ensuring operation of the transistor. For example, in the case where silicon oxide is used, the thickness can be set to greater than or equal to 1 nm and less than or equal to 100 nm, preferably greater than or equal to 10 nm and less than or equal to 50 nm.

The gate insulating layer 1846 is preferably formed by a method with which impurities such as hydrogen and water do not enter the gate insulating layer 1846. This is because, if impurities such as hydrogen and water are contained in the gate insulating layer 1846, the impurities such as hydrogen and water may enter an oxide semiconductor film formed later or oxygen in the oxide semiconductor film may be extracted by the impurities such as hydrogen and water, so that a back channel of the oxide semiconductor film might have lower resistance (have n-type conductivity) and a parasitic channel might be formed. Therefore, the gate insulating layer 1846 is preferably formed so as to contain impurities such as hydrogen and water as little as possible. For example, the gate insulating layer 1846 is preferably formed by a sputtering method. It is preferable to use a high-purity gas from which impurities such as hydrogen and water are removed as a sputtering gas when the gate insulating layer 1846 is formed.

Many oxide semiconductor materials that can be used for the oxide semiconductor layer 1844 include a Group 13 element. Therefore, in the case where the gate insulating layer 1846 in contact with the oxide semiconductor layer 1844 is formed using a material including a Group 13 element and oxygen, the state of the interface between the gate insulating layer 1846 and the oxide semiconductor layer 1844 can be kept favorable. This is because a material including a Group 13 element and oxygen is compatible with an oxide semiconductor material. For example, when the oxide semiconductor layer 1844 and the gate insulating layer 1846 including gallium oxide are provided in contact with each other, pileup of hydrogen at the interface between the oxide semiconductor layer 1844 and the gate insulating layer 1846 can be reduced. Aluminum oxide has a property of not easily transmitting water. Thus, it is preferable to use aluminum oxide for the gate insulating layer 1846 in terms of preventing entry of water into the oxide semiconductor layer 1844.

When the gate insulating layer is thin as in the above description, a problem of gate leakage due to a tunnel effect or the like is caused. In order to solve the problem of gate leakage, the gate insulating layer 1846 may be formed using a high dielectric constant (high-k) material such as hafnium oxide, tantalum oxide, yttrium oxide, hafnium silicate ($HfSi_xO_y$ (x>0, y>0)), hafnium silicate ($HfSi_xO_y$ (x>0, y>0)) to which nitrogen is added, or hafnium aluminate ($HfAl_xO_y$ (x>0, y>0)) to which nitrogen is added. The use of a high-k material for the gate insulating layer 1846 makes it possible to increase the thickness in order to reduce gate leakage as well as ensuring electric characteristics. Note that a stacked structure of a film containing a high-k material and a film containing any of silicon oxide, silicon nitride, silicon oxynitride, silicon nitride oxide, aluminum oxide, and the like may be employed.

In addition, the gate insulating layer 1846 preferably includes oxygen more than that in the stoichiometric composition. For example, when gallium oxide is used for the gate insulating layer 1846, the stoichiometric composition can be expressed as $Ga_2O_{3+\alpha}$ ($0<\alpha<1$). When aluminum oxide is used, the stoichiometric composition can be expressed as $Al_2O_{3+\alpha}$ ($0<\alpha<1$). When gallium aluminum oxide is used, the stoichiometric composition can be expressed as $Ga_xAl_{2-x}O_{3+\alpha}$ ($0<x<2$, $0<\alpha<1$).

Note that oxygen doping treatment may be performed after the oxide semiconductor layer is formed, after the oxide semiconductor layer 1844 is formed, or after the gate insulating layer 1846 is formed. The "oxygen doping" means that oxygen (which includes at least one of an oxygen radical, an oxygen atom, and an oxygen ion) is added to a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. By the oxygen doping treatment, oxygen can be included in the oxide semiconductor layer or the gate insulating layer more than that in the stoichiometric composition.

The oxygen doping treatment is preferably performed by an inductively coupled plasma (ICP) method, using oxygen plasma which is excited by a microwave (with a frequency of 2.45 GHz, for example).

After formation of the gate insulating layer 1846, third heat treatment is preferably performed in an inert gas atmosphere or an oxygen atmosphere. The third heat treatment is performed at 200° C. to 450° C. inclusive, preferably 250° C. to 350° C. inclusive. For example, the third heat treatment may be performed at 250° C. for 1 hour in a nitrogen atmosphere. By performing the third heat treatment, a variation in electrical characteristics of the transistor can be reduced. Moreover, in the case where a film in contact with the oxide semiconductor layer 1844, for example, the gate insulating layer 1846 contains oxygen, oxygen is supplied to the oxide semiconductor layer 1844 to fill oxygen vacancy in the oxide semiconductor layer 1844, whereby an i-type (intrinsic) or substantially i-type oxide semiconductor layer can be formed. Note that when a base film or the like which is in contact with the oxide semiconductor layer 1844 and contains oxygen is provided, oxygen vacancy can be filled from the base film side.

Note that the second heat treatment is performed in this embodiment after the gate insulating layer 1846 is formed; there is no limitation on the timing of the second heat treatment. For example, the second heat treatment may be performed after the gate electrode is formed. Alternatively, the second heat treatment may be performed following the first heat treatment, the first heat treatment may double as the second heat treatment, or the second heat treatment may double as the first heat treatment.

By performing at least one of the first heat treatment and the second heat treatment as described above, the oxide semiconductor layer 1844 can be highly purified so as to contain a substance including a hydrogen atom as little as possible.

Figure 20D:
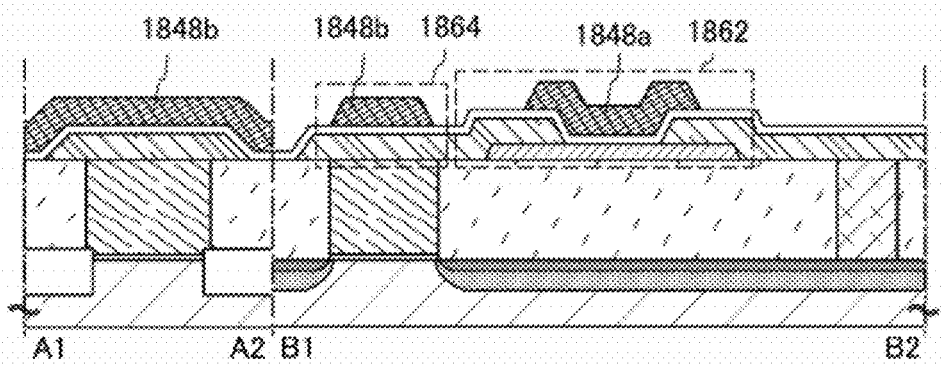

Next, a conductive layer for forming a gate electrode (including a wiring formed using the same layer as the gate electrode) is formed and is processed, so that the gate electrode 1848a and the conductive layer 1848b are formed (see FIG. 20D).

The gate electrode 1848a and the conductive layer 1848b can be formed using a metal material such as molybdenum, titanium, tantalum, tungsten, aluminum, copper, neodymium, or scandium, or an alloy material containing any of these materials as a main component. Note that the gate electrode 1848a and the conductive layer 1848b may have a single-layer structure or a stacked-layer structure.

Figure 21A:
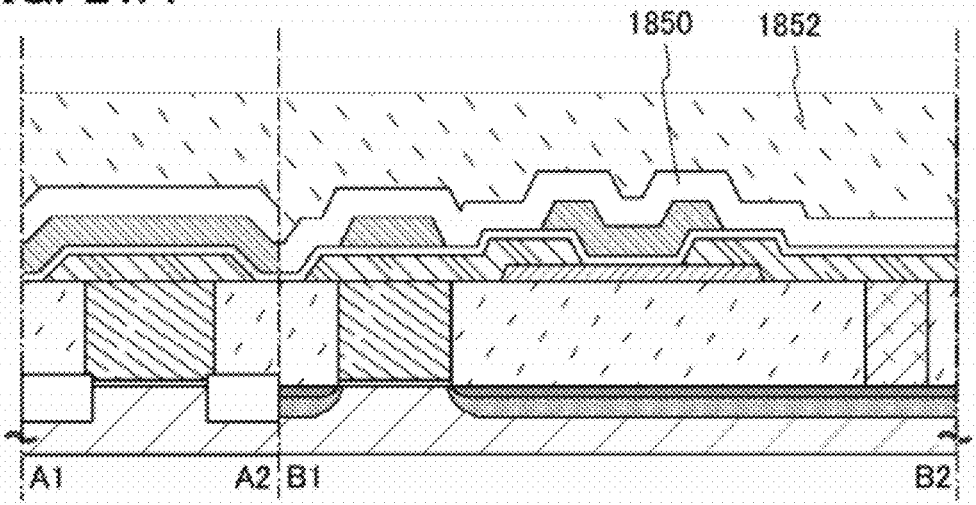
FIGS. 21A and 21B are cross-sectional views illustrating a manufacturing process of a semiconductor device.

Then, the insulating layer 1850 and the insulating layer 1852 are formed over the gate insulating layer 1846, the gate electrode 1848a, and the conductive layer 1848b (see FIG. 21A). The insulating layer 1850 and the insulating layer 1852 can be formed by a PVD method, a CVD method, or the like. The insulating layer 1850 and the insulating layer 1852 can be formed using a material including an inorganic insulating material such as silicon oxide, silicon oxynitride, silicon nitride, hafnium oxide, gallium oxide, aluminum oxide, or gallium aluminum oxide. Note that the insulating layer 1850 and the insulating layer 1852 are preferably formed using a low dielectric constant material or a low dielectric constant structure (such as a porous structure). This is because by reducing the dielectric constant of the insulating layer 1850 and the insulating layer 1852, capacitance between wirings, electrodes, or the like can be reduced; thus, operation at higher speed can be achieved. Note that although the insulating layer 1850 and the insulating layer 1852 each have a single-layer structure in this embodiment, one embodiment of the present invention is not limited to this. The insulating layer 1850 and the insulating layer 1852 may each have a stacked structure including two or more layers.

Next, an opening 1853 reaching the source or drain electrode 1842b is formed in the gate insulating layer 1846, the insulating layer 1850, and the insulating layer 1852. Then, an electrode 1854 that is in contact with the source or drain electrode 1842b is formed in the opening 1853, and a wiring 1856 that is in contact with the electrode 1854 is formed over the insulating layer 1852 (see FIG. 21B). The opening is formed by selective etching using a mask or the like.

The electrode 1854 can be formed in such a manner that, for example, a conductive layer is formed by a PVD method, a CVD method, or the like in a region including the opening 1853 and then part of the conductive layer is removed by etching treatment, CMP treatment, or the like.

Specifically, it is possible to employ a method in which, for example, a thin titanium film is formed by a PVD method in a region including the opening 1853, a thin titanium nitride film is formed by a CVD method, and then a tungsten film is formed so as to fill the opening 1853. Here, the titanium film formed by a PVD method has a function of reducing an oxide film (e.g., a native oxide film) formed on a surface over which the titanium film is formed, to decrease the contact resistance with the lower electrode or the like (here, the source or drain electrode 1842b). The titanium nitride film formed after the formation of the titanium film has a barrier function of preventing diffusion of the conductive material. A copper film may be formed by a plating method after the formation of the barrier film of titanium, titanium nitride, or the like.

Note that in the case where the electrode 1854 is formed by removing part of the conductive layer, processing is preferably performed so that the surface is planarized. For example, when a thin titanium film or a thin titanium nitride film is formed in a region including the opening 1853 and then a tungsten film is formed so as to be embedded in the opening 1853, excess tungsten, titanium, titanium nitride, or the like can be removed and the planarity of the surface can be improved by subsequent CMP treatment. The surface including the electrode 1854 is planarized in such a manner, whereby an electrode, a wiring, an insulating layer, a semiconductor layer, or the like can be favorably formed in a subsequent step.

The wiring 1856 is formed in such a manner that a conductive layer is formed by a PVD method such as a sputtering method or a CVD method such as a plasma CVD method and then is patterned. As a material for the conductive layer, an element selected from aluminum, chromium, copper, tantalum, titanium, molybdenum, and tungsten; an alloy containing any of these elements as a component; or the like can be used. Further, one or more materials selected from manganese, magnesium, zirconium, beryllium, neodymium, and scandium may be used. The details are similar to those of the source or drain electrode 1842a, the source or drain electrode 1842b, and the like.

Figure 21B:
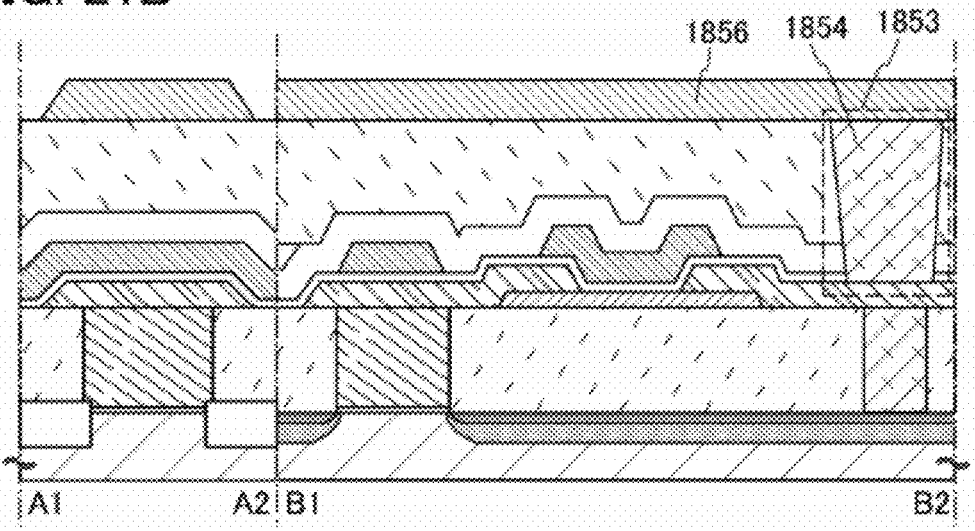

Through the above process, the semiconductor device including the transistor 1860, the transistor 1862, and the capacitor 1864 is completed (see FIG. 21B).

Figure 22A:
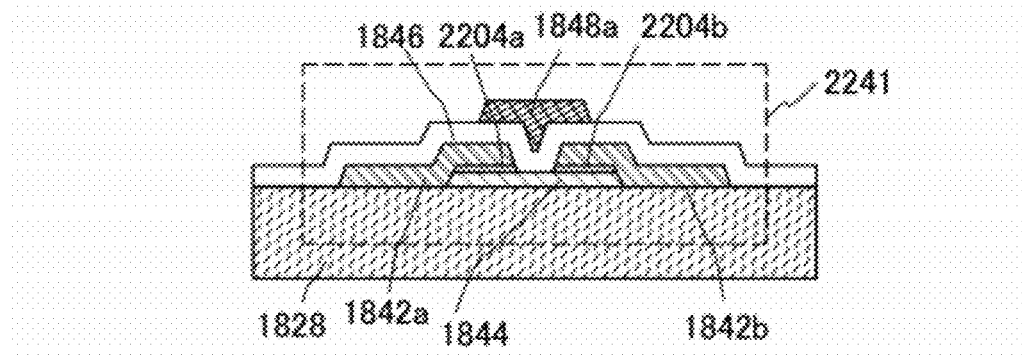
FIGS. 22A and 22B are cross-sectional views illustrating a manufacturing process of a semiconductor device.
Figure 22B:
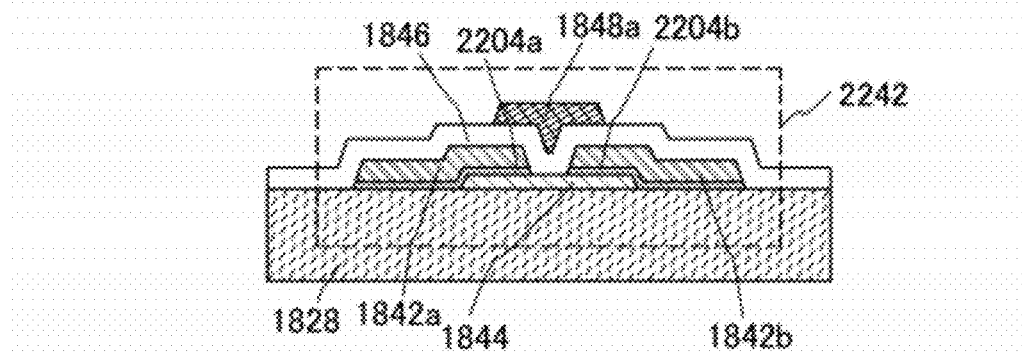

Oxide conductive layers functioning as a source region and a drain region may be provided as buffer layers between the oxide semiconductor layer 1844 and the source or drain electrodes 1842a and 1842b. FIGS. 22A and 22B illustrate transistors 2241 and 2242, respectively, each having a structure in which the transistor 1862 in FIG. 17B further includes oxide conductive layers.

In each of the transistors 2241 and 2242 in FIGS. 22A and 22B, an oxide conductive layer 2304a and an oxide conductive layer 2304b which function as a source region and a drain region are formed between the oxide semiconductor layer 1844 and the source or drain electrodes 1842a and 1842b. The shapes of the oxide conductive layers 2204a and 2204b are different between the transistors 2241 and 2242 of FIGS. 22A and 22B because of the difference between their manufacturing processes.

In the transistor 2241 of FIG. 22A, an oxide semiconductor film and an oxide conductive film are stacked and processed in the same photolithography step into the oxide semiconductor layer 1844 and an oxide conductive film each of which has an island shape. The source or drain electrode 1842a and the source or drain electrode 1842b are formed over the oxide semiconductor layer 1844 and the oxide conductive film, and then the island-shaped oxide conductive film is etched using the source or drain electrode 1842a and the source or drain electrode 1842b as masks, so that the oxide conductive layer 2204a and the oxide conductive layer 2204b which serve as a source region and a drain region are formed.

In the transistor 2242 in FIG. 22B, an oxide conductive film is formed over the oxide semiconductor layer 1844, a metal conductive film is formed over the oxide conductive film, and the oxide conductive film and the metal conductive film are processed in one photolithography step; thus, the oxide conductive layer 2204a and the oxide conductive layer 2204b which serve as a source region and a drain region, the source or drain electrode 1842a, and the source or drain electrode 1842b are formed.

Note that when etching treatment for processing the oxide conductive layer is performed, etching conditions (e.g., type of etching agent, the concentration of an etching agent, and etching time) are adjusted as appropriate in order to prevent excessive etching of the oxide semiconductor layer.

As a method for forming the oxide conductive layer 2204a and the oxide conductive layer 2204b, a sputtering method, a vacuum evaporation method (such as an electron beam evaporation method), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide (ITSO), or the like can be used. In addition, the above materials may contain silicon oxide.

With the oxide conductive layers provided as the source region and the drain region between the oxide semiconductor layer 1844 and the source or drain electrodes 1842a and 1842b, the resistance of the source region and the drain region can be reduced, which leads to high-speed operation of and the transistors 2241 and 2242.

With the structure including the oxide semiconductor layer 1844, the oxide conductive layers 2204a and 2204b, and the source or drain electrodes 1842a and 1842b, withstand voltages of the transistors 2241 and 2242 can be improved.

The process of manufacturing the transistor including an oxide semiconductor layer does not need high-temperature treatment, so that the transistor including an oxide semiconductor layer can be formed without affecting another device such as the lower transistor and wirings. Further, the manufacturing process of the transistor including an oxide semiconductor layer has a smaller number of steps than a manufacturing process of a transistor including a semiconductor material (e.g., silicon) other than an oxide semiconductor.

The structures, methods, and the like described in this embodiment can be combined as appropriate with any of the structures, methods, and the like described in the other embodiments.

Embodiment 6

In this embodiment, a structure of CAAC-OS (c axis aligned crystalline oxide semiconductor) film and the like is described in details.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when impurities are added to the CAAC-OS film, the crystal part in a region to which the impurities are added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

An example of a crystal structure of the CAAC-OS is described in detail with reference to FIGS. 24A to 24E, FIGS. 25A to 25C, and FIGS. 26A to 26C. In FIGS. 24A to 24E, FIGS. 25A to 25C, and FIGS. 26A to 26C, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 24A to 24E, O surrounded by a circle represents tetracoordinate O and O surrounded by a double circle represents tricoordinate O.

Figure 24A:
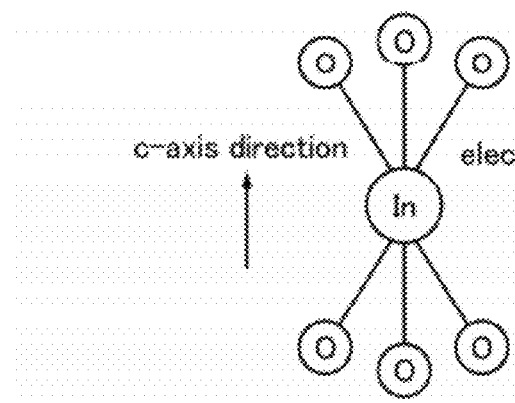
FIGS. 24A to 24E illustrate a structure of an oxide material.

FIG. 24A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 24A is actually an octahedral structure, but is illustrated as a planar structure for simplicity. Note that three tetracoordinate O atoms exist in each of an upper half and a lower half in FIG. 24A. In the small group illustrated in FIG. 24A, electric charge is 0.

Figure 24D:
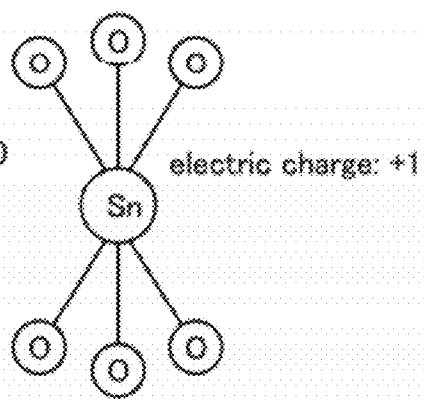
Figure 24B:
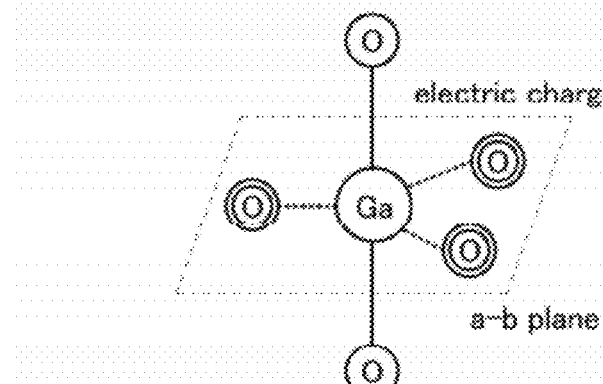

FIG. 24B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 24B. An In atom can also have the structure illustrated in FIG. 24B because an In atom can have five ligands. In the small group illustrated in FIG. 24B, electric charge is 0.

Figure 24E:
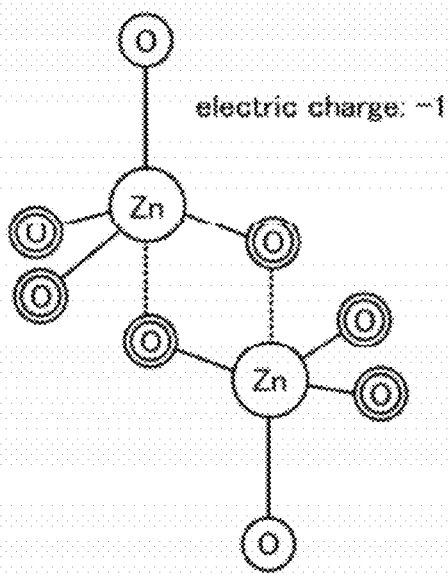
Figure 24C:
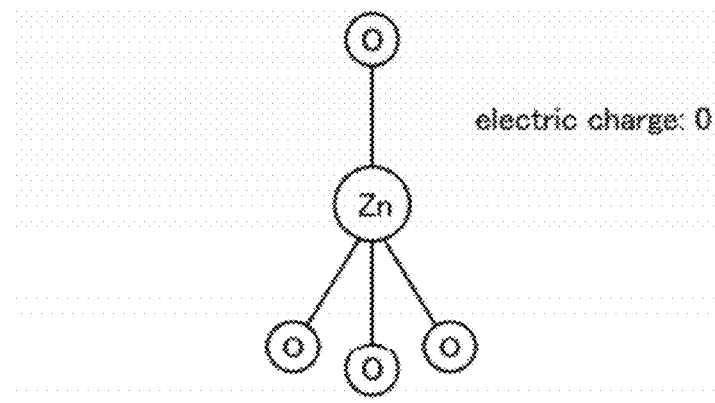

FIG. 24C illustrates a structure including one tetracoordinate Zn atom and four tetracoordinate O atoms proximate to the Zn atom. In FIG. 24C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 24C. In the small group illustrated in FIG. 24C, electric charge is 0.

FIG. 24D illustrates a structure including one hexacoordinate Sn atom and six tetracoordinate O atoms proximate to the Sn atom. In FIG. 24D, three tetracoordinate O atoms exist in each of an upper half and a lower half. In the small group illustrated in FIG. 24D, electric charge is +1.

FIG. 24E illustrates a small group including two Zn atoms. In FIG. 24E, one tetracoordinate O atom exists in each of an upper half and a lower half. In the small group illustrated in FIG. 24E, electric charge is −1.

Here, a plurality of small groups form a medium group, and a plurality of medium groups form a large group (also referred to as a unit cell).

Now, a rule of bonding between the small groups is described. The three O atoms in the upper half with respect to the hexacoordinate In atom in FIG. 24A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 25A illustrates a model of a medium group included in a layered structure of an In—Sn—Zn—O-based material. FIG. 25B illustrates a large group including three medium groups. Note that FIG. 25C illustrates an atomic arrangement in the case where the layered structure in FIG. 25B is observed from the c-axis direction.

In FIG. 25A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. Similarly, in FIG. 25A, one tetracoordinate O atom existing in each of an upper half and a lower half with respect to an In atom is denoted by circled 1. FIG. 25A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 25A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 24E can be given. For example, with one small group including two Zn atoms, electric charge of one small group including a Sn atom can be cancelled, so that the total electric charge of the layered structure can be 0.

When the large group illustrated in FIG. 25B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; a single-component metal oxide, such as an In—O-based oxide, a Sn—O-based oxide, or a Zn—O-based oxide; and the like.

As an example, FIG. 26A illustrates a model of a medium group included in a layered structure of an In—Ga—Zn—O-based material.

In the medium group included in the layered structure of the In—Ga—Zn—O-based material in FIG. 26A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 26B illustrates a large group including three medium groups. Note that FIG. 26C illustrates an atomic arrangement in the case where the layered structure in FIG. 26B is observed from the c-axis direction.

Here, since electric charge of a (hexacoordinate or pentacoordinate) In atom, electric charge of a (tetracooridinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 26A but also a medium group in which the arrangement of the In atom, the Ga atom, and the Zn atom is different from that in FIG. 26A.

Embodiment 7

In this embodiment, the cases where the semiconductor device described in any of the above embodiments is applied to an electronic appliance are described with reference to FIGS. 23A to 23E. In this embodiment, the case in which the above-described semiconductor device is applied to an electronic appliance such as a computer, a personal digital assistant (including a mobile phone, a portable game machine, an audio reproducing device, and the like), electronic paper, a television device (also referred to as television or television receiver), and a digital video camera is described.

Figure 23A:
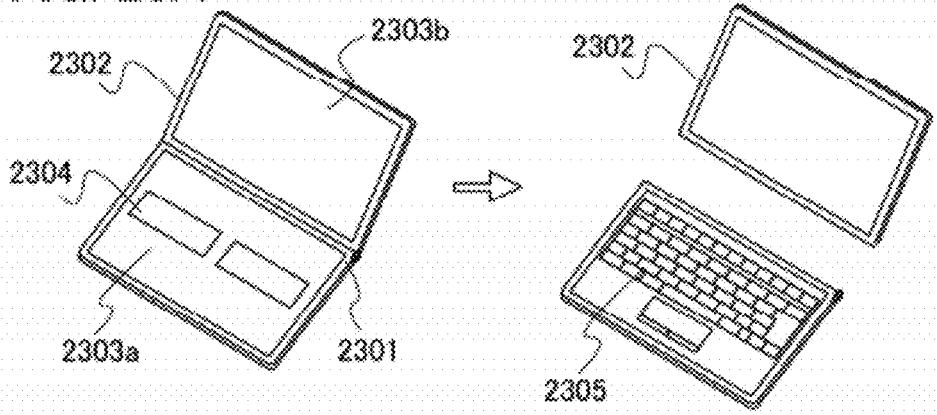
FIGS. 23A to 23E each illustrate an electronic appliance including a semiconductor device.

FIG. 23A illustrates a portable information terminal, which includes a housing 2301, a housing 2302, a first display portion 2303a, a second display portion 2303b, and the like. The semiconductor device described in any of the above embodiments is provided inside at least one of the housings 2301 and 2302. Therefore, a laptop personal computer in which writing and reading of data are performed at high speed, data is stored for a long time, and power consumption is sufficiently reduced can be realized.

Note that the first display portion 2303a is a touch panel, and for example, as illustrated in the left in FIG. 23A, which of "touch input" and "keyboard input" is performed can be selected by a selection button 2304 displayed on the first display portion 2303a. Since the size of the selection buttons is variable, the portable information terminal is easy to use for all generations. In the case where "touch input" is selected, for example, a keyboard 2305 is displayed on the first display portion 2303a as illustrated in the right in FIG. 23A. The displayed keyboard 2305 allows fast typing as in the case of using a conventional information terminal, for example.

Further, either of the first display portion 2303a and the second display portion 2303b can be detached from the handheld terminal as illustrated in the right in FIG. 23A. For example, the second display portion 2303b can function as a touch panel for a reduction in weight to carry around to be operated by one hand while the other hand supports the housing 2302, which is convenient.

The portable information terminal in FIG. 23A can have a function of displaying a variety of information (e.g., a still image, a moving image, and a text image) on the display portion, a function of displaying a calendar, a date, the time, or the like on the display portion, a function of operating or editing information displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 23A may transmit and receive data wirelessly. Through wireless communication, desired book data or the like can be purchased and downloaded from an electronic book server.

Further, the housing 2302 illustrated in FIG. 23A may be equipped with an antenna, a microphone function, and a wireless communication function to be used as a mobile phone.

Figure 23B:
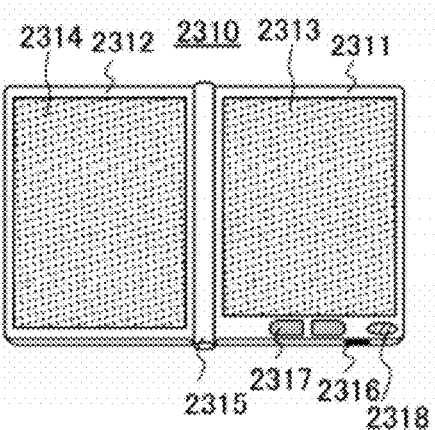

FIG. 23B illustrates an e-book reader 2310 mounted with electronic paper, which includes two housings, a housing 2311 and a housing 2312. The housing 2311 and the housing 2312 are provided with a display portion 2313 and a display portion 2314, respectively. The housings 2311 and 2312 are connected by a hinge portion 2315 and can be opened or closed with the hinge portion 2315. The housing 2311 is provided with a power switch 2316, operation keys 2317, a speaker 2318, and the like. At least one of the housings 2311 and 2312 is provided with the semiconductor device described in any of the above embodiments. Therefore, an e-book reader in which writing and reading of data are performed at high speed, data is stored for a long time, and power consumption is sufficiently reduced can be realized.

Figure 23C:
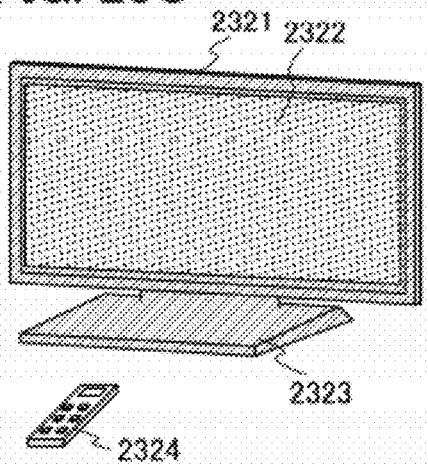

FIG. 23C illustrates a television set including a housing 2321, a display portion 2322, a stand 2323, and the like. A television set 2320 can be operated with a switch included in the housing 2321 or with a remote controller 2324. The semiconductor device described in any of the above embodiments is mounted on the housing 2321 and the remote controller 2324. Therefore, a television set in which writing and reading of data are performed at high speed, data is stored for a long time, and power consumption is sufficiently reduced can be realized.

Figure 23D:
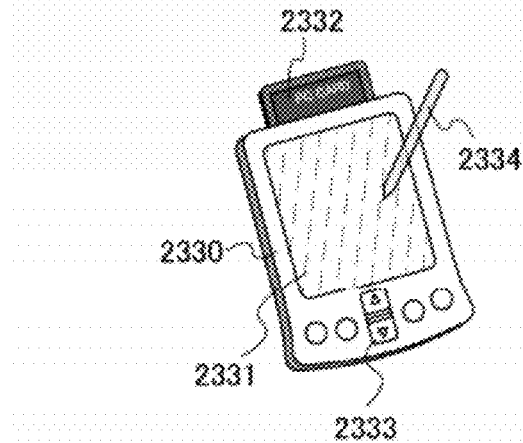

FIG. 23D is a personal digital assistant (PDA). A main body 2330 is provided with a display portion 2331, an external interface 2332, operation buttons 2333, and the like. Further, a stylus 2334 or the like for operating the personal digital assistant is provided. The semiconductor device described in any of the above embodiments is provided in the main body 2330. Therefore, a portable information terminal in which writing and reading of data are performed at high speed, data is stored for a long time, and power consumption is sufficiently reduced can be realized.

Figure 23E:
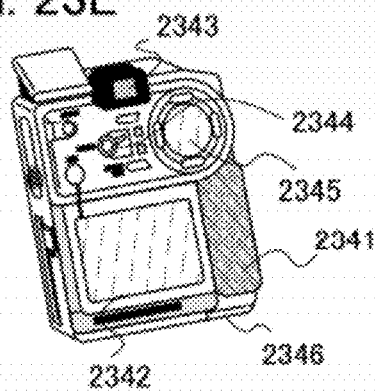

FIG. 23E is a digital camera including a main body 2341, a display portion 2342, an eyepiece 2343, an operation switch 2344, a display portion 2345, a battery 2346, and the like. The semiconductor device described in any of the above embodiments is provided in the main body 2341. Therefore, a digital camera in which writing and reading of data are performed at high speed, data is stored for a long time, and power consumption is sufficiently reduced can be realized.

As described above, the electronic devices described in this embodiment each include the semiconductor device described in any of the above embodiments. Therefore, electronic devices with low power consumption can be realized.

This application is based on Japanese Patent Application serial no. 2011-102580 filed with Japan Patent Office on Apr. 29, 2011, the entire contents of which are hereby incorporated by reference.

What is claimed is:

1. A semiconductor device comprising:
   a bit line;
   a word line;
   a memory cell comprising:
      a first transistor including a channel region comprising an oxide semiconductor,
      a second transistor including a channel region comprising any of silicon, germanium, silicon germanium, silicon carbide, and gallium arsenide, and
      a capacitor,
   wherein one of a source and a drain of the first transistor and one of a source and a drain of the second transistor are electrically connected to the bit line,
   wherein the other of the source and the drain of the first transistor and a gate of the second transistor are electrically connected to one of electrodes of the capacitor, and
   wherein the other of the electrodes of the capacitor is electrically connected to the word line; and
   a writing circuit electrically connected to the memory cell through the bit line, the writing circuit configured to input one of a plurality of write data potentials or a reference potential as a write data potential to the memory cell, and
   wherein the writing circuit is configured to write the one of the plurality of write data potentials to the memory cell when a potential applied to the gate of the second transistor is higher than a threshold voltage of the second transistor.

2. The semiconductor device according to claim 1, further comprising:
   a control signal generating circuit configured to output a control signal having a constant cycle;
   a switching element electrically connected to the control signal generating circuit, the switching element configured to control an output of the control signal;
   a potential generating circuit configured to generate the reference potential and the plurality of write data potentials each having different potential;
   a data buffer electrically connected to the writing circuit and configured to hold a data to be written to the memory cell; and
   a reading circuit electrically connected to the writing circuit and the memory cell, the reading circuit configured to read the write data potential of the memory cell.

3. The semiconductor device according to claim 1, further comprising a signal line electrically connected to the writing circuit,
   wherein the writing circuit comprises:
      a third transistor;
      a fourth transistor; and
      a shift register electrically connected to a gate of the third transistor;
   wherein a gate of the fourth transistor is electrically connected to the signal line,
   wherein the one of the plurality of write data potentials is input to one of a source and a drain of the third transistor, and
   wherein the reference potential is input to one of a source and a drain of the fourth transistor.

4. The semiconductor device according to claim 3, wherein the other of the source and the drain of the third transistor is electrically connected to the other of the source and the drain of the fourth transistor.

5. The semiconductor device according to claim 1, further comprising a plurality of memory cells each electrically connected to a word line and the bit line,
   wherein the memory cell and the plurality of memory cells have a variation in a threshold voltage.

6. The semiconductor device according to claim 1, wherein the channel region of the second transistor is provided in a substrate containing a semiconductor material.

7. The semiconductor device according to claim 1, wherein the oxide semiconductor contains at least one element selected from In, Ga, Sn, and Zn.

8. A semiconductor device comprising:
   a bit line;
   a word line;

a memory cell configured to output a first potential or a second potential, the memory cell comprising:
- a first transistor electrically connected to the bit line, the first transistor including a channel region comprising an oxide semiconductor;
- a second transistor electrically connected to the bit line, the second transistor including a channel region comprising any of silicon, germanium, silicon germanium, silicon carbide, and gallium arsenide; and
- a capacitor electrically connected to the word line, the first transistor, and the second transistor;

a data buffer configured to hold a data to be written to the memory cell;

a potential generating circuit configured to generate a reference potential and a plurality of write data potentials;

a control signal generating circuit configured to output a control signal having a constant cycle;

a writing circuit configured to write the reference potential and one of the plurality of write data potentials as a write data potential to the memory cell;

a reading circuit configured to read the write data potential of the memory cell; and a switching element configured to control an output of the control signal according to an input of the first potential or the second potential, wherein the memory cell is configured to output the first potential until a potential applied to a gate of the second transistor reaches a threshold value of the second transistor, wherein the memory cell is configured to output the second potential once the potential applied to the gate of the second transistor reaches the threshold value, and wherein the writing circuit configured to write one of the plurality of write data potentials to the memory cell according to an output of the second potential.

9. The semiconductor device according to claim 8,
wherein the first transistor controls an input of a potential from the bit line and an output of a potential to the bit line,
wherein the second transistor controls an output of a potential to the bit line according to a potential from the word line and outputs the first potential or the second potential according to the potential applied to the gate of the second transistor, and
wherein the capacitor adjusts the potential from the word line, which is applied to the gate of the second transistor.

10. The semiconductor device according to claim 8,
wherein an electric signal of the word line changes according to the output of the control signal,
wherein the writing circuit configured to write the reference potential to the memory cell before the data is input from the data buffer, select one of the plurality of write data potentials after the data is input from the data buffer, and write, to the memory cell, the write data potential which is selected when an operation of the switching element is stopped, and
wherein the switching element configured to allow the output of the control signal to the writing circuit in a period during which the first potential is input and interrupt the output of the control signal to the writing circuit once the second potential is input.

11. The semiconductor device according to claim 10, wherein the control signal generating circuit configured to generate the control signal during the period after the reference potential is written to the memory cell and until the output of the control signal from the switching element is stopped.

12. The semiconductor device according to claim 8, wherein levels of the plurality of write data potentials are different from each other.

13. The semiconductor device according to claim 8, wherein one of a source and a drain of the first transistor is electrically connected to the gate of the second transistor.

14. The semiconductor device according to claim 13,
wherein the writing circuit is electrically connected to the other of the source and the drain of the first transistor, and
wherein the reading circuit is electrically connected to one of a source and a drain of the second transistor.

15. The semiconductor device according to claim 8, further comprising a plurality of memory cells each electrically connected to a word line and the bit line,
wherein the memory cell and the plurality of memory cells have a variation in a threshold voltage.

16. The semiconductor device according to claim 8, wherein the channel region is provided in a substrate containing a semiconductor material.

17. The semiconductor device according to claim 8, wherein the oxide semiconductor contains at least one element selected from In, Ga, Sn, and Zn.

18. A method for driving a semiconductor device comprising the steps of:
applying a reference potential generated in a potential generating circuit from a writing circuit to a gate of a second transistor in a memory cell and making a first transistor of the memory cell turn off, so that the reference potential is written to the memory cell, wherein the gate of the second transistor is electrically connected to one of a source and a drain of the first transistor and one of electrodes of a capacitor, and wherein the other of the electrodes of the capacitor is electrically connected a word line;

inputting a data stored in a data buffer to the writing circuit after applying the reference potential;

selecting one of a plurality of write data potentials generated in the potential generating circuit;

applying a first potential to the gate of the second transistor according to generating a control signal in a control signal generating circuit and changing a potential applied to the word line;

selecting another of the plurality of write data potentials according to inputting the control signal to the writing circuit; and writing the another of the plurality of write data potentials to the memory cell when the first potential is higher than a threshold voltage of the second transistor, wherein the first transistor includes a channel region comprising an oxide semiconductor, and wherein the second transistor includes a channel region comprising any of silicon, germanium, silicon germanium, silicon carbide, gallium arsenide, and an organic semiconductor material.

19. The method for driving a semiconductor device according to claim 18,
wherein changing the potential is performed at least once, and
wherein selecting the another of the plurality of write data potentials is performed according to changing the potential so that the number of changing the potential is the same as the number of selecting the another of the plurality of write data potentials.

20. The method for driving a semiconductor device according to claim 18, wherein the plurality of write data potentials are different from each other.

21. The method for driving a semiconductor device according to claim 18, wherein the threshold voltage of the second transistor is different from a designed threshold voltage.

22. The method for driving a semiconductor device according to claim 18,
wherein the control signal is successively output to the writing circuit through a switching element at a constant cycle, and
wherein the switching element is stopped when the first potential is higher than the threshold voltage of the second transistor.

23. The method for driving a semiconductor device according to claim 18, wherein a driver circuit including the data buffer, the writing circuit, and the control signal generating circuit.

24. The method for driving a semiconductor device according to claim 18, wherein the plurality of write data potentials includes a plurality of potentials for writing of the data.

* * * * *